(12) United States Patent
Selvakumar et al.

(10) Patent No.: US 6,805,008 B2
(45) Date of Patent: Oct. 19, 2004

(54) ACCELEROMETER WITH FOLDED BEAMS

(75) Inventors: Arjun Selvakumar, Bellaire, TX (US);
Duli Yu, Sugar Land, TX (US);
Lianzhong Yu, Redmond, WA (US);
Ben W. Jones, Austin, TX (US)

(73) Assignee: Input/Output, Inc., Stafford, TX (US)

( * ) Notice: Subject to any disclaimer, the term of this patent is extended or adjusted under 35 U.S.C. 154(b) by 0 days.

(21) Appl. No.: 09/886,320

(22) Filed: Jun. 21, 2001

(65) Prior Publication Data

US 2002/0178817 A1 Dec. 5, 2002

Related U.S. Application Data

(60) Provisional application No. 60/212,997, filed on Jun. 21, 2000, and provisional application No. 60/217,609, filed on Jul. 11, 2000.

(51) Int. Cl.[7] ............................................. G01P 15/00
(52) U.S. Cl. .............................. 73/504.14; 73/514.24; 73/514.32
(58) Field of Search .................... 73/504.14, 504.17, 73/504.24, 504.18, 504.21, 504.13, 504.12, 504.32, 1.77, 862.625, 514.17, 514.24, 514.18, 514.21, 514.32, 1–77

(56) References Cited

U.S. PATENT DOCUMENTS

| | | | | |
|---|---|---|---|---|
| 3,877,296 A | * | 4/1975 | Rihn | 73/653 |
| 3,884,085 A | * | 5/1975 | Beckman et al. | 73/514.33 |
| 5,095,749 A | * | 3/1992 | Hanson | 73/497 |
| 5,331,853 A | * | 7/1994 | Hulsing, II | 73/514.29 |
| 5,345,823 A | * | 9/1994 | Reidemeister et al. | 73/514.32 |
| 5,412,987 A | * | 5/1995 | Bergstrom et al. | 73/514.33 |
| 5,652,384 A | | 7/1997 | Henrion et al. | 73/514.24 |
| 5,777,226 A | | 7/1998 | Ip | 73/514.24 |
| 5,831,162 A | * | 11/1998 | Sparks et al. | 73/504.12 |
| 5,852,242 A | * | 12/1998 | Devolk et al. | 73/514.17 |
| 6,035,694 A | * | 3/2000 | Dupuie et al. | 73/1.38 |
| 6,105,428 A | | 8/2000 | Schmiesing et al. | 73/514.32 |
| 6,128,954 A | * | 10/2000 | Jiang | 73/504.13 |
| 6,158,815 A | * | 12/2000 | Sugie et al. | 297/452.61 |
| 6,393,914 B1 | * | 5/2002 | Zarabadi et al. | 73/514.04 |

OTHER PUBLICATIONS

US 2002/0104379, Accelerometer with re–entrant grooves, Ried et al., Aug. 8, 2002.*

* cited by examiner

*Primary Examiner*—Hezron Williams
*Assistant Examiner*—Jacques M. Saint-Surin
(74) *Attorney, Agent, or Firm*—Madan, Mossman & Sriam, P.C.

(57) ABSTRACT

Disclosed is an accelerometer for measuring seismic data. The accelerometer includes a proof mass that is resiliently coupled to a support structure by folded beams, S-shaped balanced beams, straight beams, and/or folded beams with resonance damping. The support structure further includes travel stops for limiting transverse motion of the proof mass.

46 Claims, 56 Drawing Sheets

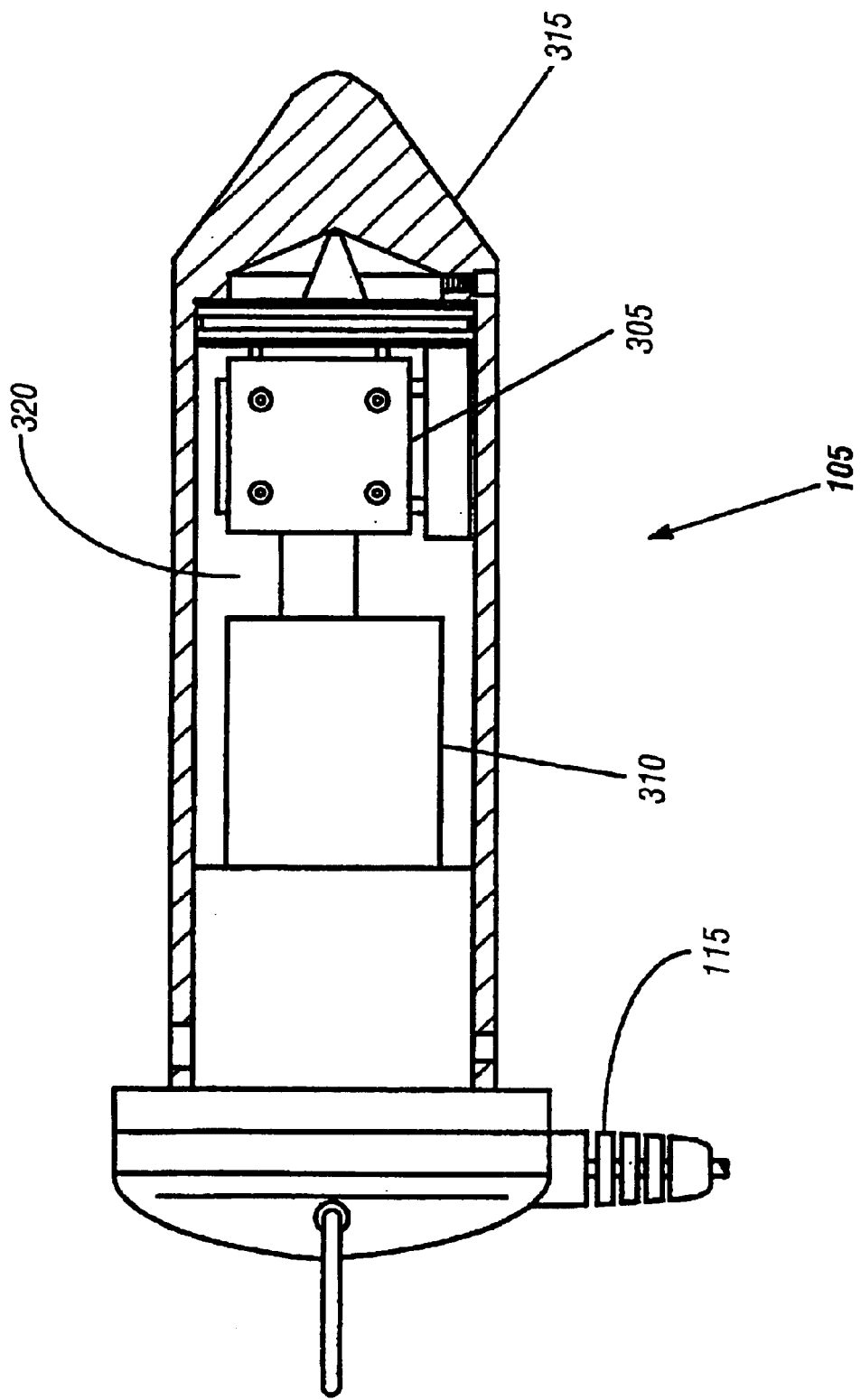

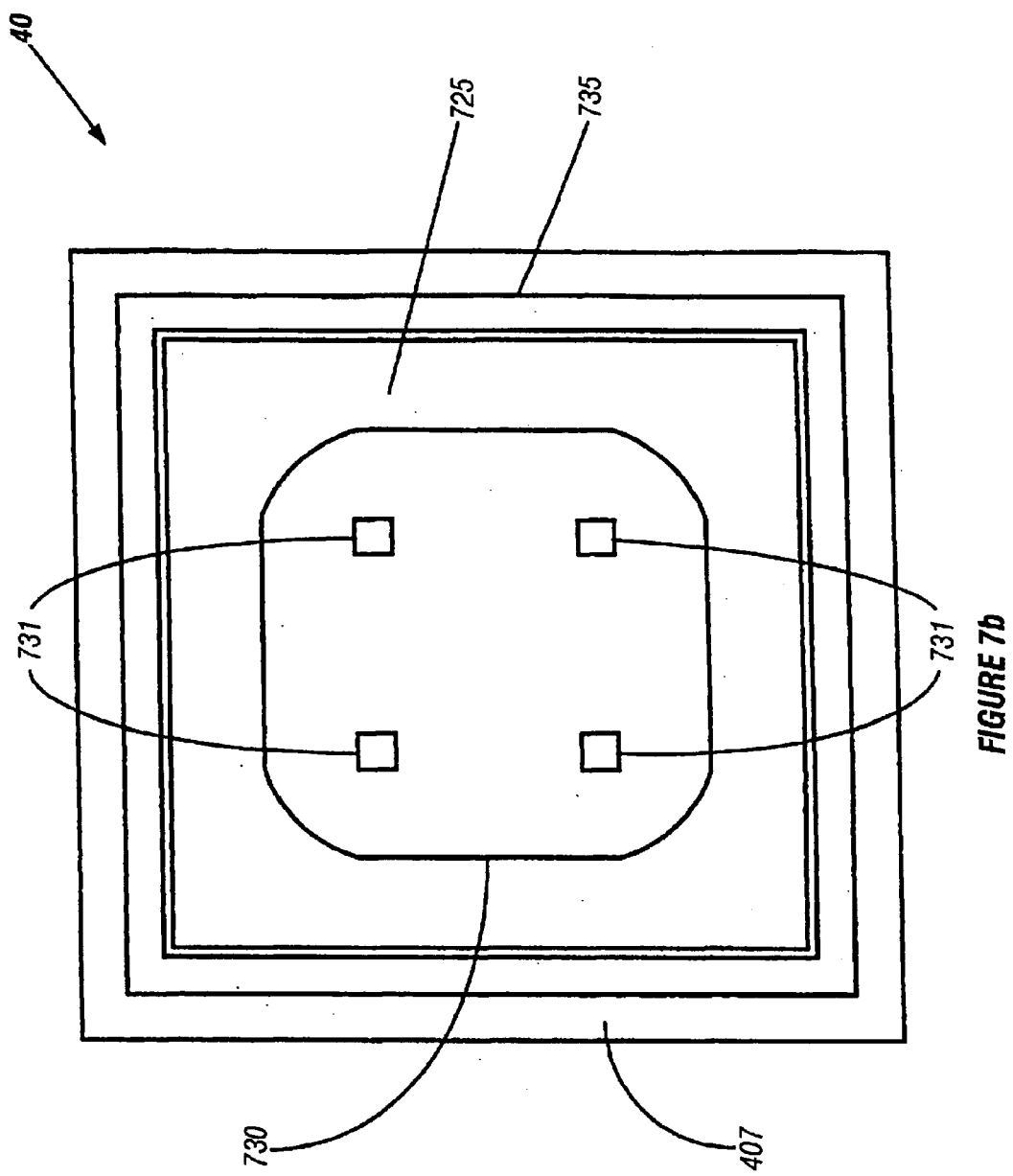

ACCELEROMETER WITH FOLDED BEAMS

CROSS REFERENCE TO RELATED APPLICATIONS

This application is related to U.S. provisional patent application Ser. No. 60/212,997, filed on Jun. 21, 2000, and U.S. provisional patent application Ser. No. 60/217,609, filed on Jul. 11, 2000, the disclosures of which are hereby incorporated herein by reference.

BACKGROUND OF THE INVENTION

This invention relates generally to accelerometers and more particularly to accelerometers including a mass that is resiliently coupled to a housing.

Accelerometers are used to detect and record environmental data. In particular, accelerometers are often used in seismic applications to gather seismic data. Conventional accelerometers typically include mass resiliently coupled to a support structure by one or more resilient L-shaped members. Accelerometers that use an L-shaped resilient member to support a mass typically have difficulty providing a sensor having acceptable closed-loop stability and structural reliability.

The present invention is directed to overcoming one or more of the limitations of the existing accelerometers.

SUMMARY

According to one embodiment of the present invention, an accelerometer is provided that includes a measurement mass for detecting acceleration that includes a housing having a cavity, one or more spring mass assemblies positioned within the cavity, and one or more metal electrode patterns coupled to the spring mass assembly. Each spring mass assembly includes a support structure, one or more resilient folded beams coupled to the support structure, and mass coupled to the resilient folded beams. A top cap wafer is coupled to the measurement mass that includes a top capacitor electrode. A bottom cap wafer is also coupled to the measurement mass that includes a bottom capacitor electrode.

According to another embodiment of the present invention, an accelerometer is provided that includes a measurement mass for detecting acceleration that includes a housing having a cavity, one or more spring mass assemblies positioned within the cavity, and one or more metal electrode patterns coupled to the spring mass assembly. Each spring mass assembly includes a support structure, one or more resilient S-shaped beams coupled to the support structure, and mass coupled to the resilient S-shaped beams. A top cap wafer is coupled to the measurement mass that includes a top capacitor electrode. A bottom cap wafer is also coupled to the measurement mass that includes a bottom capacitor electrode.

According to another embodiment of the present invention, an accelerometer is provided that includes a measurement mass for detecting acceleration that includes a housing having a cavity, one or more spring mass assemblies positioned within the cavity, and one or more metal electrode patterns coupled to the spring mass assembly. Each spring mass assembly includes a support structure, one or more resilient straight beams coupled to the support structure, and mass coupled to the resilient straight beams. A top cap wafer is coupled to the measurement mass that includes a top capacitor electrode. A bottom cap wafer is also coupled to the measurement mass that includes a bottom capacitor electrode.

According to another embodiment of the invention, a method of operating an accelerometer having a measurement mass positioned within a housing including top and bottom electrodes positioned between corresponding top and bottom capacitor electrodes is provided that includes resiliently coupling the measurement mass to the housing using a resilient folded beam.

According to another embodiment of the invention, a method of operating an accelerometer having a measurement mass positioned within a housing including top and bottom electrodes positioned between corresponding top and bottom capacitor electrodes is provided that includes resiliently coupling the measurement mass to the housing using a resilient S-shaped beam.

According to another embodiment of the invention, a method of operating an accelerometer having a measurement mass positioned within a housing including top and bottom electrodes positioned between corresponding top and bottom capacitor electrodes is provided that includes resiliently coupling the measurement mass to the housing using a resilient straight beam.

According to another embodiment of the invention, a method of preventing crack propagation in a micro-machined structure including a webbing artifact is provided that includes providing one or more vent holes within the webbing artifact.

According to another embodiment of the invention, a method of minimizing backside etching of elements within a micro-machined structure is provided that includes providing one or more etch-buffers adjacent to the element.

According to another embodiment of the invention, a method of protecting a mass supported within a support structure by one or more springs is provided that includes providing one or more soft-contact bumpers for preventing impacts between the mass and the support structure.

The present embodiments of the invention provide an accelerometer for providing reliable data measurements. The accelerometer includes a measurement mass that is resiliently coupled to a housing by using a folded beam, an S-shaped beam or a straight beam. In this manner, the accelerometer provides low noise as well as low temperature stability. The accelerometer further includes range-of-motion limit stops for limiting motion of the measurement mass in the lateral direction thereby enhancing the cross axis sensitivity and lateral shock tolerance of the accelerometer.

BRIEF DESCRIPTION OF THE DRAWINGS

FIG. 3a is a cross-sectional side view of the positioning of an accelerometer within the sensor of FIG. 1.

FIG. 4 illustrates a top perspective view of an embodiment of the accelerometer of FIG. 3a.

FIG. 7b illustrates a top view of the top cap wafer of FIG. 7a.

FIG. 7c illustrates a bottom view of the top cap wafer of FIG. 7a.

FIG. 7d illustrates an embodiment of an arrangement of overshock bumpers on the top cap wafer of FIG. 7a.

FIG. 8b illustrates a bottom view of the bottom cap wafer of FIG. 8a.

FIG. 8c illustrates a top view of the bottom cap wafer of FIG. 8a.

FIG. 9aa illustrates a cross-sectional view of a top cap overshock bumper and a patterned metal electrode within the accelerometer of FIG. 6.

FIG. 9ab illustrates a cross-sectional view of a bottom cap overshock bumper and a patterned metal electrode within the accelerometer of FIG. 6.

FIG. 9ac illustrates an embodiment of metal electrodes including reduced-thickness recesses within the accelerometer of FIG. 6.

FIG. 9ad illustrates an embodiment of metal electrodes including cavities within the accelerometer of FIG. 6.

FIG. 9b is a top view of a top mass half of the mass wafer pair of FIG. 9a.

FIG. 9e is a bottom view of a bottom mass half of the mass wafer pair of FIG. 9a.

FIG. 11ha illustrates an embodiment of a metal electrode including a patterned surface on an upper surface of the mass wafer pair of FIG. 9a.

FIG. 11hb illustrates an embodiment of a metal electrode including a patterned surface on a lower surface of the mass wafer pair of FIG. 9a.

FIG. 11hc illustrates an embodiment of a patterned surface on the mass wafer pair of FIG. 9a.

FIG. 11hd illustrates an alternative embodiment of the patterned surface of FIG. 11hc.

FIG. 11he illustrates an alternative embodiment of the patterned surface of FIG. 11hc.

FIG. 11hf illustrates an alternative embodiment of the patterned surface of FIG. 11hc.

FIG. 11hg illustrates an alternative embodiment of the patterned surface of FIG. 11hc.

FIG. 11hh illustrates an alternative embodiment of the patterned surface of FIG. 11hc.

FIG. 11hi illustrates an alternative embodiment of the patterned surface of FIG. 11hc.

FIG. 11hj illustrates an alternative embodiment of the patterned surface of FIG. 11hc.

DETAILED DESCRIPTION OF THE ILLUSTRATIVE EMBODIMENTS

Figure 1:
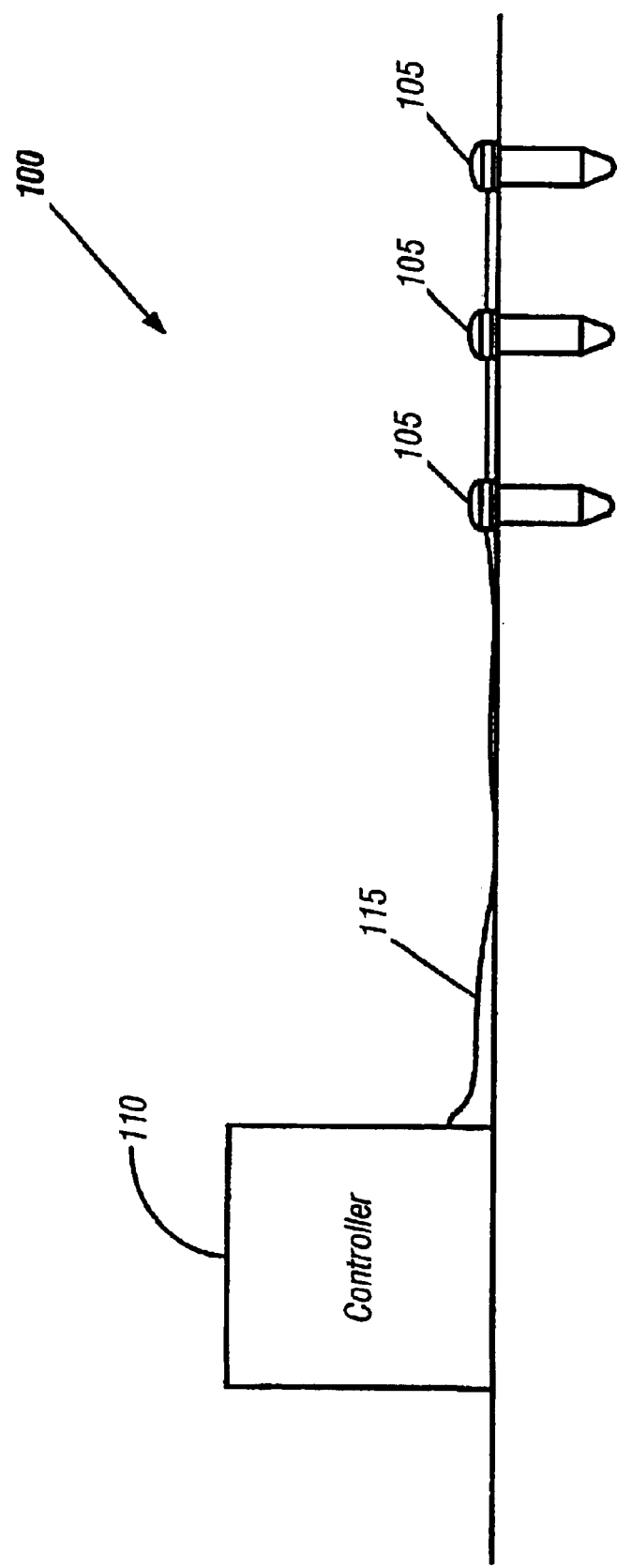
FIG. 1 illustrates an embodiment of a system used to acquire environmental data measurements.

Referring initially to FIG. 1, a preferred embodiment of a system 100 designed to record data measurements is illustrated. The system 100 preferably includes one or more sensors 105, a controller 110, and cabling 115.

Within the system 100, the sensors 105 are used to detect data measurements. In a preferred embodiment, the system 100 is used in seismic applications to record seismic data measurements. The sensors 105 may be any number of conventional commercially available sensors, such as, for example, a geophone, a hydrophone, or an accelerometer. In a preferred embodiment, each of the sensors 105 is an accelerometer.

The controller 110 is used to monitor and control the sensors 105. The controller 110 is preferably coupled to the sensors 105 by the cabling 115. The controller 110 may be any number of conventional commercially available controllers suitable for controlling the sensors 105, such as, for example, a seismic data acquisition device, a PID controller, or a microcontroller. In a preferred embodiment, the controller 110 is a seismic data acquisition device.

The cabling 115 couples the sensors 105 and the controller 110. The cabling 115 may be any cabling suitable for transmitting information between the sensors 105 and controller 110, such as, for example, wire or fiber optics. In a preferred embodiment, the cabling 115 is a wire.

Figure 2:
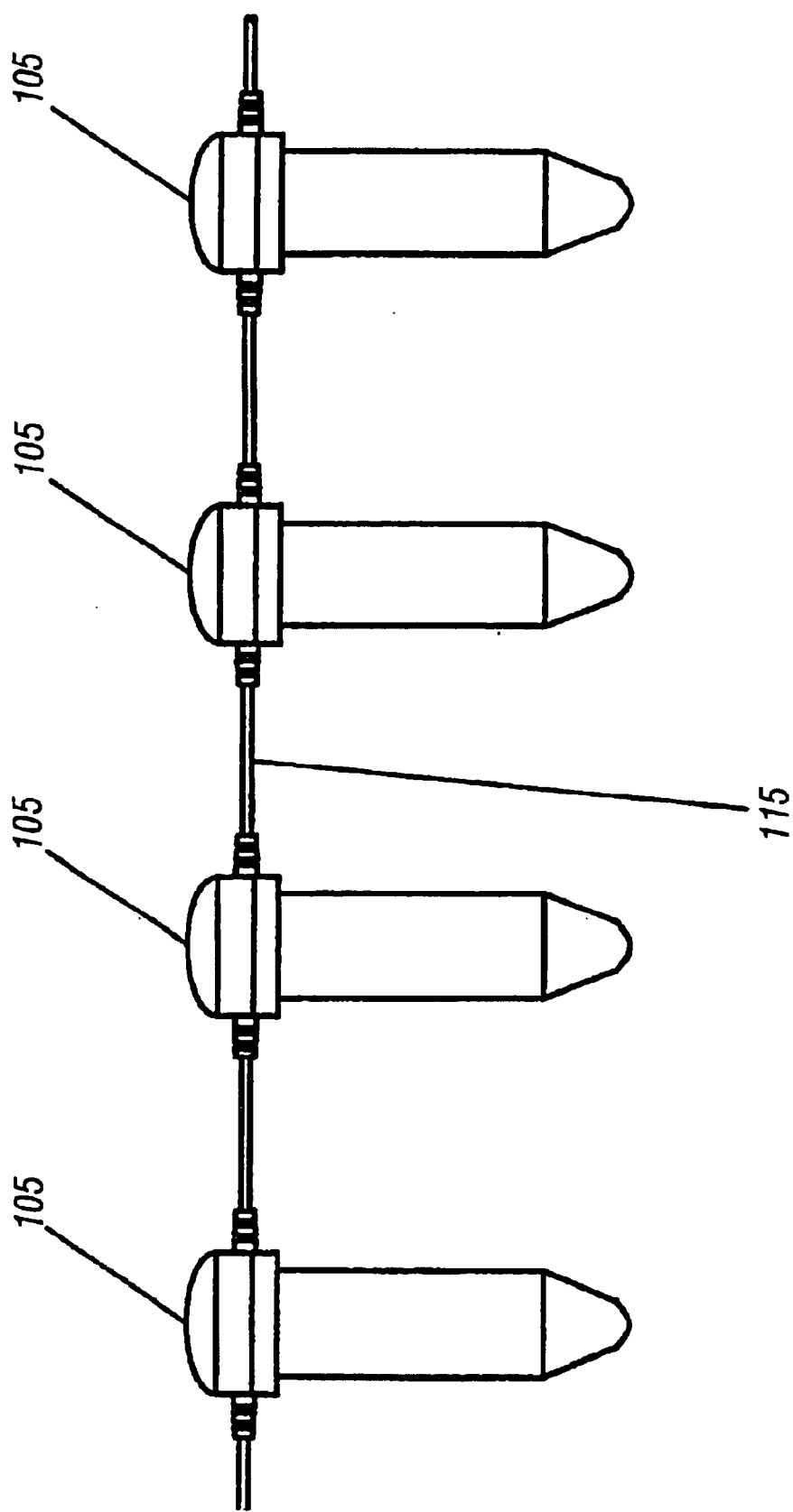
FIG. 2 illustrates an embodiment of sensors and cabling used within the system of FIG. 1.

Referring to FIG. 2, a preferred embodiment of the alignment of the sensors 105 and the cabling 115 within the system 100 is illustrated. The sensors 105 and the cabling 115 may be aligned linearly or non-linearly. In a preferred embodiment, the sensors 105 and cabling 115 are aligned linearly.

Figure 3B:
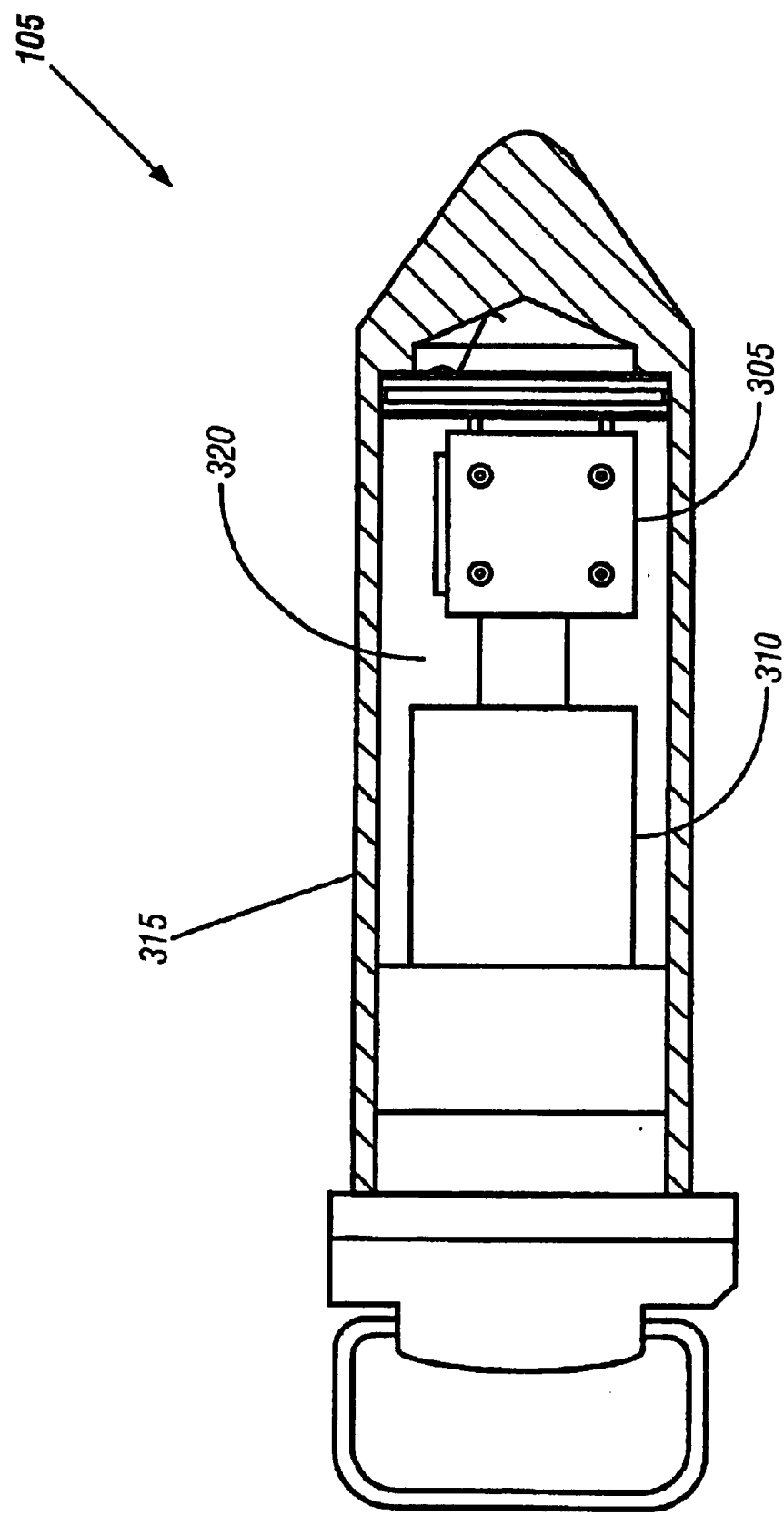
FIG. 3b is a cross-sectional top view of the positioning of an accelerometer within the sensor of FIG. 1.

The sensors 105 may include any number of conventional commercially available components suitable for creating a sensor. Referring to FIGS. 3a and 3b, in a preferred embodiment, the sensors 105 include one or more accelerometers 305, and a housing 315 having a cavity 320. In another preferred embodiment, the sensors 105 further include a measurement device 310. In a preferred embodiment, the sensors 105 each include three accelerometers 305. The accelerometers 305 are preferably placed in the cavity 320 within the housing 315 of the sensor 105. The accelerometers 305 may be coupled to the measurement device 310, or may operate independently within the sensor 105. In a preferred embodiment, the accelerometers 305 operate independently within the sensor 105. The measurement device 310 may be any number of conventional commercially available devices suitable for coupling with the accelerometer 305 to create a sensor 105, such as, for example, a geophone or a hydrophone. In a preferred embodiment, the measurement device 310 is a hydrophone.

Figure 4:
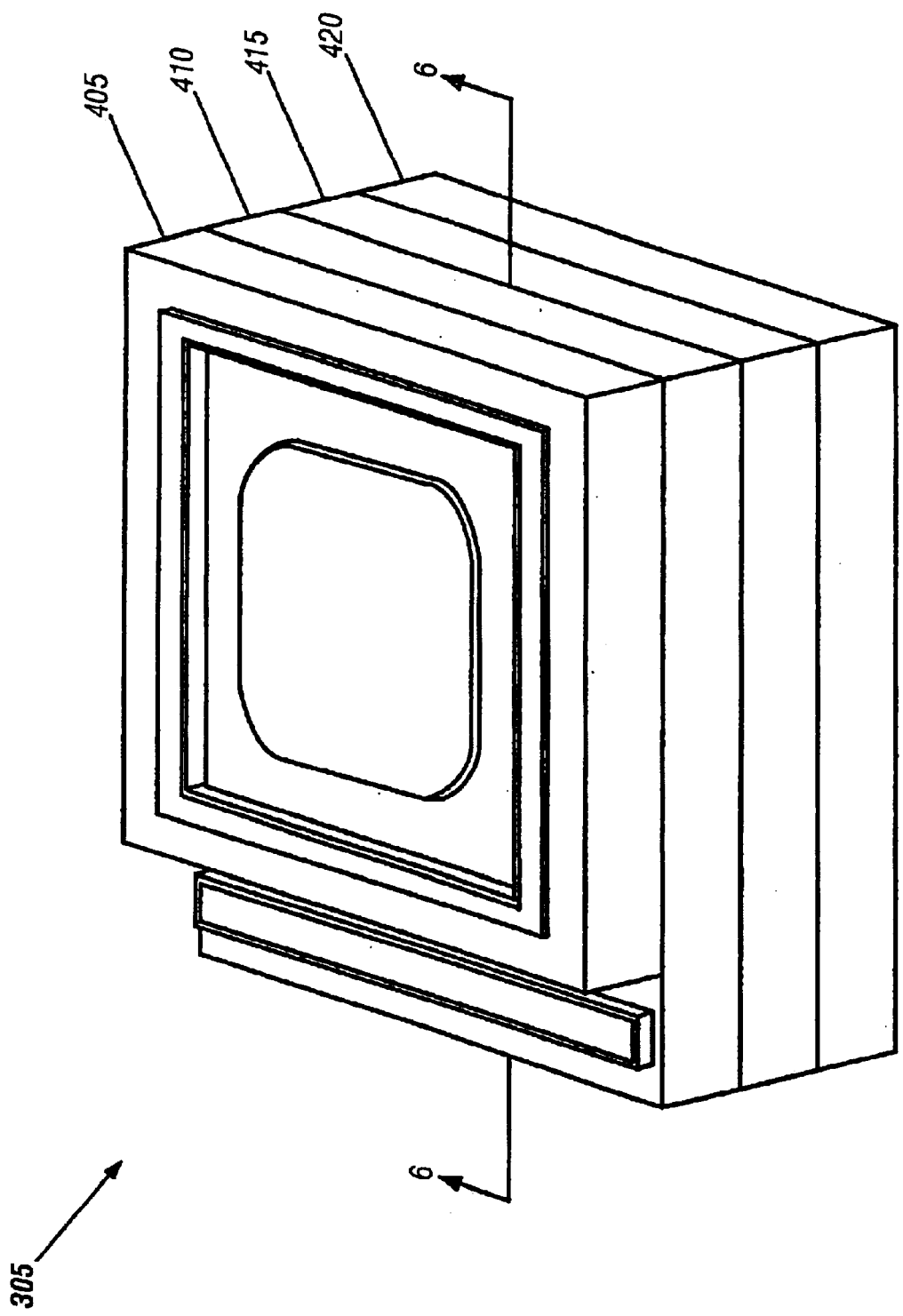
Figure 5:
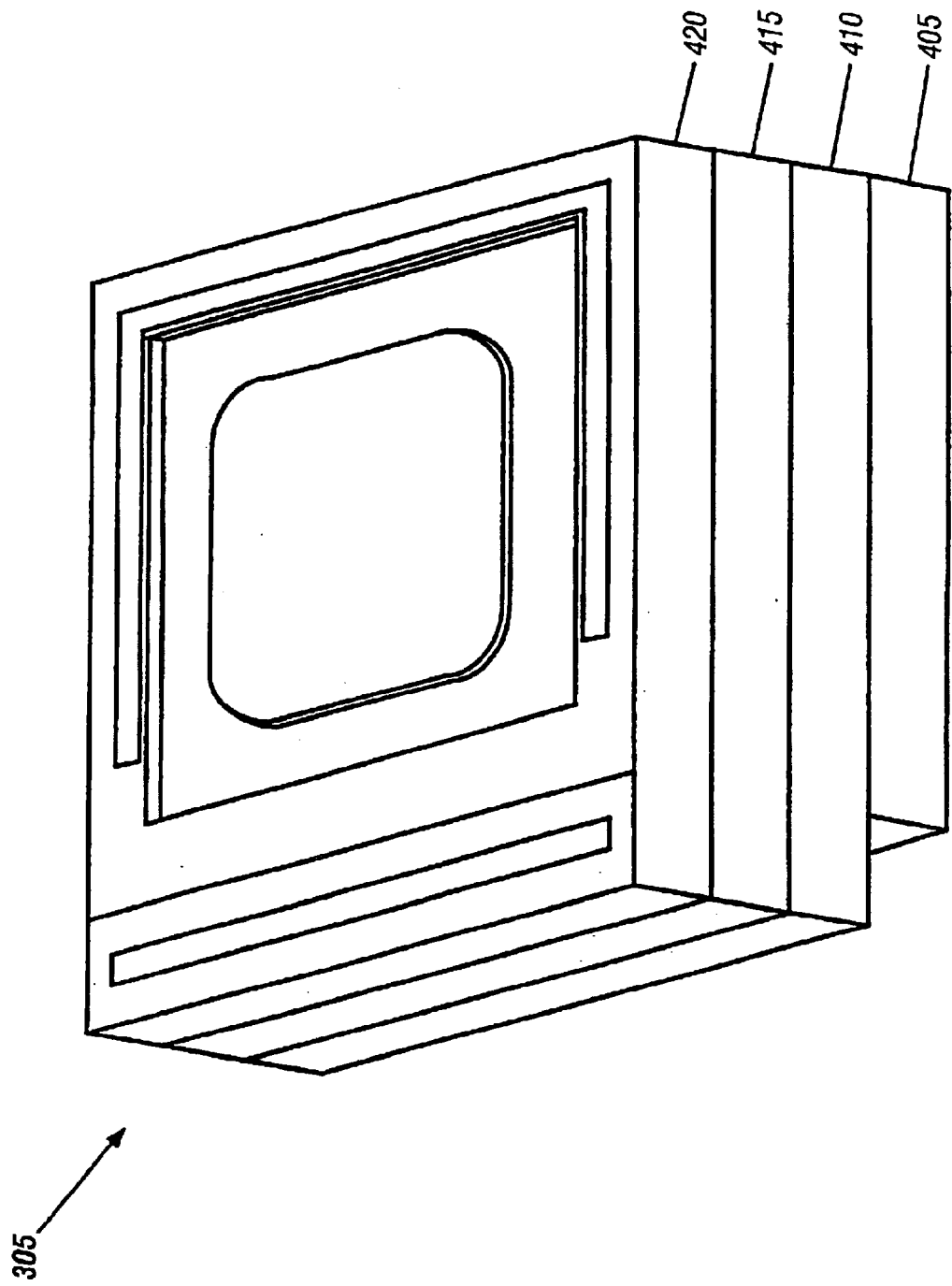
FIG. 5 illustrates a bottom perspective view of the accelerometer of FIG. 4.
Figure 6:
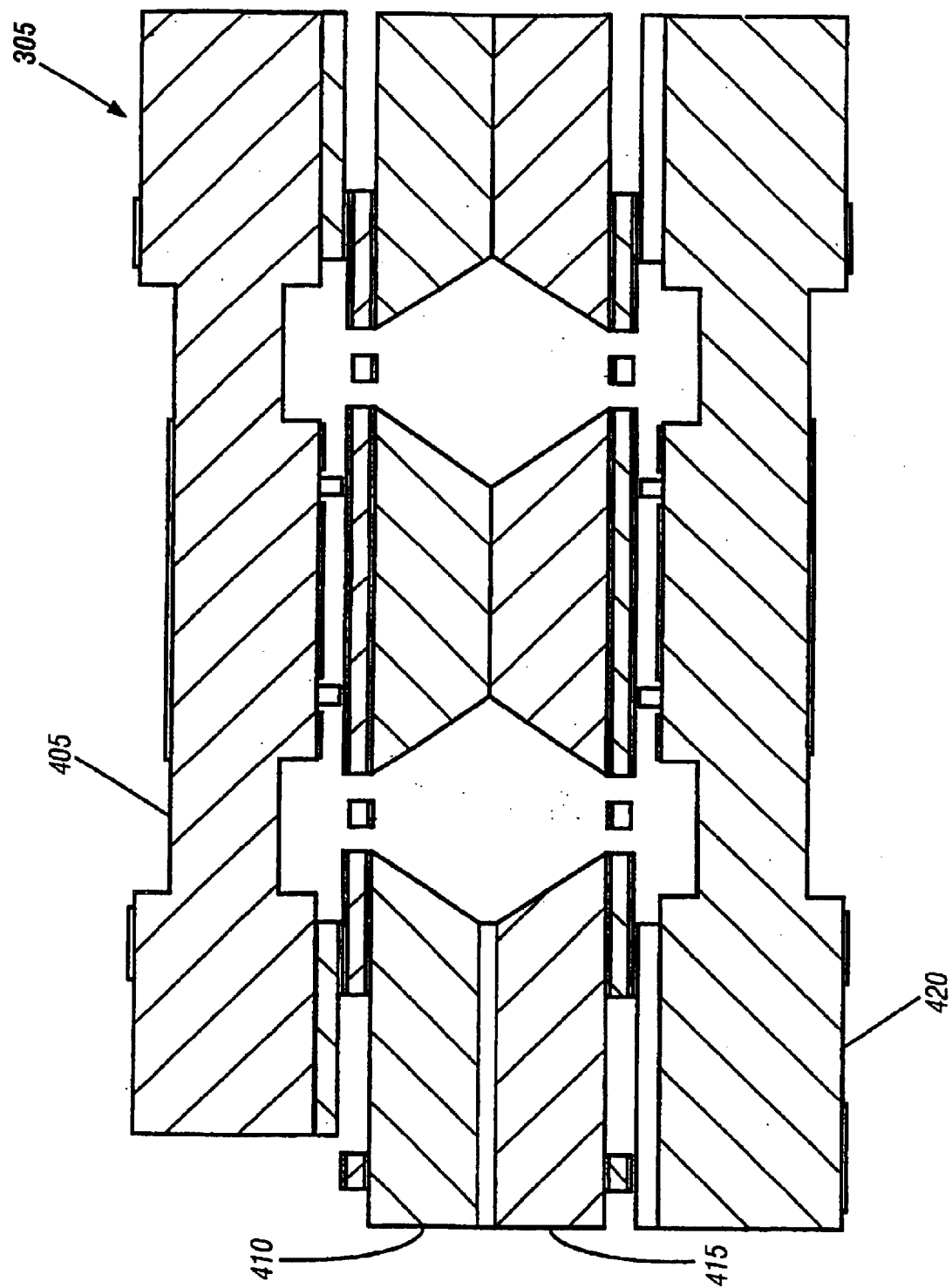
FIG. 6 illustrates a cross-sectional view of the accelerometer of FIG. 4.

The accelerometer 305 may include any number of components suitable for forming an accelerometer. Referring to FIGS. 4, 5, and 6, in a preferred embodiment, the accelerometer 305 includes a top cap wafer 405, a top measurement mass half 410, a bottom measurement mass half 415, and a bottom cap wafer 420. The operation of the accelerometer 305 is preferably provided substantially as described in U.S. Pat. No. 5,852,242, U.S. Pat. No. 6,035,694, and PCT patent application Ser. No. PCT/US00/40038, filed on Mar. 16, 2000, the disclosures of which is incorporated herein by reference.

The top cap wafer 405 may include any number of conventional commercially available components suitable for forming a top cap wafer. In a preferred embodiment, as illustrated in FIGS. 7a, 7b, 7c, 7d, 7e, 7f, 7g, 7h, 7i, 7j, 7k, and 7l, the top cap wafer 405 includes a top cap wafer body 406, an upper surface 407, a bottom surface 408, a top capacitor electrode 705, a top bond ring 707, a top bond oxide ring 710, a top cap parasitic groove 715, top cap overshock bumpers 720, a top cap press frame recess 725, a top cap balanced metal pattern 730, and a top cap contact pad 735.

The top cap wafer body 406 may be fabricated from any number of conventional commercially available materials suitable for creating a cap wafer body, such as, for example, glass, quartz, ceramic, or silicon. In a preferred embodiment, the top cap wafer body 406 is made of silicon.

Figure 7A:
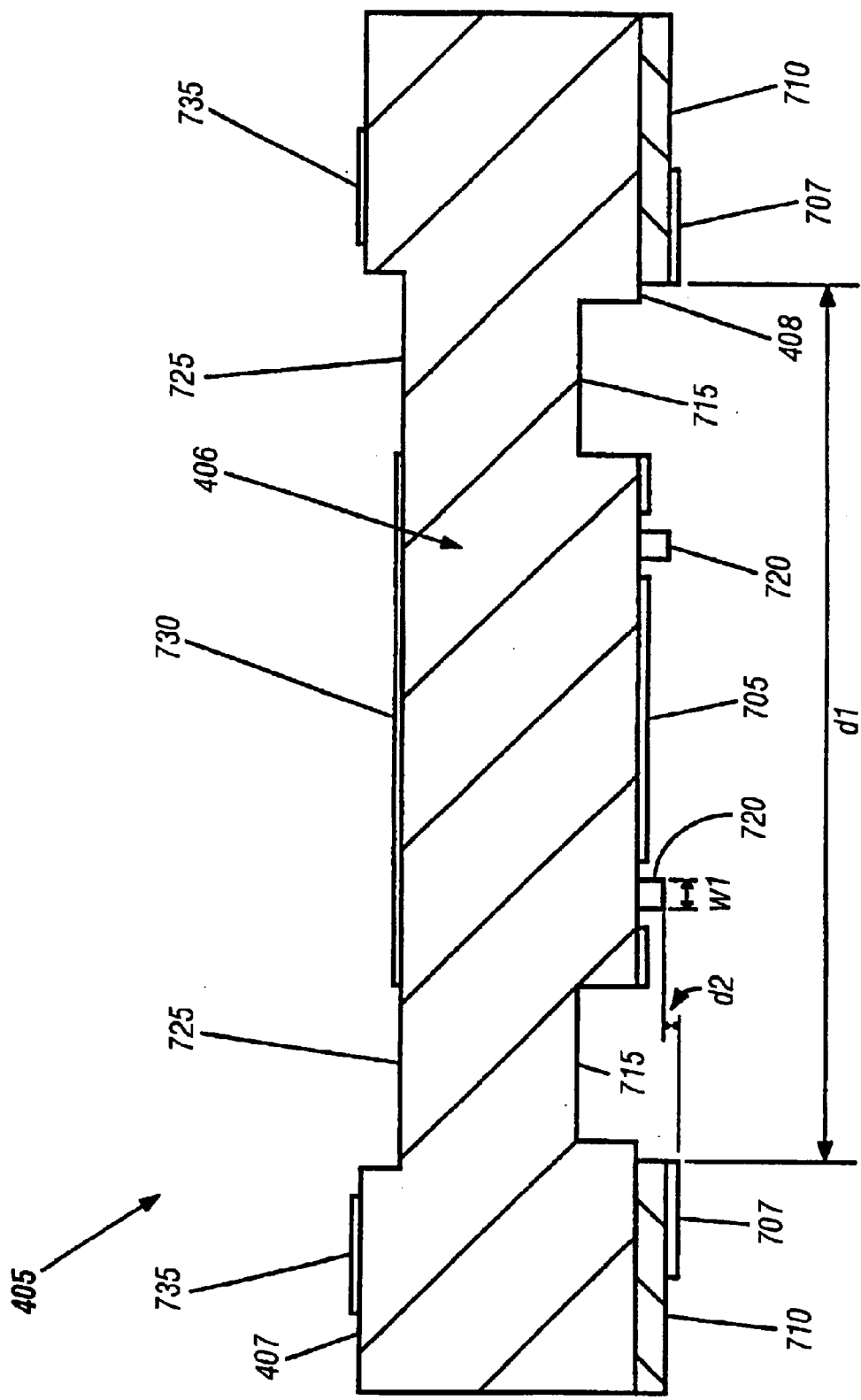
FIG. 7a illustrates a cross-sectional view of a top cap wafer of the accelerometer of FIG. 4.
Figure 7C:
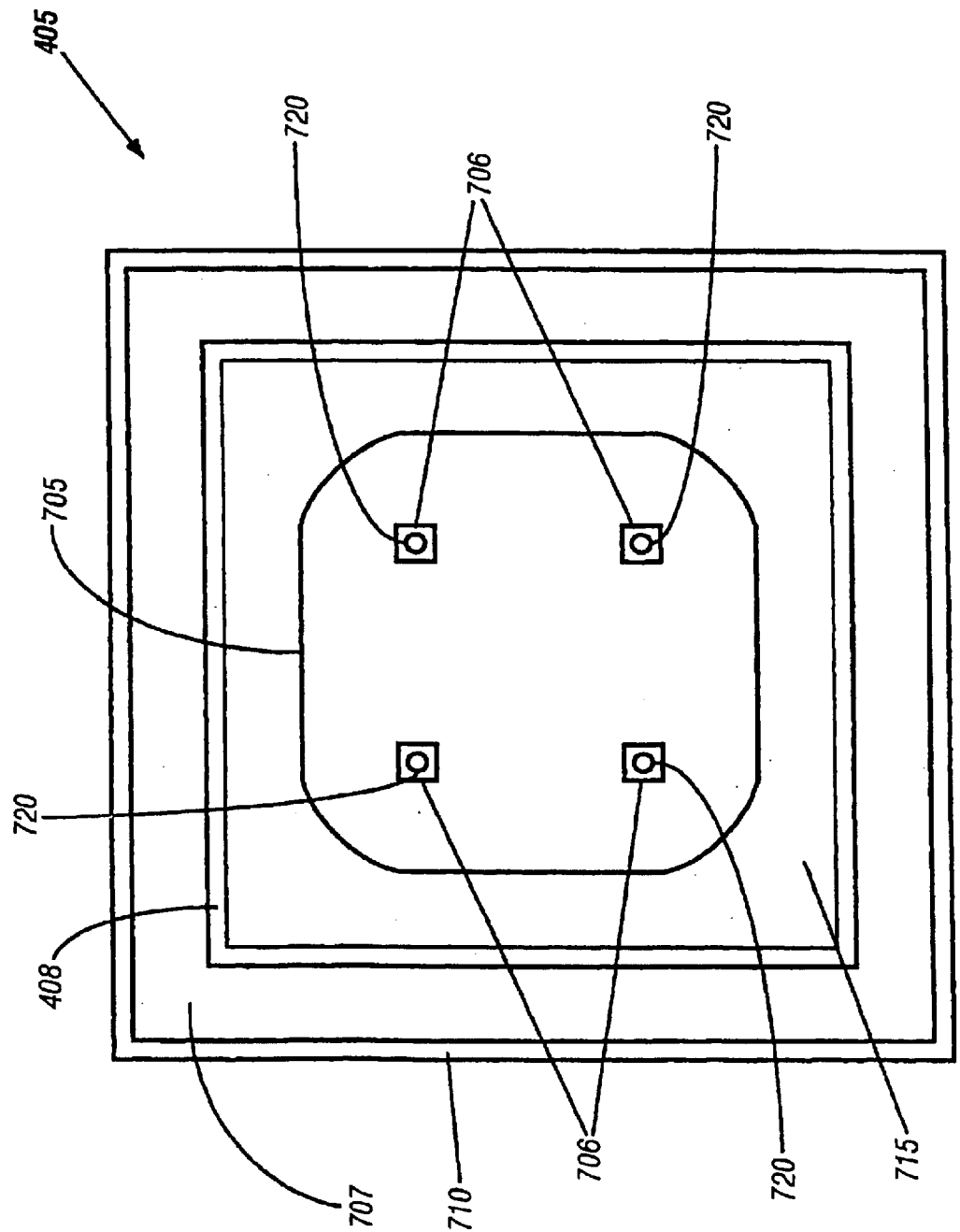

The top capacitor electrode 705 is preferably used for the time-based multiplexing of electrical signals from an external circuit, the operation of which is substantially as described in PCT patent application Ser. No. PCT/US00/40038. The top capacitor electrode 705 is preferably located on the bottom surface 408 of the top cap wafer body 406, within an area circumscribed by the top cap parasitic groove 715. In a preferred embodiment, as illustrated in FIG. 7c, the top capacitor electrode 705 includes slots 706 into which the top cap overshock bumpers 720 are fabricated. The top capacitor electrode 705 may be fabricated from any number of conductive materials suitable for creating an electrode, such as, for example, metals, silicides, or doped semiconductors. In a preferred embodiment, the top capacitor electrode 705 is fabricated from a combination of gold and titanium. In a preferred embodiment, the combination of gold and titanium includes a layer of gold located on top of a layer of titanium. The layer of titanium preferably improves the adhesion of the gold to silicon and silicon dioxide.

The top bond ring 707 and the top bond oxide ring 710 preferably bond the top cap wafer 405 to the top measurement mass half 410 and help establish a narrow gap between the top capacitor electrode 705 and an electrode located on an upper surface of the top measurement mass half 410. The top bond oxide ring 710 preferably provides electrical isolation between the top cap wafer 405 and the top measurement mass half 410. The top bond ring 707 and the top bond oxide ring 710 are preferably located on the bottom surface 408 of the top cap wafer body 406. The top bond ring 707 may be fabricated from any number of materials suitable for making a bond ring, such as, for example, gold, silver, or aluminum. In a preferred embodiment, the top bond ring 707 is fabricated from a combination of gold and titanium. In a preferred embodiment, the combination of gold and titanium includes a layer of gold located on top of a layer of titanium. The layer of titanium preferably improves the adhesion of the gold to silicon and silicon dioxide. The bond ring 707 may have any dimensions suitable for use within the accelerometer 305. In a preferred embodiment, as illustrated in FIG. 7a, the bond ring 707 has a width d1 that is smaller than the width of the top cap press frame recess 725. In a preferred embodiment, the bond ring 707 extends below the top cap overshock bumpers 720 by a distance d2. The top bond oxide ring 710 may be fabricated from any number of conventional commercially available materials suitable for making a bond oxide ring, such as, for example, silicon dioxide or dielectrics. In a preferred embodiment, the top bond oxide ring 710 is fabricated from silicon dioxide.

The top cap parasitic groove 715 preferably minimizes the coupling of electrostatic feedback of an external close-loop circuit to springs included in the top measurement mass half 410. The top cap parasitic groove 715 preferably is a groove within the bottom surface 408 of the top cap wafer body 406. The top cap parasitic groove 715 preferably circumscribes the top capacitor electrode 705 and is surrounded by the top bond oxide ring 710. The top cap parasitic groove 715 may include any dimensions suitable for creating an adequate parasitic groove. In a preferred embodiment, the top cap parasitic groove 715 measures greater than about 5 microns in depth and has a width wider than the width of the springs within the top measurement mass half 410.

Figure 7E:
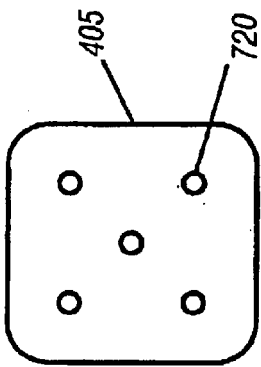
FIG. 7e illustrates an embodiment of an alternative arrangement of the overshock bumpers of FIG. 7d.
Figure 7H:
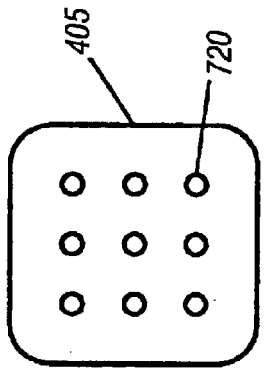
FIG. 7h illustrates an embodiment of an alternative arrangement of the overshock bumpers of FIG. 7d.
Figure 7K:
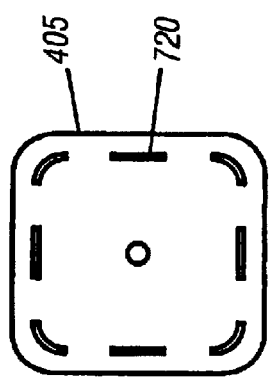
FIG. 7k illustrates an embodiment of an alternative arrangement of the overshock bumpers of FIG. 7d.
Figure 7F:
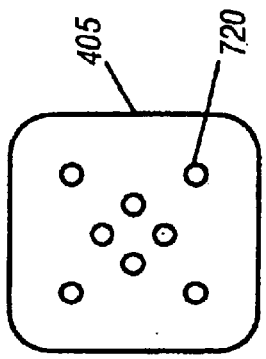
FIG. 7f illustrates an embodiment of an alternative arrangement of the overshock bumpers of FIG. 7d.
Figure 7I:
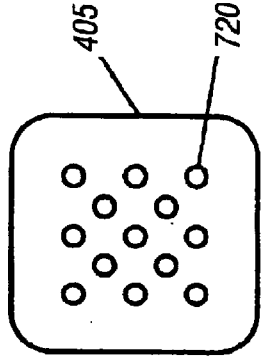
FIG. 7i illustrates an embodiment of an alternative arrangement of the overshock bumpers of FIG. 7d.
Figure 7L:
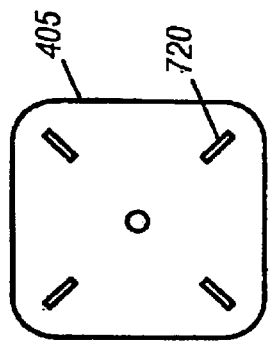
FIG. 7l illustrates an embodiment of an alternative arrangement of the overshock bumpers of FIG. 7d.
Figure 7D:
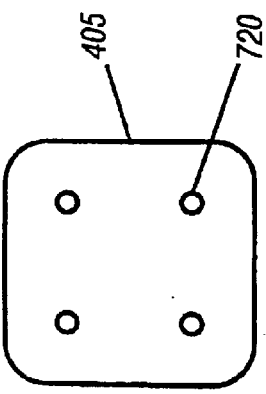
Figure 7G:
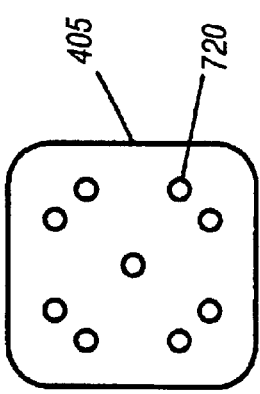
FIG. 7g illustrates an embodiment of an alternative arrangement of the overshock bumpers of FIG. 7d.
Figure 7J:
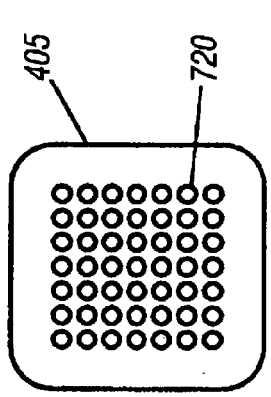
FIG. 7j illustrates an embodiment of an alternative arrangement of the overshock bumpers of FIG. 7d.

The top cap overshock bumpers 720 preferably provide out-of-plane shock protection to the top measurement mass half 410. The top cap overshock bumpers 720 are preferably located on the bottom surface 408 of the top cap wafer body 406, and are exposed through the cutouts 706 in the top capacitor electrode 705. The top cap overshock bumpers 720 may be fabricated from any number of conventional commercially available materials suitable for creating overshock bumpers, such as, for example, silicon dioxide or dielectrics. In a preferred embodiment, the top cap overshock bumpers 720 are made of silicon dioxide. In a preferred embodiment, as illustrated in FIG. 7a, the top cap overshock bumpers 720 have a width w1. The top cap wafer 405 may include any number of top cap overshock bumpers 720. The design and layout of the top cap overshock bumpers 720 may be affected by any number of factors. In a preferred embodiment, the design and layout of the top cap overshock bumpers 720 balances the need for shock protection with the need for minimal stiction between the top cap overshock bumpers 720 and a metal electrode pattern 910 located on the top measurement mass half 410. Stiction occurs when the top cap overshock bumpers 720 stick to the metal electrode pattern 910 on the top measurement mass half 410 during the operation of the accelerometer 305. The stiction between the top cap overshock bumpers 720 and the metal electrode pattern located on the top measurement mass half 410 may be caused by any number of sources, such as, for example, imprinting of the top cap overshock bumpers 720 onto the metal electrode pattern 910 located on the top measurement mass half 410, Van Der Waals forces, electrostatic forces, surface residues resulting from the fabrication of the accelerometer 305, or package-induced stresses. In a preferred embodiment, as illustrated in FIG. 7d, the top cap wafer 405 includes four bumpers. In an alternative embodiment, as illustrated in FIG. 7e, the top cap wafer 405 includes five top cap overshock bumpers 720. In an alternative embodiment, as illustrated in FIG. 7f, the top cap wafer 405 includes eight geometrically arranged top cap overshock bumpers 720. In an alternative embodiment, as illustrated in FIG. 7g, the top cap wafer 405 includes nine geometrically arranged top cap overshock bumpers 720. In an alternative embodiment, as illustrated in FIG. 7j, the top cap wafer 405 includes nine top cap overshock bumpers 720 arranged in three linear, parallel rows with each row having three bumpers 720. In an alternative embodiment, as illustrated in FIG. 7i, the top cap wafer 405 includes thirteen geometrically arranged top cap overshock bumpers 720. In an alternative embodiment, as illustrated in FIG. 7j, the top cap wafer 405 includes forty nine top cap overshock bumpers 720. In an alternative embodiment, as illustrated in FIGS. 7k and 7l, the top cap wafer 405 includes a plurality of geometrically arranged top cap overshock bumpers 720 in the shape of circles and ridges.

The top cap press frame recess 725 is preferably located on the upper surface 407 of the top cap wafer body 406 between the top cap balanced metal pattern 730 and the top cap contact pad 735. The top cap press frame recess 725 preferably ensures that bond forces applied during a bonding process are localized to the top bond oxide ring 710 region. By localizing bond forces to the top bond oxide ring 710 region rather than to the region of the narrow gap between the top capacitor electrode 705 and the electrode located on an upper surface of the top measurement mass half 410, the narrow gap between the electrodes is maintained. The top cap press frame recess 725 may be formed using any number of processing steps suitable for forming a press frame recess such as, for example, silicon etching. In a preferred embodiment, the top cap press frame recess 725 is etched into the upper surface 407 of the top cap wafer body 406. The top cap press frame recess 725 may include any dimensions suitable for creating a press frame recess. In a preferred embodiment, the top cap press frame recess 725 measures greater than about 20 microns in depth, and has a width wider than the width d1 of the bond ring 707.

The top cap contact pad 735 is preferably located on the upper surface 407 of the top cap wafer body 406. The top cap contact pad 735 is preferably available for wire bonding. The top cap contact pad 735 may include any number of conventional commercially available materials suitable for creating a contact pad such as, for example, gold, aluminum, or silver. In a preferred embodiment, the top cap contact pad 735 is made of gold. In another preferred embodiment, the top cap contact pad 735 is made of a combination of gold and titanium. In a preferred embodiment, the combination of gold and titanium includes a layer of gold located on top of a layer of titanium. The layer of titanium preferably improves the adhesion of the gold to silicon and silicon dioxide.

The top cap balanced metal pattern 730 is used to minimize bowing of the top cap wafer body 406. Bowing of the top cap wafer body 406 is undesirable because it has an adverse effect on the performance of the accelerometer 305. Bowing of the top cap wafer body 406 typically results from thermal coefficient of expansion (TCE) differences between the material of the top cap wafer body 406 and the metal of the top capacitor electrode 705. In a preferred embodiment, the material of the top cap wafer body 406 is silicon. In a preferred embodiment, the top cap balanced metal pattern 730 is approximately identical in pattern and thickness to the top capacitor electrode 705 and is placed within the top cap press frame recess 725, substantially opposite the top capacitor electrode 705. In a preferred embodiment, the top cap balanced metal pattern 730 includes cutouts 731 to offset the cutouts 705 in the top capacitor electrode 705. This alignment preferably creates a balanced metal/silicon/metal sandwich that helps minimize the TCE mismatch effects on accelerometer 305 performance.

Figure 8A:
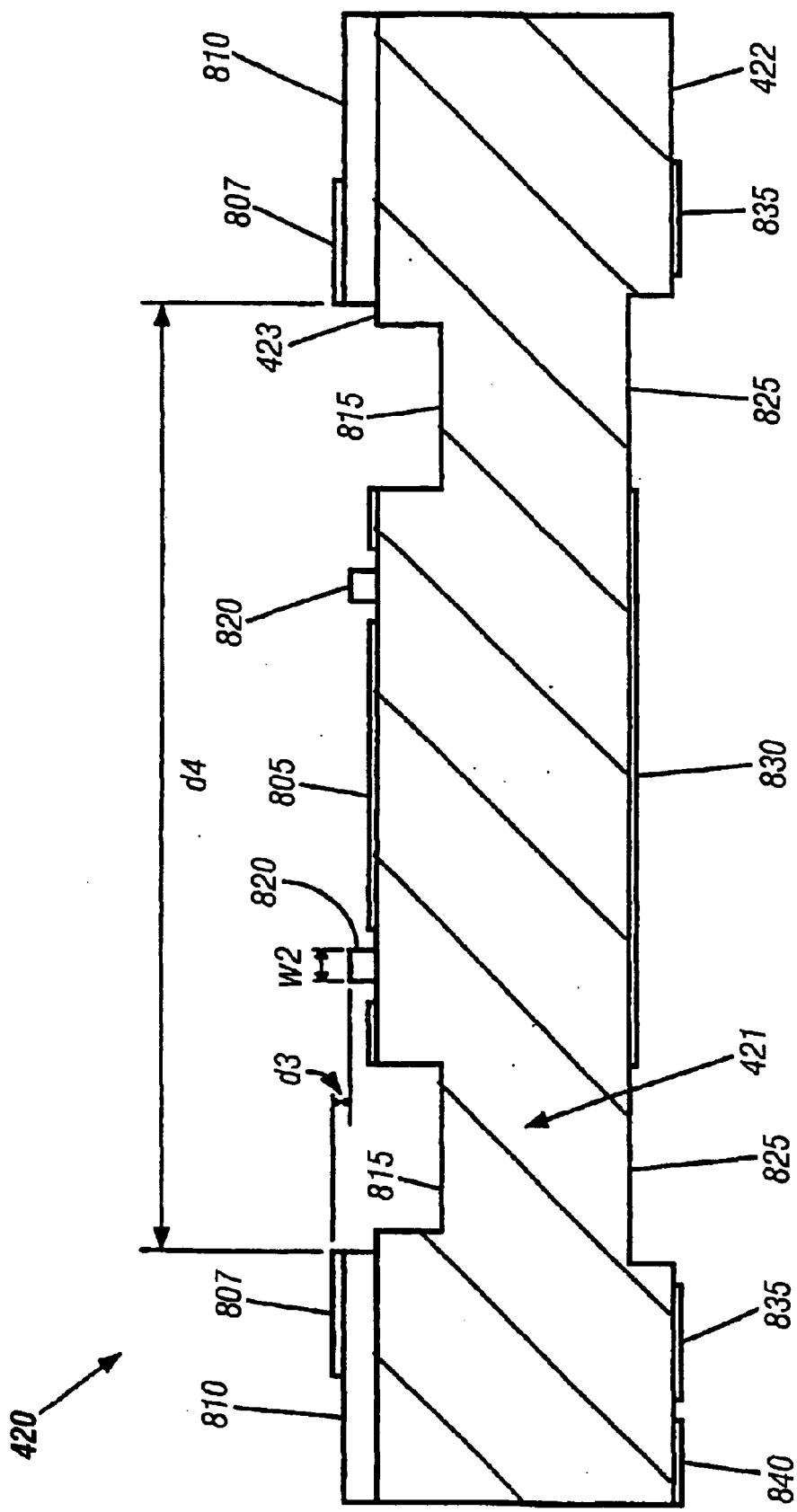
FIG. 8a illustrates a cross-sectional view of a bottom cap wafer of the accelerometer of FIG. 4.
Figure 8B:
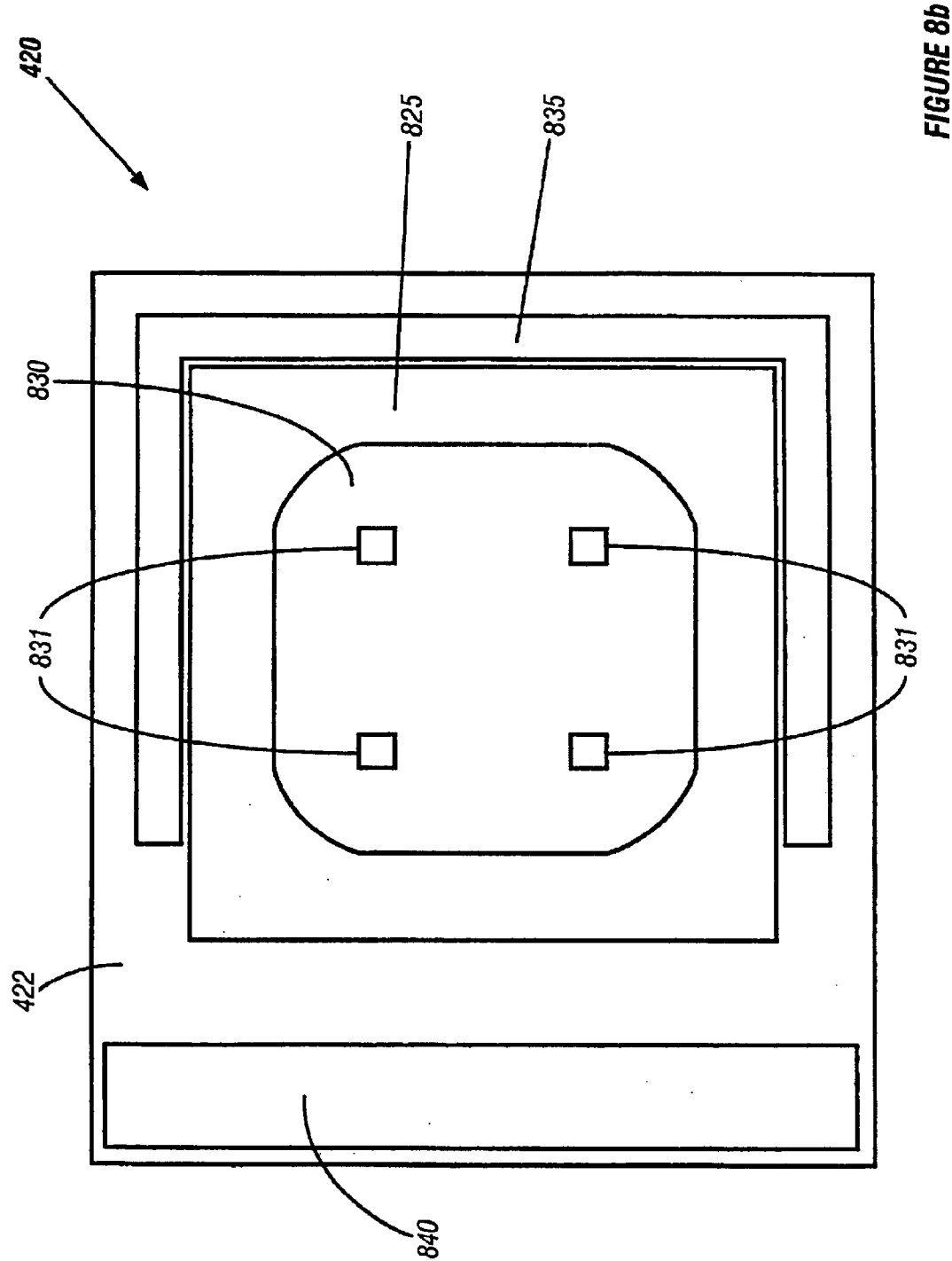
Figure 8C:
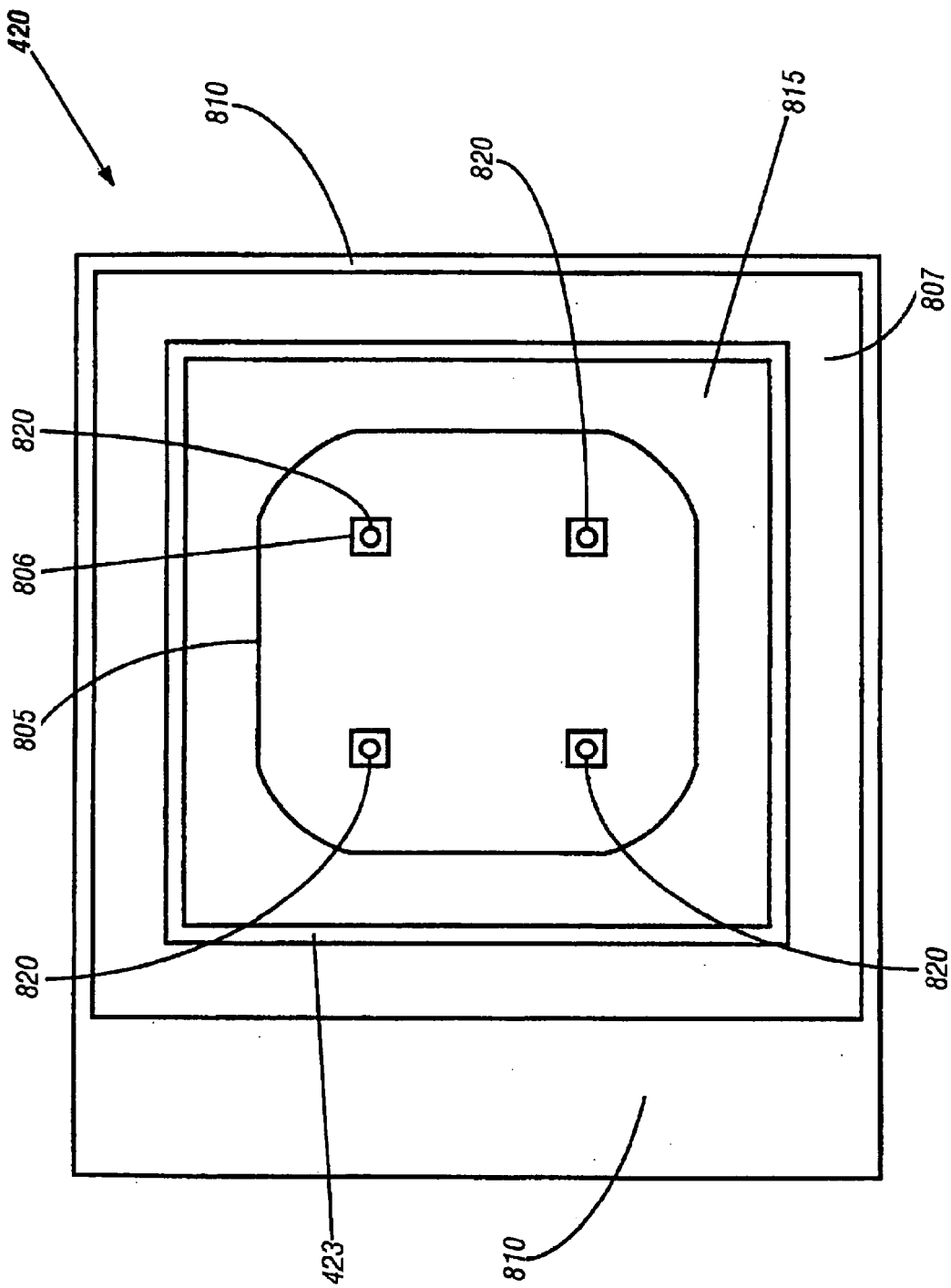

The bottom cap wafer 420 may include any number of conventional commercially available components suitable for forming a bottom cap wafer. In a preferred embodiment, as illustrated in FIGS. 8a, 8b, and 8c, the bottom cap wafer 420 includes a bottom cap wafer body 421, an upper surface 423, a bottom surface 422, a bottom capacitor electrode 805, a bottom bond ring 807, a bottom bond oxide ring 810, a bottom cap parasitic groove 815, bottom cap overshock bumpers 820, a bottom cap press frame recess 825, a bottom cap balanced metal pattern 830, a bottom cap contact pad 835, and an extended cap solder attach (ECSA) metal bond pad 840.

The bottom cap wafer body 421 may be fabricated from any number of conventional commercially available materials suitable for creating a cap wafer body such as, for example, glass, quartz, ceramic, or silicon. In a preferred embodiment, the bottom cap wafer body 421 is made of silicon.

The bottom capacitor electrode 805 is preferably used for the time-based multiplexing of electrical signals from an external circuit, the operation of which is substantially as described in PCT patent application Ser. No. PCT/US00/40038. The bottom capacitor electrode 805 is preferably located on the upper surface 423 of the bottom cap wafer body 421, within an area circumscribed by the bottom cap parasitic groove 815. In a preferred embodiment, as illustrated in FIG. 8c, the bottom capacitor electrode 805 includes cutouts 806 into which the bottom cap overshock bumpers 820 are fabricated. The bottom capacitor electrode 805 may be fabricated using any number of conductive materials suitable for creating an electrode such as, for example, metals, silicides, or doped semiconductors. In a preferred embodiment, the bottom capacitor electrode 805 is fabricated from a combination of gold and titanium. In a preferred embodiment, the combination of gold and titanium includes a layer of gold located on top of a layer of titanium. The layer of titanium preferably improves the adhesion of the gold to silicon and silicon dioxide.

The bottom bond ring 807 and the bottom bond oxide ring 810 preferably bond the bottom cap wafer 420 to the bottom measurement mass half 415 and help establish a narrow gap between the bottom capacitor electrode 805 and an electrode located on a lower surface of the bottom measurement mass half 415. The bottom bond oxide ring 810 preferably provides electrical isolation between the bottom cap wafer 420 and the bottom measurement mass half 415. The bottom bond ring 807 and the bottom bond oxide ring 810 are preferably located on the upper surface 423 of the bottom cap wafer body 421. The bottom bond ring 807 may be fabricated from any number of materials suitable for making a bond ring such as, for example, aluminum, silver, or gold. In a preferred embodiment, the bottom bond ring 807 is fabricated from a combination of gold and titanium. In a preferred embodiment, the combination of gold and titanium includes a layer of gold located on top of a layer of titanium. The layer of titanium preferably improves the adhesion of the gold to silicon and silicon dioxide. In a preferred embodiment, the bond ring 807 has a width d4 that is smaller than the width of the bottom cap press frame recess 825. In a preferred embodiment, the bond ring 807 extends beyond the bottom cap overshock bumpers 820 by a distance d3. The bottom bond oxide ring 810 may include any number of conventional commercially available materials suitable for making a bond oxide ring such as, for example, dielectrics. In a preferred embodiment, the bottom bond oxide ring 810 is fabricated from silicon dioxide.

The bottom cap parasitic groove 815 preferably minimizes the coupling of electrostatic feedback of an external close-loop circuit to springs included in the bottom measurement mass half 415. The bottom cap parasitic groove 815 preferably is a groove within the upper surface 423 of the bottom cap wafer body 421. The bottom cap parasitic groove 815 preferably circumscribes the bottom capacitor electrode 805, and is surrounded by the bottom bond oxide ring 810. The bottom cap parasitic groove 815 may include any dimensions suitable for creating an adequate parasitic groove. In a preferred embodiment, the bottom cap parasitic groove 815 measures greater than about 5 microns in depth and has a width wider than the width of the springs within the bottom measurement mass half 415.

The bottom cap overshock bumpers 820 preferably provide out-of-plane shock protection to the bottom measurement mass half 415. The bottom cap overshock bumpers 820 are preferably located on the upper surface 423 of the bottom cap wafer body 421, and are exposed through the cutouts 806 in the bottom capacitor electrode 805. The bottom cap overshock bumpers 820 may be fabricated from any number of conventional commercially available materials suitable for creating overshock bumpers, such as, for example, dielectrics or silicon dioxide. In a preferred embodiment, the bottom cap overshock bumpers 820 are made of silicon dioxide. In a preferred embodiment, the bottom cap overshock bumpers 820 have a width w2. The bottom cap wafer 420 may include any number of bottom cap overshock bumpers 820. The design and layout of the bottom cap overshock bumpers 820 may be affected by any number of factors. In a preferred embodiment, the design and layout of the bottom cap overshock bumpers 820 balances the need for good shock protection with the need for minimal stiction between the bottom cap overshock bumpers 820 and a metal electrode pattern 915 located on the bottom measurement mass half 415. Stiction occurs when the bottom cap overshock bumpers 820 stick to the metal electrode pattern 915 on the bottom measurement mass half 415 during the operation of the accelerometer 305. The stiction between the bottom cap overshock bumpers 820 and the metal electrode pattern located on the bottom measurement mass half 415 may be caused by any number of sources, such as, for example, imprinting of the bottom cap overshock bumpers 820 onto the metal electrode pattern 915 located on the bottom measurement mass half 415, Van Der Waals forces, electrostatic forces, surface residues resulting from the manufacture of the accelerometer 305, or package-induced stresses. In a preferred embodiment, the number of bottom cap overshock bumpers 820 on the bottom cap wafer 420 equals the number of top cap overshock bumpers 720 on the top cap wafer 405, the variations of which are illustrated in FIGS. 7d, 7e, 7f, 7g, 7h, 7i, 7j, 7k, and 7l.

The bottom cap press frame recess 825 is preferably located on the bottom surface 422 of the bottom cap wafer body 421 between the bottom cap balanced metal pattern 830 and the outer edge of the bottom surface 422. The bottom cap press frame recess 825 ensures that bond forces applied during a bonding process are localized to the bottom bond oxide ring 810 region. By localizing bond forces to the bottom bond oxide ring 810 region rather than to the region of the narrow gap between the bottom capacitor electrode 805 and the electrode located on an bottom surface of the bottom measurement mass half 415, the narrow gap between the electrodes is maintained. The bottom cap press frame recess 825 may formed using any number of processing steps suitable for forming a press frame recess such as, for example, silicon etching. In a preferred embodiment, the bottom cap press frame recess 825 is etched into the bottom surface 422 of the bottom cap wafer body 421. The bottom cap press frame recess 825 may include any dimensions suitable for creating a press frame recess. In a preferred embodiment, the bottom cap press frame recess 825 measures greater than about 20 microns in height and has a width wider than the width d4 of the bond ring 807.

The bottom cap contact pad 835 is preferably located on the bottom surface 422 of the bottom cap wafer body 421. The bottom cap contact pad 835 is preferably available for wafer probing. The bottom cap contact pad 835 may include any number of conventional commercially available materials suitable for creating a contact pad such as, for example, gold, aluminum, or silver. In a preferred embodiment, the bottom cap contact pad 835 is fabricated from a combination of gold and titanium. In a preferred embodiment, the combination of gold and titanium includes a layer of gold located on top of a layer of titanium. The layer of titanium preferably improves the adhesion of the gold to silicon and silicon dioxide.

The bottom cap balanced metal pattern 830 is used to minimize bowing of the bottom cap wafer body 421. Bowing of the bottom cap wafer body 421 is undesirable because it has an adverse effect on the performance of the accelerometer 305. Bowing of the bottom cap wafer body 421 typically results from thermal coefficient of expansion (TCE) differences between the material that makes up the bottom cap wafer body 421 and the metal of the bottom capacitor electrode 805. In a preferred embodiment, the material that makes up the bottom cap wafer body 406 is silicon. In a preferred embodiment, the bottom cap balanced metal pattern 830 is approximately identical in pattern and thickness to the bottom capacitor electrode 805 and is placed within the bottom cap press frame recess 825, substantially opposite the bottom capacitor electrode 805. As illustrated in FIG. 8b, the bottom cap balanced metal pattern 830 preferably includes cutouts 831 designed to offset the cutouts 806 in the bottom capacitor electrode 805. This alignment preferably creates a balanced metal/silicon/metal sandwich that helps minimize the TCE mismatch effects on accelerometer 305 performance.

The ECSA metal bond pad 840 is preferably available for conductive die-attach to an external package into which the accelerometer 305 is placed. The operation of the ECSA metal bond pad 840 is preferably as described in PCT patent application Ser. No. PCT/US00/06832 filed on Mar. 15, 2000, the disclosure of which is incorporated herein by reference.

Figure 9A:
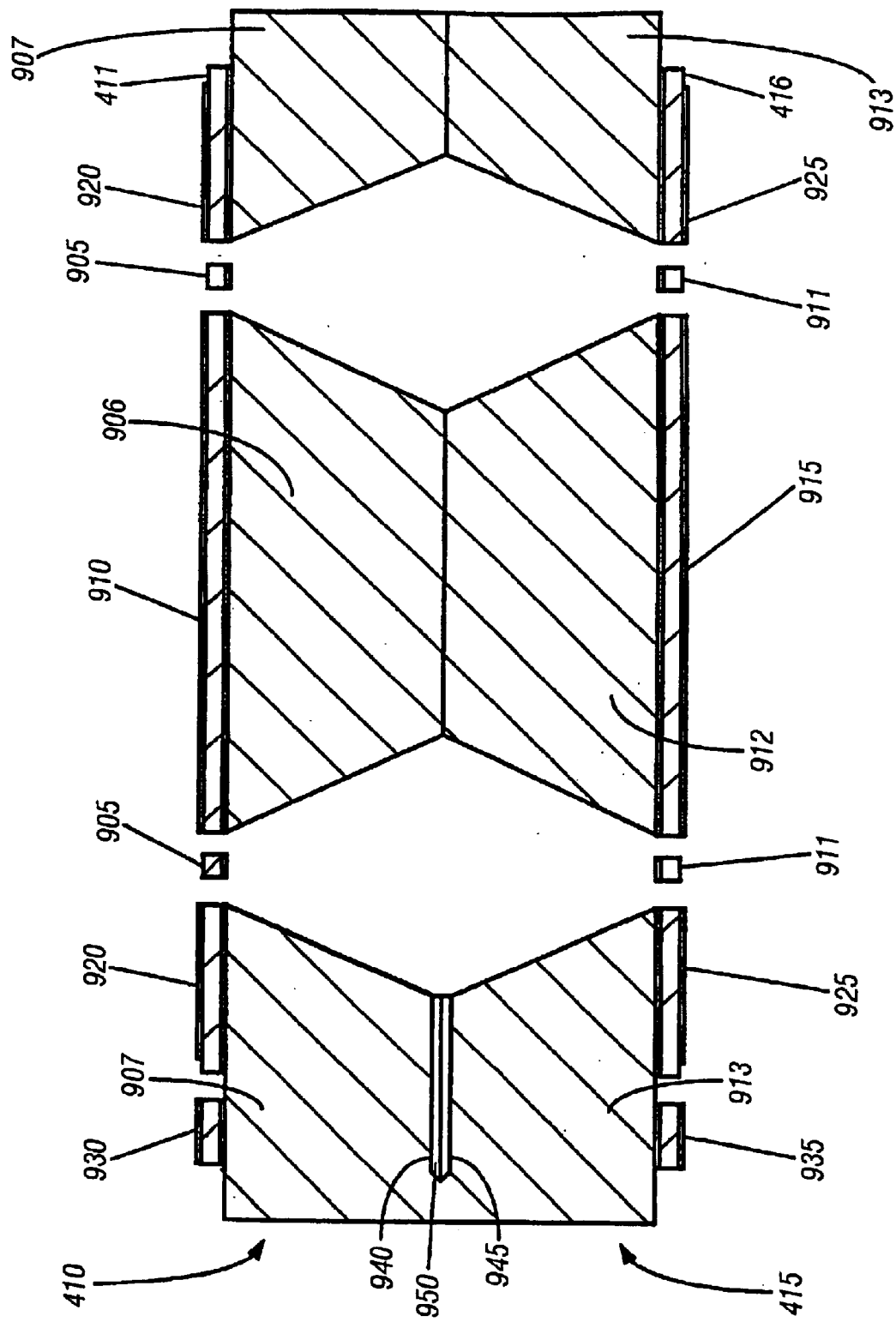
FIG. 9a illustrates a cross-sectional view of a mass wafer pair of the accelerometer of FIG. 4.
Figure 9A:
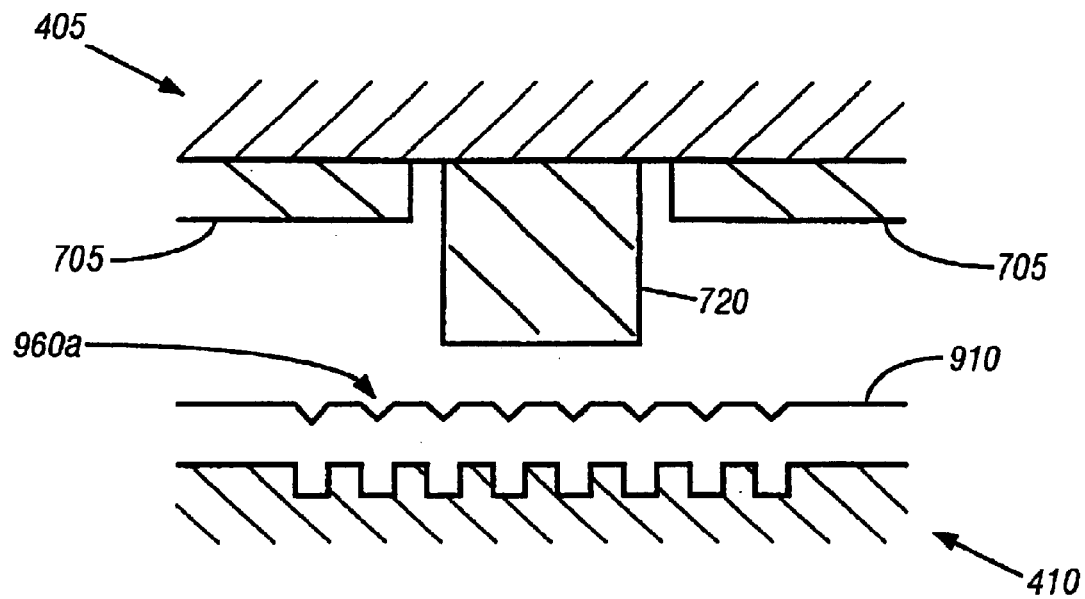
Figure 9A:
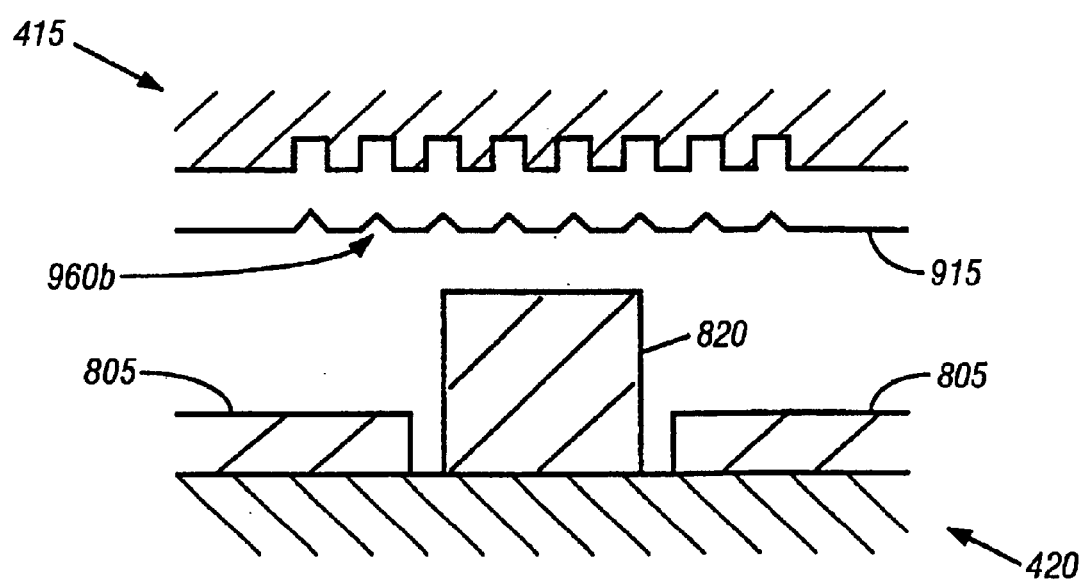
Figure 9A:
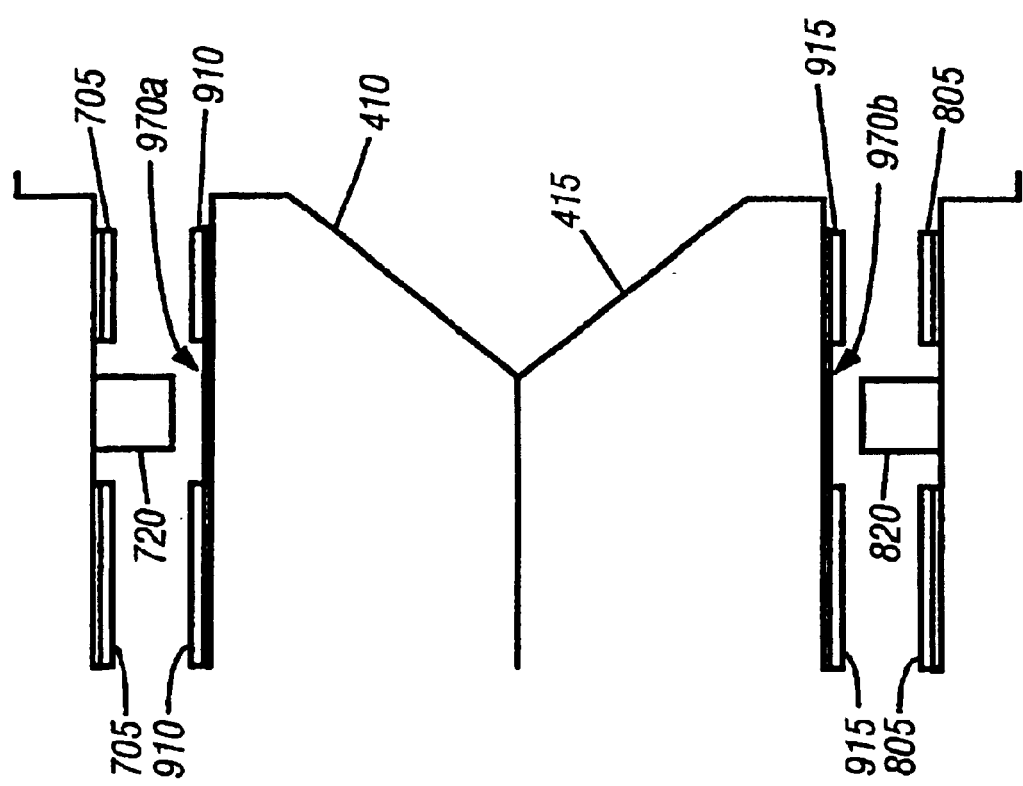
Figure 9A:
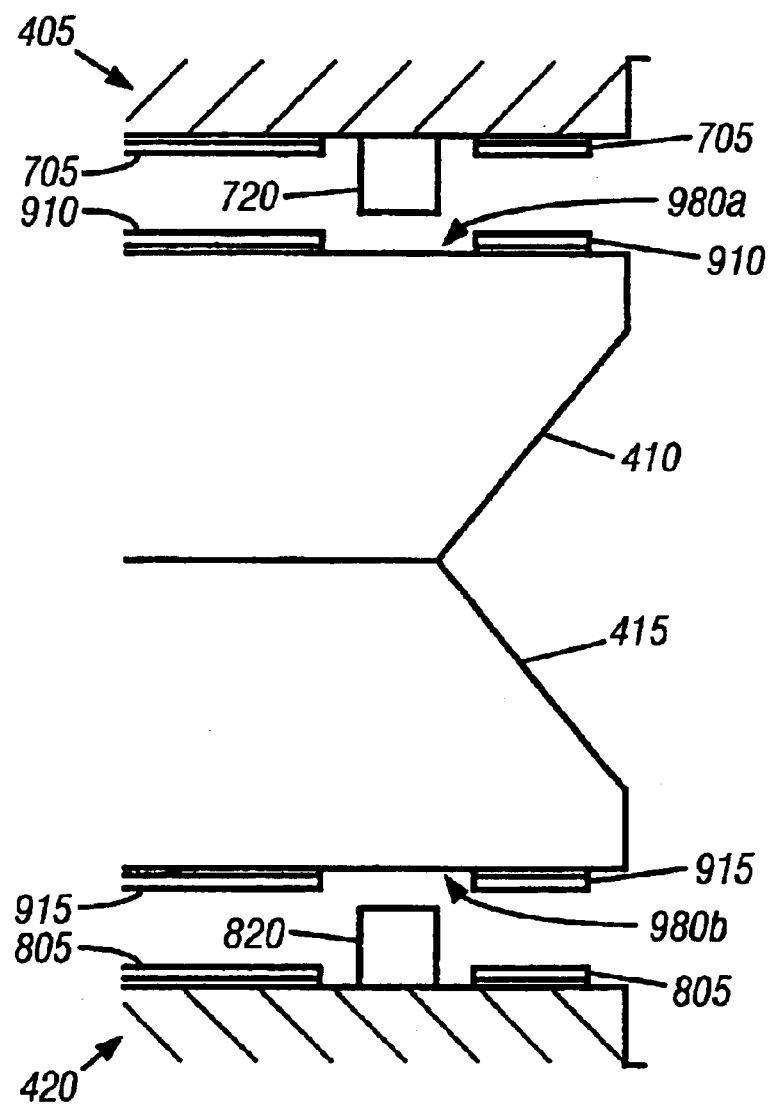
Figure 9B:
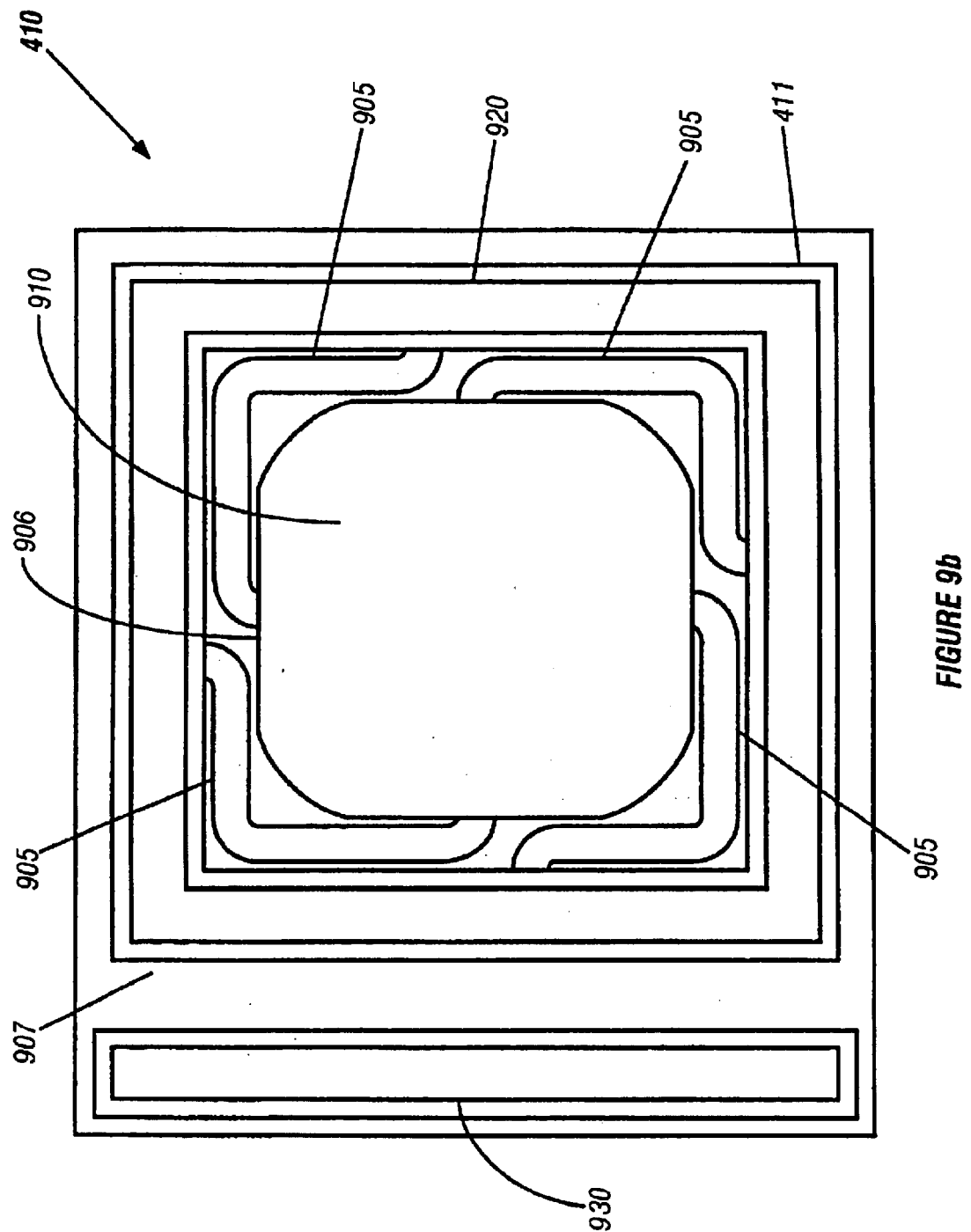
Figure 9C:
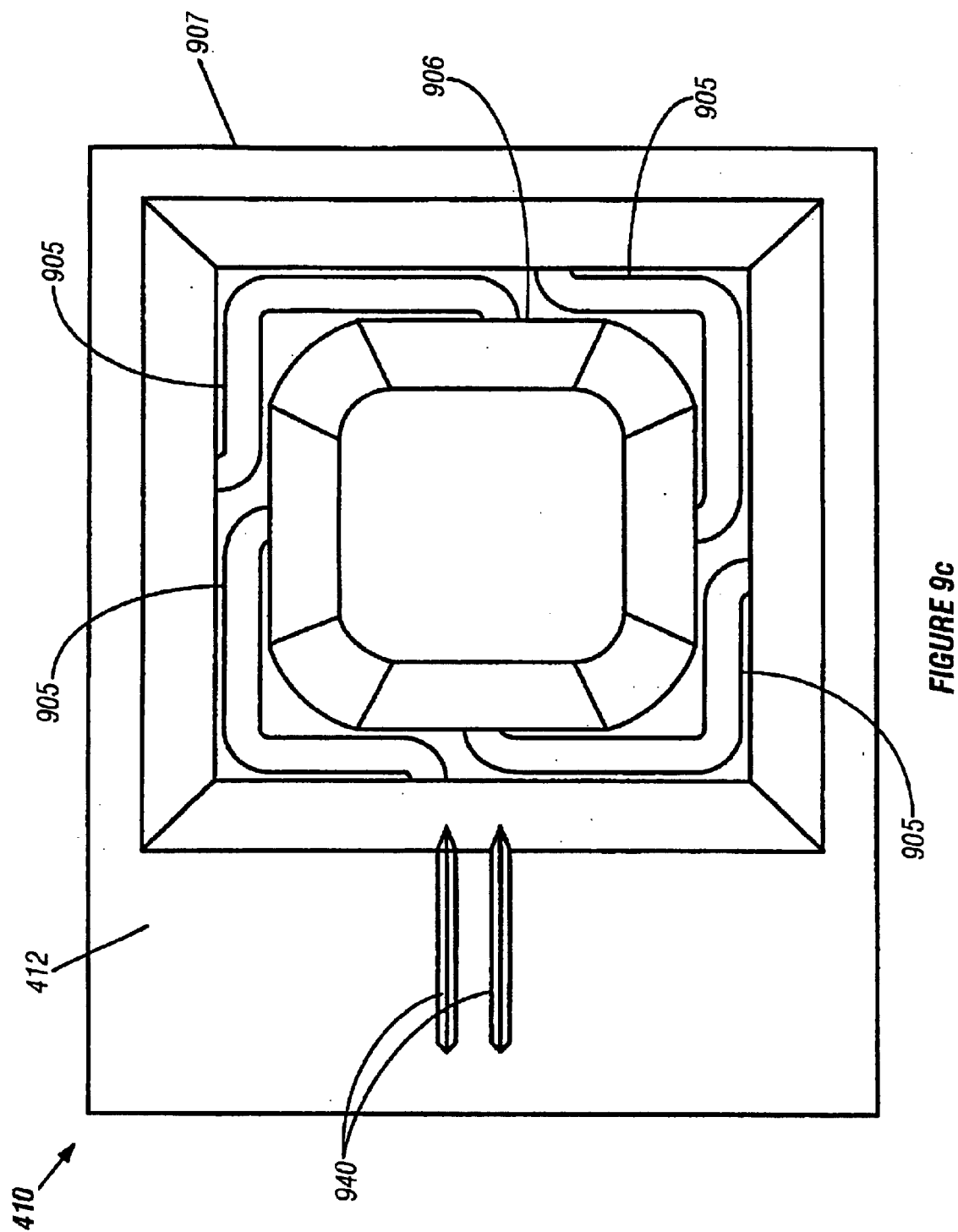
FIG. 9c is a bottom view of the top mass half of FIG. 9b.
Figure 9D:
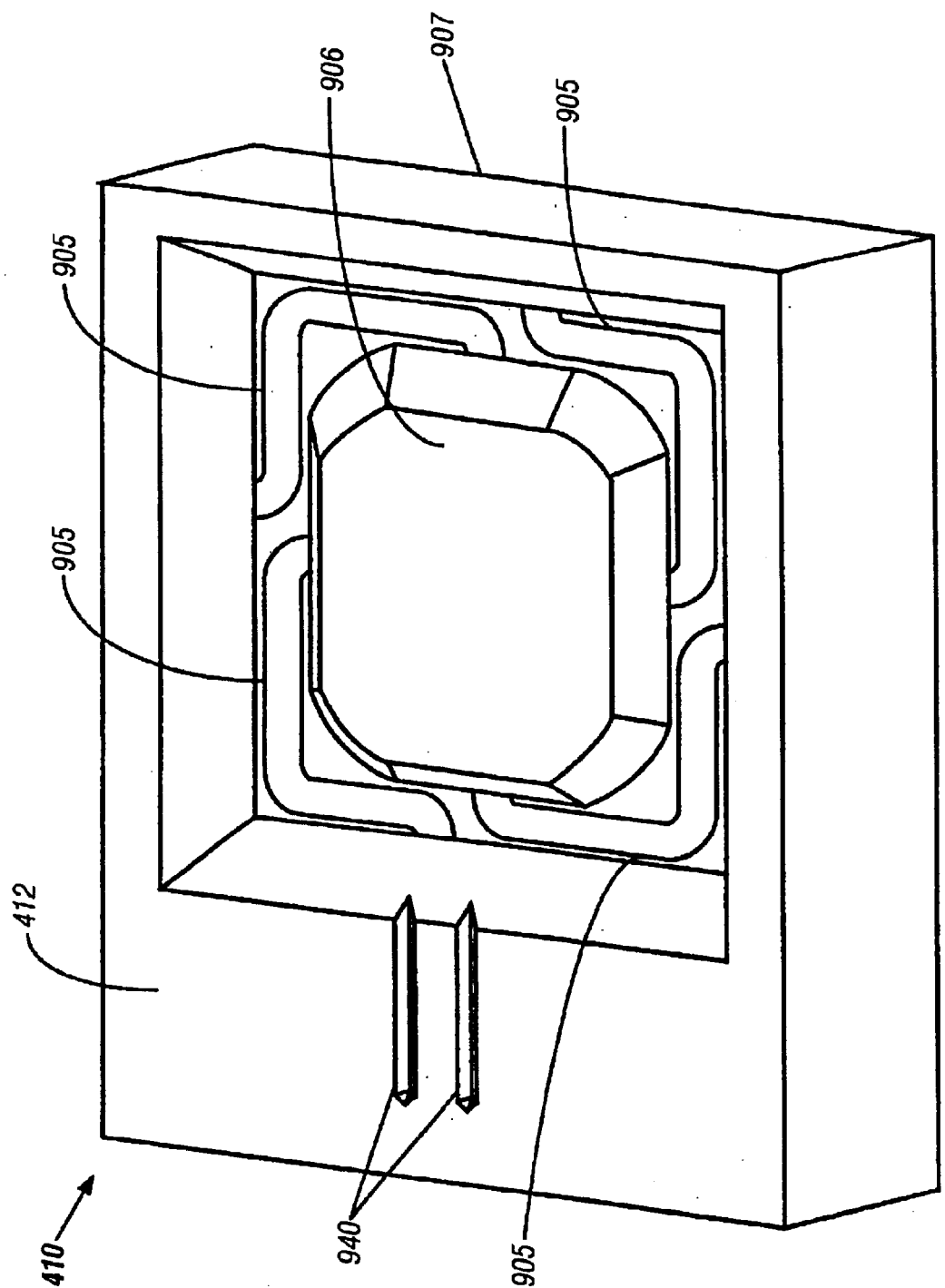
FIG. 9d is a bottom perspective view of the top mass half of FIG. 9c.
Figure 9E:
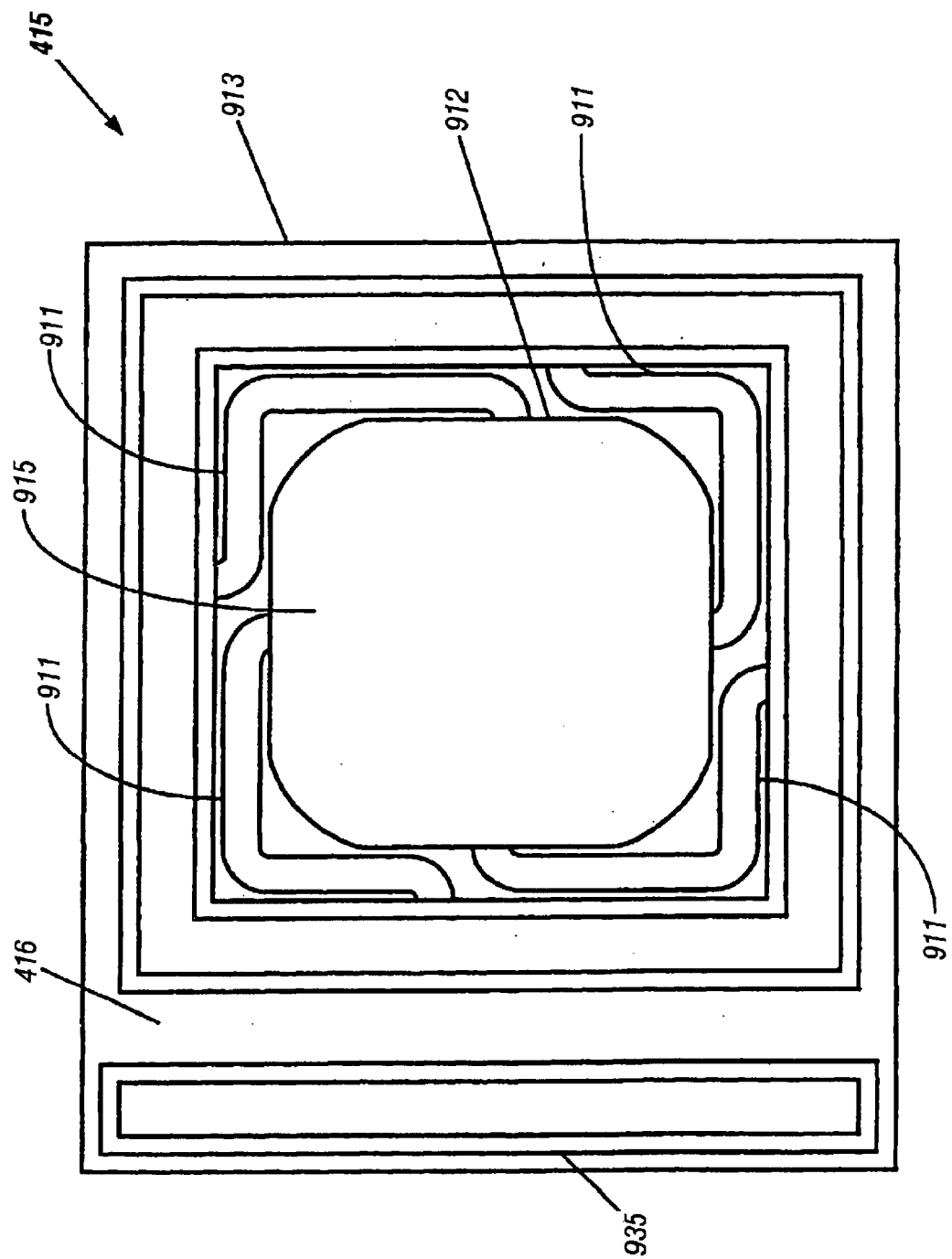
Figure 9F:
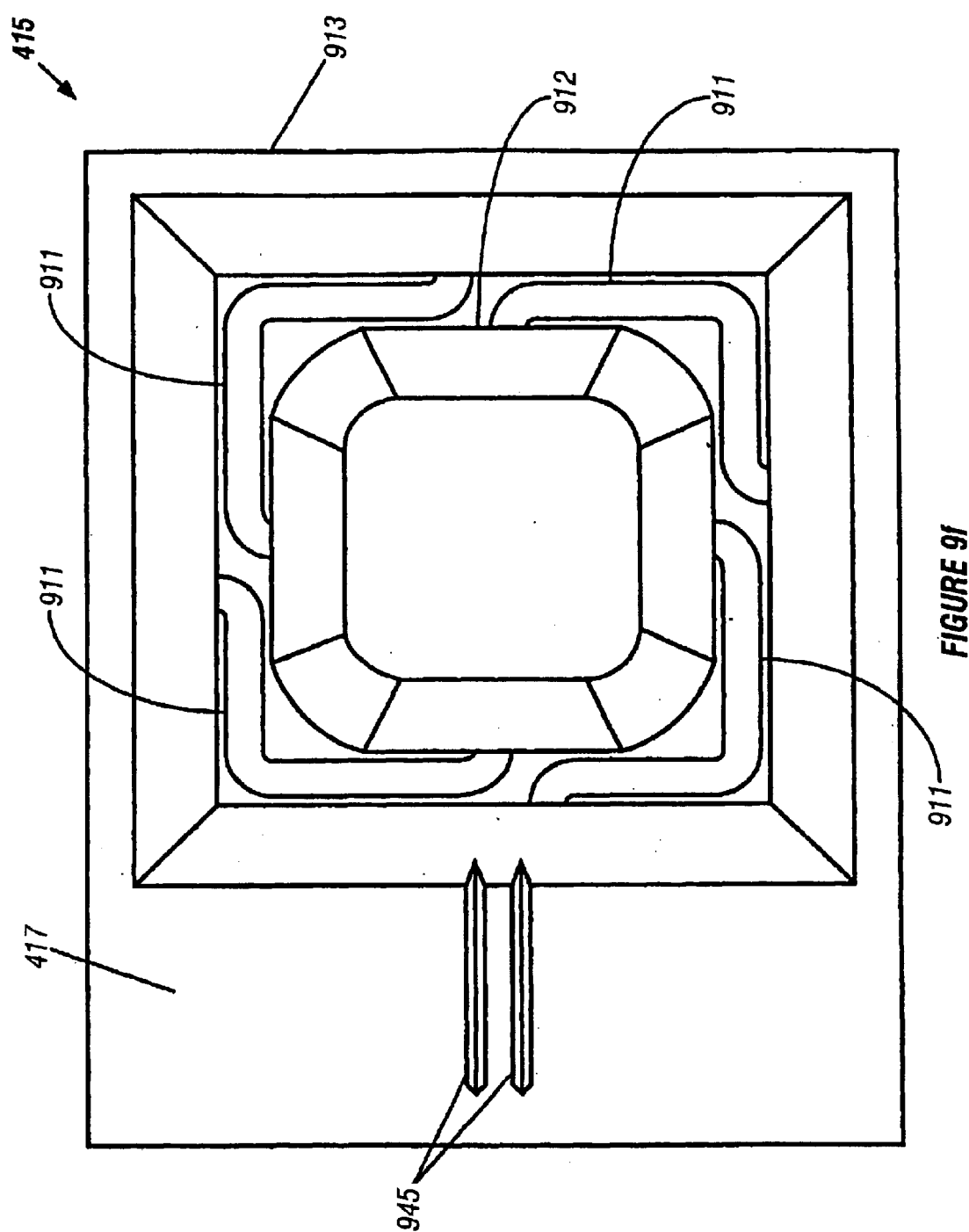
FIG. 9f is a top view of the bottom mass half of FIG. 9e.
Figure 9G:
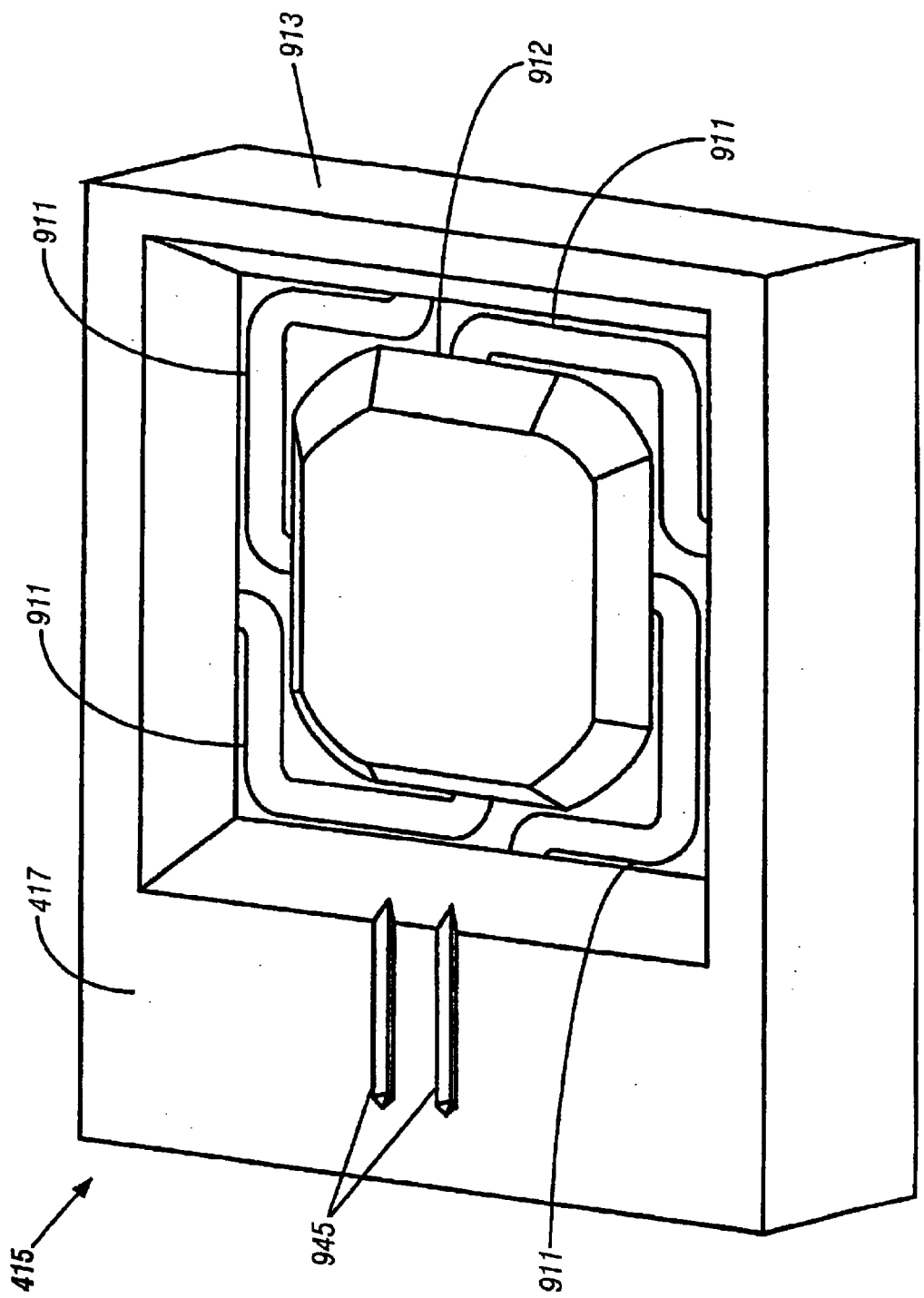
FIG. 9g is a top perspective view of the bottom mass half of FIG. 9e.
Figure 10:
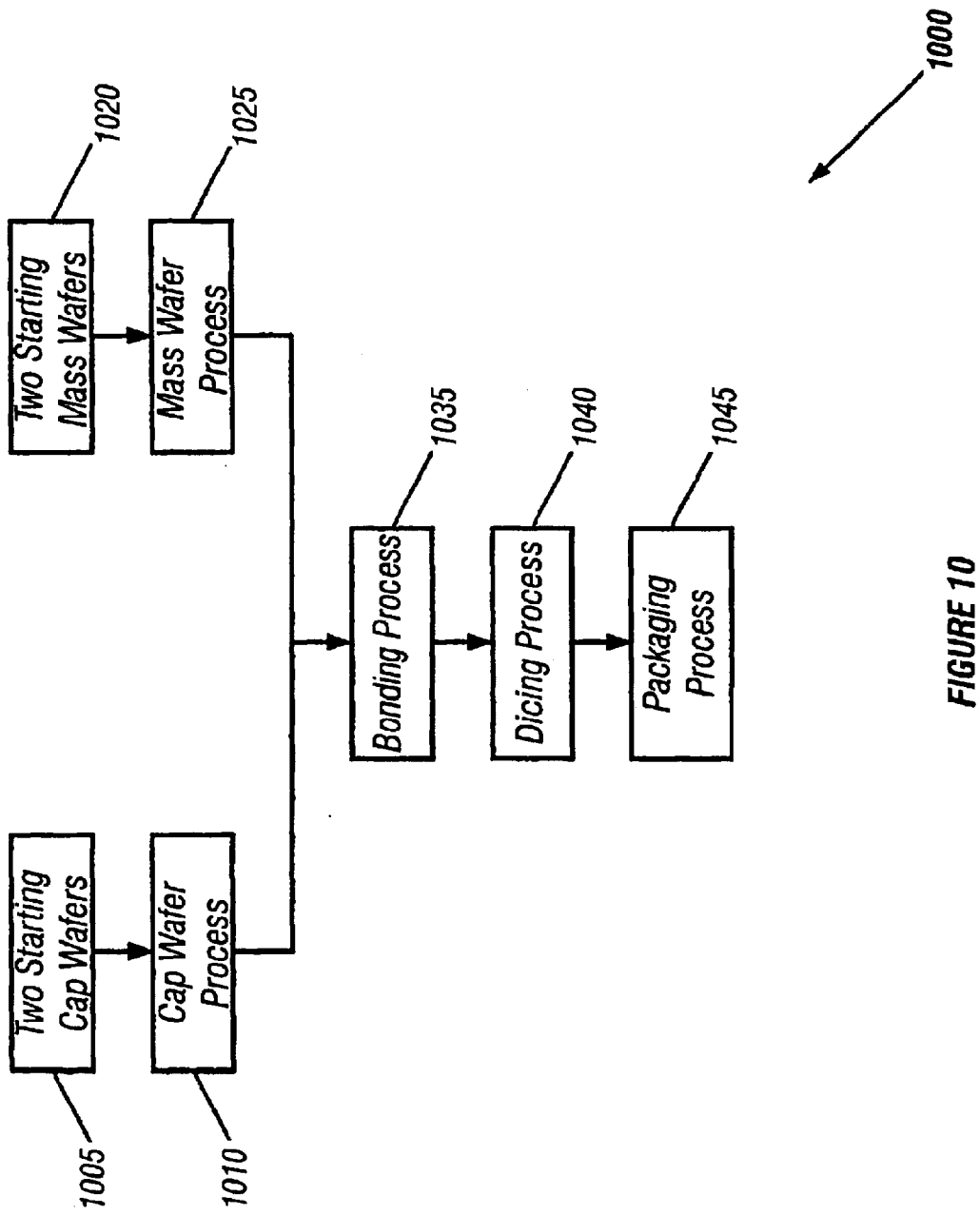
FIG. 10 is a flowchart of a fabrication process for the accelerometer of FIG. 4.

The top measurement mass half 410 may include any number of conventional commercially available materials suitable for creating a measurement mass half. In a preferred embodiment, as illustrated in FIGS. 9a, 9aa, 9ac, 9ad, 9b, 9c, and 9d, the top measurement mass half 410 includes an upper surface 411, a lower surface 412, one or more springs 905, a top measurement mass 906, a housing 907, the metal electrode pattern 910, a bond ring 920, and a top mass contact pad 930. In another preferred embodiment, the top measurement mass half 410 further includes a groove 940.

The springs 905 preferably couple the top measurement mass 906 to the housing 907 and provide a conductive path between the top measurement mass 906 and the housing 907. The springs 905 may be fabricated from any number of conventional commercially available materials suitable for creating springs such as, for example, quartz, metals, or silicon. In a preferred embodiment, the springs 905 are made of silicon, and are micromachined out of the top measurement mass half 410 wafer. The springs 911 are preferably designed to maintain cross-axis rejection while providing lateral shock protection for the top measurement mass 906. The springs 905 are preferably linear L-shaped springs, the design of which is described in U.S. Pat. Nos. 5,652,384 and 5,777,226, the disclosures of which are incorporated herein by reference.

The top measurement mass 906 is used to detect measurement data. The top measurement mass 906 may be used in any application in which its use is suitable. In a preferred embodiment, the top measurement mass 906 is used in seismic applications to detect acceleration. The top measurement mass 906 is preferably coupled to the housing 907 by the springs 905. The top measurement mass 906 may be fabricated from any number of conventional commercially available materials suitable for creating a measurement mass such as, for example, metals, quartz, or silicon. In a preferred embodiment, the top measurement mass 906 is made of silicon, and is micromachined out of the top measurement mass half 410 wafer.

The housing 907 surrounds the top measurement mass 906 and is coupled to the top measurement mass 906 by the springs 905. The housing 907 may be fabricated from any number of conventional commercially available materials suitable for creating a housing such as, for example, metals, quartz, or silicon. In a preferred embodiment, the housing 907 is fabricated from silicon, and is micromachined out of the top measurement mass half 410 wafer.

The metal electrode pattern 910 is used for the time-based multiplexing of electrical signals from an external circuit. In a preferred embodiment, the metal electrode pattern 910 includes a single electrode. In a preferred embodiment, the metal electrode pattern 910 is located on the upper surface 411 of the top measurement mass half 410, on top of the top measurement mass 906. The metal electrode pattern 910 may include any number of conventional commercially available materials suitable for creating an electrode pattern such as, for example, aluminum, silver, or gold. In a preferred embodiment, the metal electrode pattern 910 is fabricated from a combination of gold and titanium. In a preferred embodiment, the combination of gold and titanium includes a layer of gold located on top of a layer of titanium. The layer of titanium preferably improves the adhesion of the gold to silicon and silicon dioxide. In an alternate embodiment, the metal electrode pattern 910 may be fabricated using any number of conductive materials suitable for creating an electrode such as, for example, metals, silicides, or doped semiconductors.

The metal electrode pattern 910 may be of any size or shape suitable for forming an electrode pattern such as, for example, circular, square, or rectangular. The metal electrode pattern 910 is preferably substantially identical in size and shape to the top capacitor electrode 705. In an alternative embodiment, the metal electrode pattern 910 is substantially equal in thickness to the bond ring 920. In a preferred embodiment, the thicknesses of the metal electrode pattern 910 and the bond ring 920 are smaller than the thickness of the top bond ring 707. The difference in thickness between the metal electrode pattern 910, the bond ring 920, and the top bond ring 707 preferably reduces stiction between the top cap overshock bumpers 720 and the metal electrode pattern 910 during the operation of the accelerometer 305 by reducing the imprinting of the top cap overshock bumpers 720 on the metal electrode pattern 910.

In another preferred embodiment, as illustrated in FIG. 9*aa*, the metal electrode pattern 910 includes one or more patterns 960*a* designed to minimize stiction between the top cap overshock bumpers 720 and the metal electrode pattern 910 during the operation of the accelerometer 305. The patterns 960*a* may include any shape suitable for reducing stiction within the accelerometer 305. The patterns 960*a* in the metal electrode pattern 910 preferably reduce stiction between the top cap overshock bumpers 720 and the metal electrode pattern 910 by minimizing the surface area of the region of intimate contact between the top cap overshock bumpers 720 and the metal electrode pattern 910.

In another preferred embodiment, as illustrated in FIG. 9*ac*, the metal electrode pattern 910 includes one or more reduced-thickness recesses 970*a* at areas in which the top cap overshock bumpers 720 come in contact with the metal electrode pattern 910. The reduced-thickness recesses 970*a* in the metal electrode pattern 910 are preferably designed to reduce stiction between the top cap overshock bumpers 720 and the metal electrode pattern 910. The reduced-thickness recesses 970*a* may be formed using any suitable method for forming reduced-thickness recesses in the metal electrode pattern 910. In a preferred embodiment, the reduced-thickness recesses 970*a* are formed by removing the gold layer from the metal electrode pattern 910 to expose the underlying titanium layer. The reduced-thickness recesses 970*a* may have any shape suitable for reducing stiction within the accelerometer 305. In a preferred embodiment, the reduced-thickness recesses 970*a* are wider than the width w1 of the top cap overshock bumpers 720, and are located on the metal electrode pattern 910 at areas in which the top cap overshock bumpers 720 come in contact with the metal electrode pattern 910. The reduced-thickness recesses 970*a* in the metal electrode pattern 910 preferably reduce stiction between the top cap overshock bumpers 720 and the metal electrode pattern 910 by reducing the amount of imprinting in the metal electrode pattern 910 that occurs when the top cap overshock bumpers 720 come in contact with the metal electrode pattern 910.

In another preferred embodiment, as illustrated in FIG. 9*ad*, the metal electrode pattern 910 includes one or more cavities 980*a*. The cavities 980*a* in the metal electrode pattern 910 are preferably designed to eliminate stiction between the top cap overshock bumpers 720 and the metal electrode pattern 910. The cavities 980*a* may be formed using any suitable method for forming cavities in the metal electrode pattern 910. In a preferred embodiment, the cavities 980*a* are formed by selectively removing the gold layer and the titanium layer from the metal electrode pattern 910 to expose the underlying top measurement mass half 410. The cavities 980*a* may have any shape suitable for reducing stiction within the accelerometer 305. In a preferred embodiment, the cavities 980*a* are wider than the width w1 of the top cap overshock bumpers 720, and are located on the metal electrode pattern 910 at areas in which the top cap overshock bumpers 720 come in contact with the metal electrode pattern 910. The cavities 980*a* in the metal electrode pattern 910 preferably reduce stiction between the top cap overshock bumpers 720 and the metal electrode pattern 910 by eliminating imprinting in the metal electrode pattern 910 that occurs when the top cap overshock bumpers 720 come in contact with the metal electrode pattern 910. The operation of the metal electrode pattern 910 is substantially as that described in PCT patent application Ser. No. PCT/US00/40038.

The bond ring 920 facilitates bonding of the top measurement mass half 410 to the top cap wafer 405. The bond ring 920 may include any number of conventional commercially available materials suitable for creating a bond ring such as, for example, gold, aluminum, or silver. In a preferred embodiment, the bond ring 920 is fabricated from a combination of gold and titanium. In a preferred embodiment, the combination of gold and titanium includes a layer of gold located on top of a layer of titanium. The layer of titanium preferably improves the adhesion of the gold to silicon and silicon dioxide. The bond ring 920 is preferably located on the upper surface 411 of the top measurement mass half 410, adjacent to the inner edge of the housing 907.

The top mass contact pad 930 is preferably used to make electrical contact to the top measurement mass half 410. The top mass contact pad 930 may be located anywhere on the upper surface 411 of the housing 907. In a preferred embodiment, the top mass contact pad 930 is located on the outer edge of the upper surface 411 of the housing 907, away from the metal electrode pattern 910. The top mass contact pad 930 may be fabricated from any materials suitable for creating a contact pad such as, for example, silver, aluminum, or gold. In a preferred embodiment, the top mass contact pad 930 is made of a combination of gold and titanium. In a preferred embodiment, the combination of gold and titanium includes a layer of gold located on top of a layer of titanium. The layer of titanium preferably improves the adhesion of the gold to silicon and silicon dioxide. The top mass contact pad 930 may include any dimensions suitable for creating a contact pad. In a preferred embodiment, the top mass contact pad 930 is sufficiently large for enabling a conventional wire bond.

The groove 940 is preferably located on the lower surface 412 of the housing 907 and extends from the outer edge of the housing 907 to the inner edge of the housing 907.

The groove 940 preferably forms a passage 950 when the top measurement mass half 410 is bonded to the bottom measurement mass half 415. The passage 950 is preferably used to remove air from a cavity within the accelerometer 305, creating a vacuum or a low-pressure environment within the accelerometer 305 when the accelerometer 305 is sealed within a vacuum package. The groove 940 may be shaped in any way suitable for creating a passage for venting air. In a preferred embodiment, the groove 940 is V-shaped. In a preferred embodiment, the groove 940 is designed to allow for the fluidic flow of air from within the accelerometer 305 during a vacuum pump-down. The top measurement mass half 410 may include any number of grooves 940. In a preferred embodiment, the top measurement mass half 410 includes two grooves 940. In an alternative embodiment, the top measurement mass half 410 includes one groove 940. In an alternative embodiment, the top measurement mass half 410 includes a plurality of grooves 940. In an alternative embodiment, the top measurement mass half 410 includes no groove 940. The shape of the groove 940 may be affected by any number of factors. In a preferred embodiment, the groove 940 is designed to achieve an optimal pumpdown time for air passing through the passage 950. The conductance of air through the passage 950 is preferably given by:

$$C = \frac{8}{3\sqrt{\pi}} \left(\frac{2kT}{m}\right)^{1/2} \left(\frac{A^2}{BL}\right) \quad (1)$$

where:
- C=the conductance of the passage 950,
- k=Boltzman's constant,
- T=absolute temperature,
- m=mass of gas atom,
- A=cross-sectional area of the passage 950,
- B=periphery of the cross-sectional area of the passage 950, and
- L=the length of the passage 950.

The dimensions of the passage 950, such as the length L, the cross-sectional area A, and the periphery B, are preferably designed to optimize the conductance of air through the passage 950. In a preferred embodiment, the optimal conductance C through the passage 950 produces an optimal pumpdown time for removing air from within the accelerometer 305. The pumpdown time is the amount of time it takes to remove enough air from within the accelerometer 305 to achieve the desired pressure within the accelerometer 305. The pumpdown time is preferably given by:

$$t \approx \left(\frac{V}{S}\right)[1 - S/C] \ln\left(\frac{Pi - Pu}{P - Pu}\right) \quad (2)$$

where:
- t=pumpdown time,
- V=volume of the internal cavities within the accelerometer 305,
- S=speed of a vacuum pump used to remove air from the accelerometer 305,
- C=conductance of the passage 950 from equation (1),
- Pi=initial pressure within the accelerometer 305 (typically 1 atm),
- P=desired pressure within the accelerometer 305,
- Pu=(1+S/C)*Po, and
- Po=lowest pressure of the pump.

The bottom measurement mass half 415 may be fabricated from any number of conventional commercially available materials suitable for creating a measurement half. In a preferred embodiment, as illustrated in FIGS. 9a, 9ab, 9ac, 9ad, 9e, 9f, and 9g, the bottom measurement mass half 415 includes an upper surface 417, a lower surface 416, one or more springs 911, a bottom measurement mass 912, a housing 913, the metal electrode pattern 915, a bond ring 925, a bottom mass contact pad 935, and a groove 945.

The springs 911 preferably couple the bottom measurement mass 912 to the housing 913 and provide a conductive path between the bottom measurement mass 912 and the housing 913. The springs 911 may be fabricated from any number of conventional commercially available materials suitable for creating springs such as, for example, metals, quartz, polysilicon, or silicon. In a preferred embodiment, the springs 911 are made of silicon, and are micromachined out of the bottom measurement mass half 415 wafer. The springs 911 are preferably designed to maintain cross-axis rejection while providing lateral shock protection for the bottom measurement mass 912. The springs 911 are preferably linear L-shaped springs, the design of which is described in U.S. Pat. Nos. 5,652,384 and 5,777,226, the disclosures of which are incorporated herein by reference.

The bottom measurement mass 912 is used to detect measurement data. The bottom measurement mass 912 may be used in any application in which its use is suitable. In a preferred embodiment, the bottom measurement mass 912 is used in seismic applications to detect acceleration forces. The bottom measurement mass 912 is preferably coupled to the housing 913 by the springs 911. The bottom measurement mass 912 may be fabricated from any material suitable for creating a measurement mass such as, for example, silicon or quartz. In a preferred embodiment, the bottom measurement mass 912 is made of silicon, and is micromachined out of the bottom measurement mass half 415 wafer.

The housing 913 surrounds the bottom measurement mass 912 and is coupled to the bottom measurement mass 912 by the springs 911. The housing 913 may be fabricated from any material suitable for creating a housing such as, for example, quartz or silicon. In a preferred embodiment, the housing 913 is fabricated from silicon, and is micromachined out of the bottom measurement mass half 415 wafer.

The metal electrode pattern 915 is used for the time-based multiplexing of electrical signals from an external circuit. In a preferred embodiment, the metal electrode pattern 915 includes a single electrode. In a preferred embodiment, the metal electrode pattern 915 is located on the lower surface 416 of the bottom measurement mass half 415, on a surface of the bottom measurement mass 912. The metal electrode pattern 915 may include any number of conventional commercially available materials suitable for creating an electrode pattern such as, for example, silver, aluminum, or gold. In a preferred embodiment, the metal electrode pattern 915 is made of a combination of gold and titanium. In a preferred embodiment, the combination of gold and titanium includes a layer of gold located on top of a layer of titanium. The layer of titanium preferably improves the adhesion of the gold to silicon and silicon dioxide. In an alternate embodiment, the metal electrode pattern 915 may be fabricated using any number of conductive materials suitable for creating an electrode such as, for example, metals, silicides, or doped semiconductors.

The metal electrode pattern 915 may be of any size or shape suitable for forming an electrode pattern such as, for example, circular, square, or rectangular. The metal electrode pattern 915 is preferably identical in size and shape to the bottom capacitor electrode 805. In a preferred embodiment, the metal electrode pattern 915 is substantially equal in thickness to the bond ring 925. In a preferred embodiment, the thicknesses of the metal electrode pattern 915 and the bond ring 925 are smaller than the thickness of the bottom bond ring 807. The differences in thickness between the metal electrode pattern 915, the bond ring 925, and the bottom bond ring 807 preferably reduces stiction between the bottom cap overshock bumpers 820 and the metal electrode pattern 915 during the operation of the accelerometer 305 by reducing the imprinting of the bottom cap overshock bumpers 820 on the metal electrode pattern 915.

In another preferred embodiment, as illustrated in FIG. 9ab, the metal electrode pattern 915 includes one or more patterns 960b designed to minimize stiction between the bottom cap overshock bumpers 820 and the metal electrode pattern 915 during the operation of the accelerometer 305. The patterns 960b in the metal electrode pattern 915 preferably reduce stiction between the bottom cap overshock bumpers 820 and the metal electrode pattern 915 by minimizing the surface area of the region of intimate contact between the bottom cap overshock bumpers 820 and the metal electrode pattern 915.

In another preferred embodiment, as illustrated in FIG. 9ac, the metal electrode pattern 915 includes one or more reduced-thickness recesses 970b at areas in which the bottom cap overshock bumpers 820 come in contact with the metal electrode pattern 915. The reduced-thickness recesses 970b in the metal electrode pattern 915 are preferably designed to reduce stiction between the bottom cap overshock bumpers 820 and the metal electrode pattern 915. The reduced-thickness recesses 970b may be formed using any suitable method for forming reduced-thickness recesses in the metal electrode pattern 915. In a preferred embodiment, the reduced-thickness recesses 970b are formed by removing the gold layer from the metal electrode pattern 915 to expose the underlying titanium layer. The reduced-thickness recesses 970b may have any shape suitable for reducing stiction within the accelerometer 305. In a preferred embodiment, the reduced-thickness recesses 970b are wider than the width w2 of the bottom cap overshock bumpers 820, and are located on the metal electrode pattern 915 at areas in which the bottom cap overshock bumpers 820 come in contact with the metal electrode pattern 915. The reduced-thickness recesses 970b preferably reduce stiction between the bottom cap overshock bumpers 820 and the metal electrode pattern 915 by reducing the amount of imprinting in the metal electrode pattern 915 that occurs when the bottom cap overshock bumpers 820 come in contact with the metal electrode pattern 915.

In another preferred embodiment, as illustrated in FIG. 9ad, the metal electrode pattern 915 includes one or more cavities 980b. The cavities 980b in the metal electrode pattern 915 are preferably designed to eliminate stiction between the bottom cap overshock bumpers 820 and the metal electrode pattern 915. The cavities 980b may be formed using any suitable method for forming cavities in the metal electrode pattern 915. In a preferred embodiment, the cavities 980b are formed by selectively removing the gold layer and the titanium layer from the metal electrode pattern 915 to expose the underlying bottom measurement mass half 415. The cavities 980b may have any shape suitable for reducing stiction within the accelerometer 305. In a preferred embodiment, the cavities 980b are wider than the width w2 of the bottom cap overshock bumpers 820, and are located on the metal electrode pattern 915 at areas in which the bottom cap overshock bumpers 820 come in contact with the metal electrode pattern 915. The cavities 980b preferably reduce stiction between the bottom cap overshock bumpers 820 and the metal electrode pattern 915 by eliminating imprinting in the metal electrode pattern 915 that occurs when the bottom cap overshock bumpers 820 come in contact with the metal electrode pattern 915. The operation of the metal electrode pattern 915 is substantially as that described in PCT patent application Ser. No. PCT/US00/40038.

The bond ring 925 preferably facilitates bonding of the bottom measurement mass half 415 to the bottom cap wafer 420. The bond ring 925 may include any number of conventional commercially available materials suitable for creating a bond ring such as, for example, gold, aluminum, or silver. In a preferred embodiment, the bond ring 925 is made of a combination of gold and titanium. In a preferred embodiment, the combination of gold and titanium includes a layer of gold located on top of a layer of titanium. The layer of titanium preferably improves the adhesion of the gold to silicon and silicon dioxide. The bond ring 925 is preferably located on the lower surface 416 of the bottom measurement mass half 415, adjacent to the inner edge of the housing 913.

The bottom mass contact pad 935 is preferably used to create an electrical contact to the bottom measurement mass half 415. The bottom mass contact pad 935 may be located anywhere on the lower surface 416 of the housing 913. In a preferred embodiment, the bottom mass contact pad 935 is located on the outer edge of the lower surface 416 of the housing 913, away from the metal electrode pattern 915. The bottom mass contact pad 935 may include any number of conventional commercially available materials suitable for creating a contact pad such as, for example, aluminum, silver, or gold. In a preferred embodiment, the bottom mass contact pad 935 is made of a combination of gold and titanium. In a preferred embodiment, the combination of gold and titanium includes a layer of gold located on top of a layer of titanium. The layer of titanium preferably improves the adhesion of the gold to silicon and silicon dioxide. The bottom mass contact pad 935 may include any dimensions suitable for a contact pad. In a preferred embodiment, the bottom mass contact pad 935 is sufficiently large for enabling conventional wire bonding.

The groove 945 forms a passage 950 when the bottom measurement mass half 415 is bonded to the top measurement mass half 410. The passage 950 is preferably used to remove air from a cavity within the accelerometer 305, creating a vacuum within the accelerometer 305 when the accelerometer 305 is sealed within a vacuum package. The groove 945 may be shaped in any way suitable for creating a passage for venting air. In a preferred embodiment, the groove 945 is V-shaped. In a preferred embodiment, the groove 945 is designed to allow for the fluidic flow of air from within the accelerometer 305 during a vacuum pump down. The shape of the groove 945 is preferably substantially identical to the shape of the groove 940, as described above. The groove 945 is preferably located on the upper surface 417 of the housing 913 and extends from the outer edge of the housing 913 to the inner edge of the housing 913. The bottom measurement mass half 415 may include any number of grooves 945. In a preferred embodiment, the bottom measurement mass half 415 includes two grooves 945. In an alternative embodiment, the bottom measurement mass half 415 includes one groove 945. In an alternative embodiment, the bottom measurement mass half 415 includes a plurality of grooves 945. In an alternative embodiment, the bottom measurement mass half 415 includes no groove 945.

Referring to FIGS. 10, 11a, 11b, 11c, 11d, 11e, 11f, 11g, 11h, 11ha, 11hb, 11hc, 11hd, 11he, 11hf, 11hg, 11hh, 11hi, 11hj, 11i, 11j, 12a, 12b, 12c, and 13, a method 1000 of fabricating the accelerometer 305 will now be described. In a preferred embodiment, the method 1000 of fabricating the accelerometer 305 includes: acquiring two starting cap wafers in step 1005, shaping the two starting wafers using a cap wafer process in step 1010, acquiring two starting mass wafers in step 1020, shaping the two starting mass wafers using a mass wafer process in step 1025, bonding the wafers to form the accelerometer 305 using a bonding process in step 1035, making dicing cuts on the accelerometer 305 in step 1040, and packaging the accelerometer 305 in step 1045.

Figure 11A:
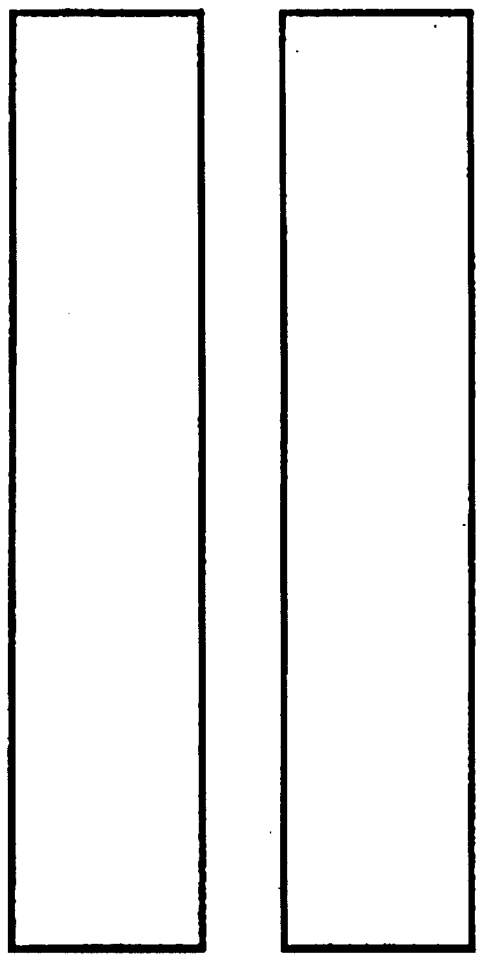
FIG. 11a illustrates an embodiment of the two starting cap wafers of FIG. 10.

As illustrated in FIG. 11a, in step 1005 the two starting cap wafers 1105a and 1105b are fabricated. In a preferred embodiment, the two starting cap wafers 1150a and 1105b are identically sized and shaped. The starting cap wafers 1105a and 1105b may be fabricated from any number of conventional commercially available materials. In a preferred embodiment, the starting cap wafers 1105a and 1105b are made of silicon.

Figure 11B:
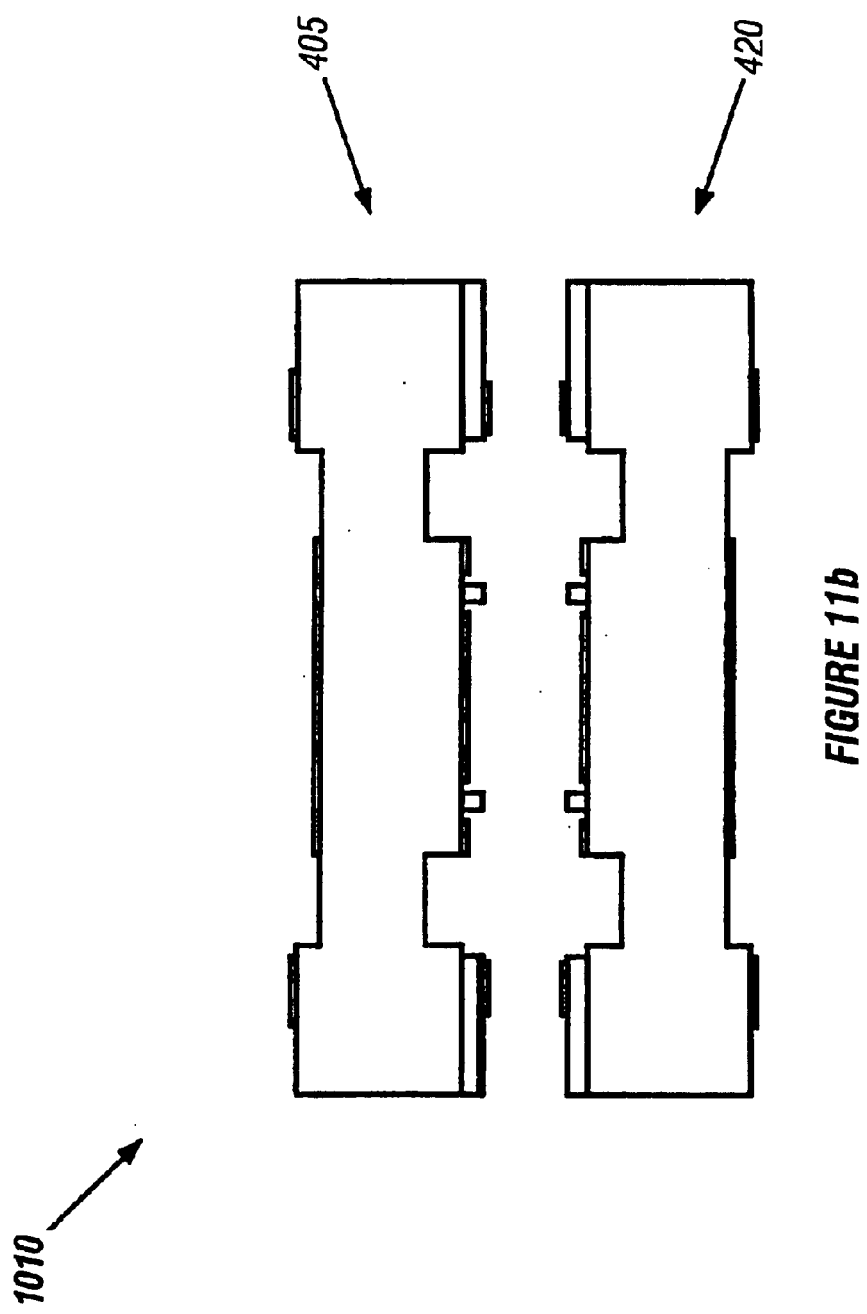
FIG. 11b illustrates a cross-sectional view of a top cap wafer and a bottom cap wafer resulting from the cap wafer process of FIG. 10.

As illustrated in FIG. 11b, in step 1010 the two starting cap wafers 1105a and 1105b undergo a cap wafer process. In a preferred embodiment, the cap wafer process transforms the starting cap wafers 1105a and 1105b into the top cap wafer 405 and the bottom cap wafer 420, respectively. In an alternative embodiment, the cap wafer process includes a merged mask micro-machining process substantially as disclosed in one or more of the following: U.S. patent application Ser. No. 09/352,835, filed on Jul. 13, 1999, and U.S. patent application Ser. No. 09/352,025, filed on Jul. 13, 1999, the disclosures of which are incorporated herein by reference.

Figure 11C:
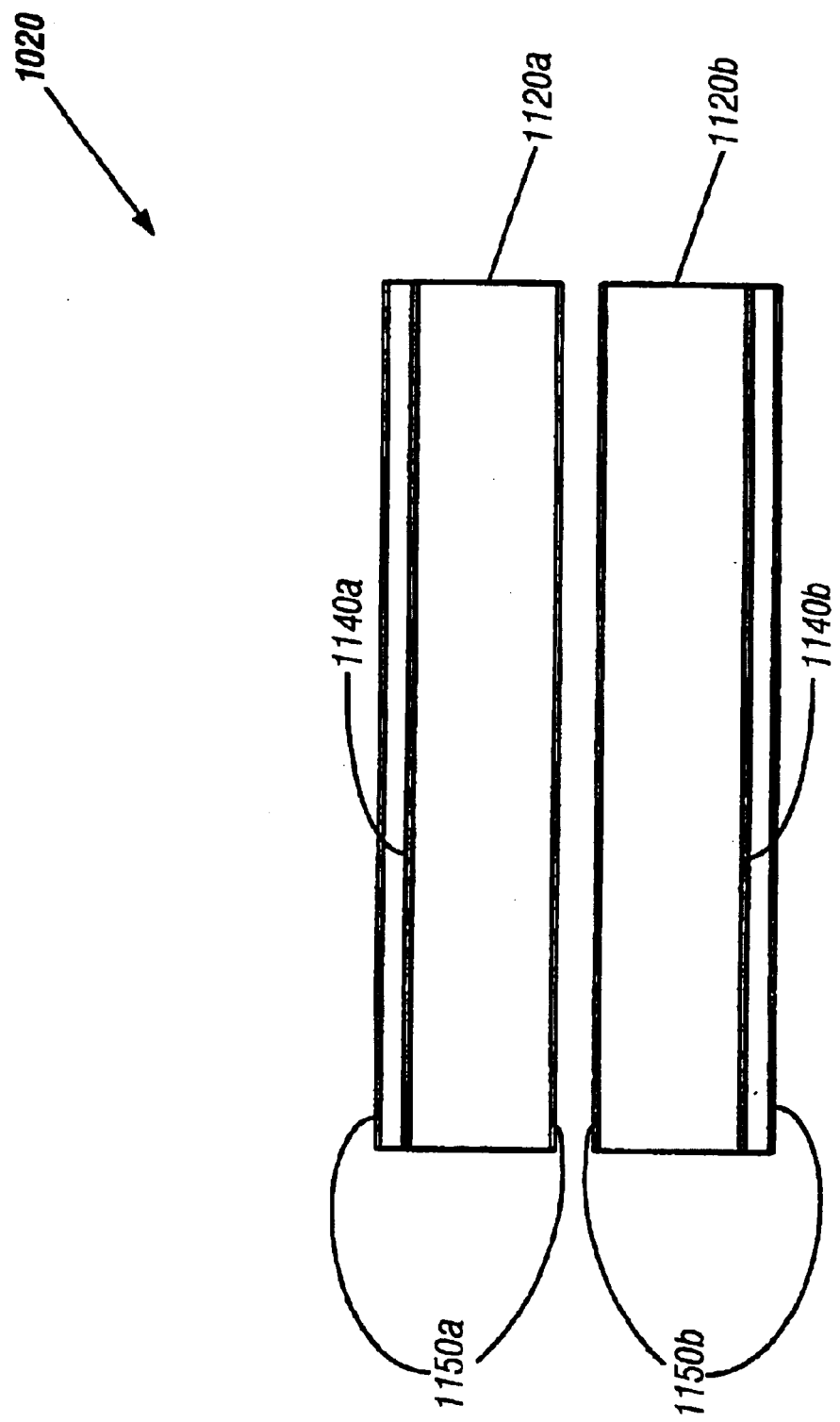
FIG. 11c illustrates an embodiment of the starting mass wafers of FIG. 10.

As illustrated in FIG. 11c, in step 1020 the two starting mass wafers 1120a and 1120b are fabricated. In a preferred embodiment, the two starting mass wafers 1120a and 1120b are identically sized and shaped. The starting mass wafers 1120a and 1120b may be fabricated from any number of conventional commercially available materials. In a preferred embodiment, the starting mass wafers 1120a and 1120b are made of silicon. In a preferred embodiment, each of the starting mass wafers 1120a and 1120b includes an etch-stop layer 1140a and 1140b, respectively. In a preferred embodiment, each of the starting mass wafers 1120a and 1120b includes an etch-masking layer 1150a and 1150b, respectively.

As illustrated in FIGS. 11d, 11e, 11f, 11g, 11h, 11ha, 11hb, 11hc, 11hd, 11he, 11hf, 11hg, 11hh, 11hi, 11hj and 11i, in step 1025 the two starting mass wafers 1120a and 1120b undergo a mass wafer process that transforms the two starting mass wafers 1120a and 1120b into the top measurement mass half 410 and the bottom measurement mass half 415, respectively. In a preferred embodiment, the mass wafer process is substantially as that described in U.S. Pat. No. 5,484,073, the disclosure of which is incorporated herein by reference. In an alternative embodiment, the mass wafer process includes a merged mask micromachining process substantially as disclosed in U.S. patent application Ser. No. 09/352,835, filed on Jul. 13, 1999, and U.S. patent application Ser. No. 09/352,025, filed on Jul. 13, 1999, the disclosures of which are incorporated herein by reference.

Figure 11D:
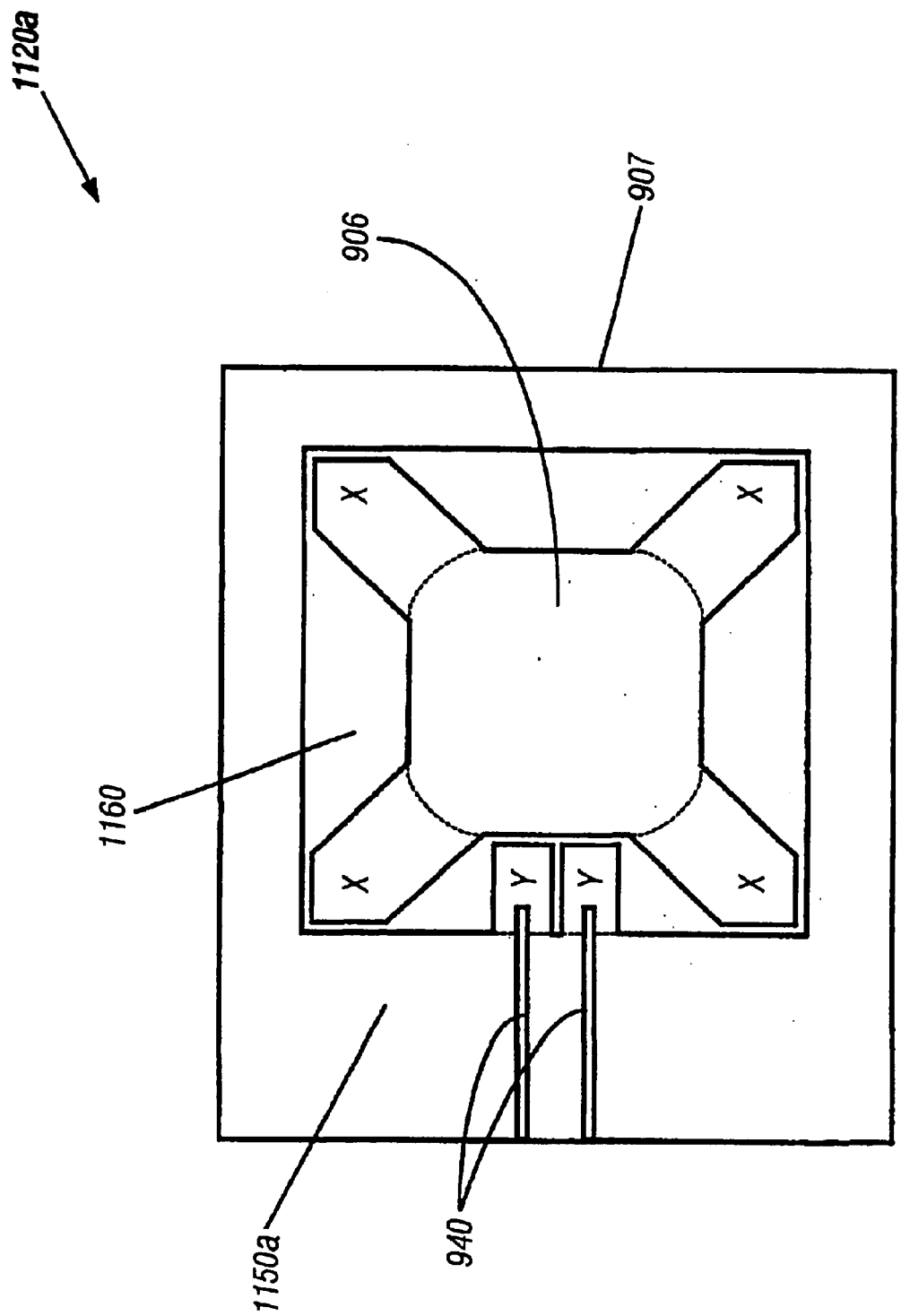
FIG. 11d illustrates a top view of an embodiment of a photomask outline including corner compensation structures applied to the starting mass wafers during the mass wafer process of FIG. 10.

As illustrated in FIG. 11d, the mass wafer process of step 1025 begins by photolithigraphically patterning the etch-masking layer 1150a to create an area of exposure 1160 on the etch-masking layer 1150a. In a preferred embodiment, the etch-masking layer 1150a is photolithigraphically patterned to create the area of exposure 1160 in the shape of the top measurement mass 906, the housing 907, and the grooves 940. In a preferred embodiment, the photolithigraphically patterned area of exposure 1160 includes corner compensation structures X and Y.

Figure 11E:
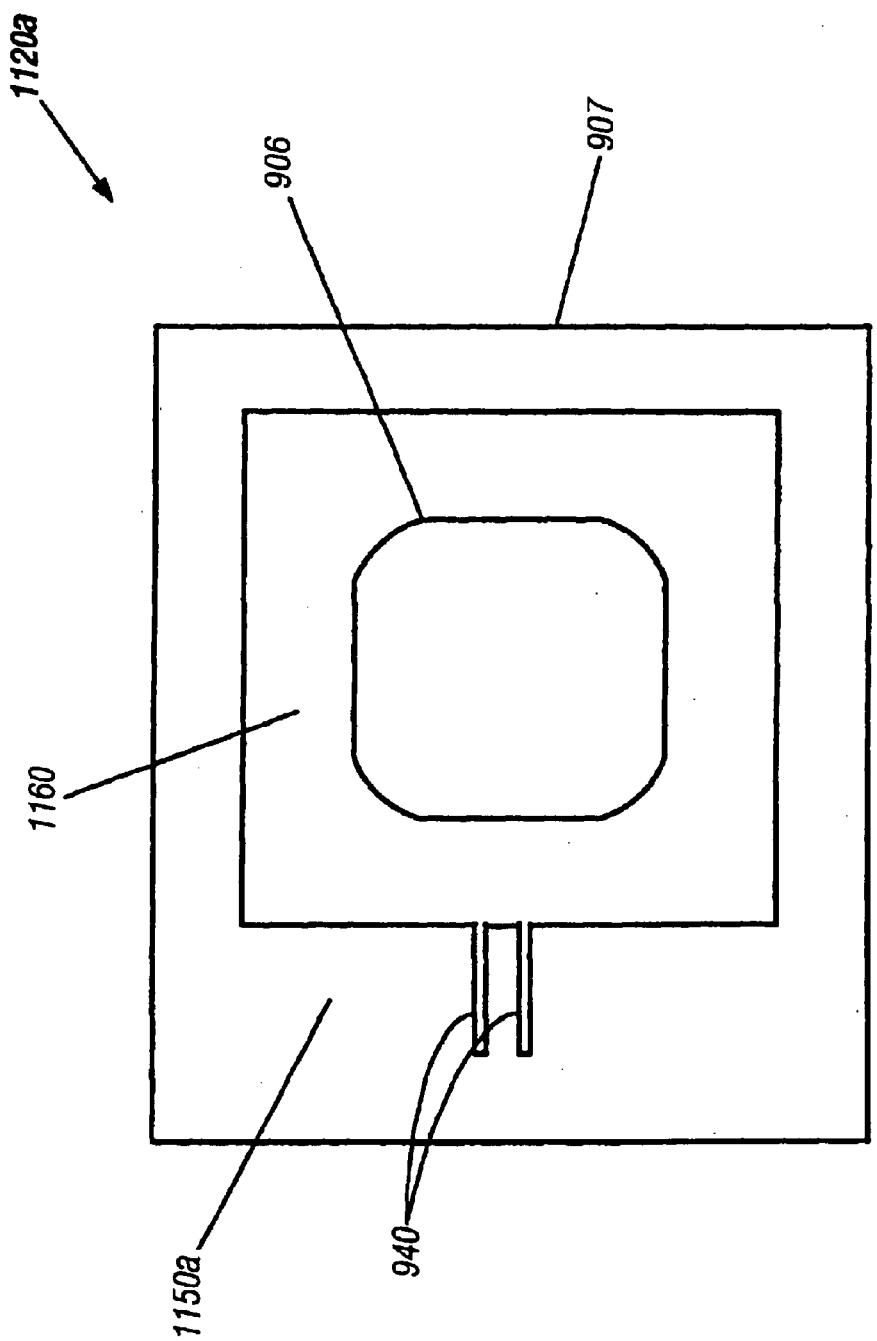
FIG. 11e illustrates a bottom view of the top starting mass wafer after an etching phase of the mass wafer process of FIG. 10.
Figure 11T:
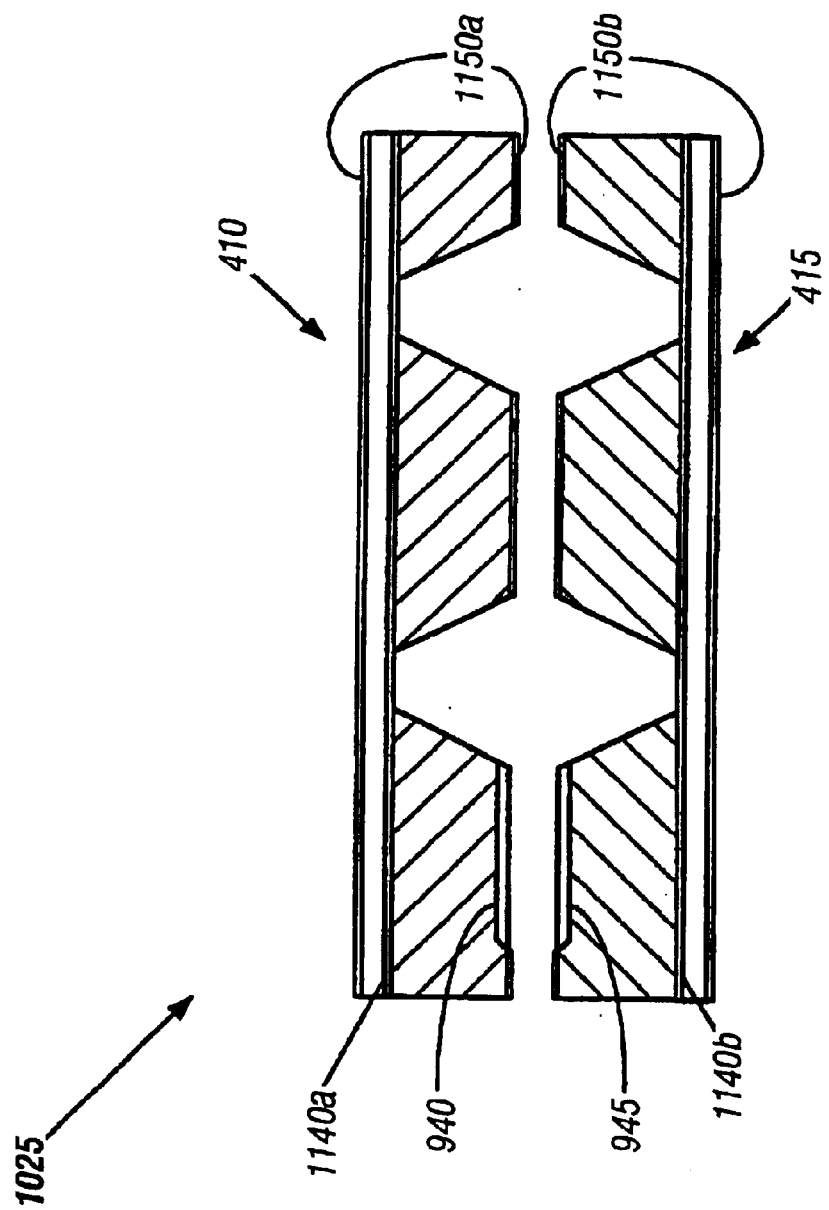
FIG. 11f illustrates a cross-sectional view of the top starting mass wafer and the bottom starting mass wafer after an etching phase of the mass wafer process of FIG. 10.
FIG. 11g illustrates a cross-sectional view of a bonded mass wafer pair during the mass wafer process of FIG. 10.
FIG. 11h illustrates a cross-sectional view of the bonded mass wafer pair of FIG. 11g including electrodes and bond rings.
FIG. 11i illustrates a cross-sectional view of the bonded mass wafer pair of FIG. 11h including springs.
FIG. 11j illustrates a cross-sectional view of an accelerometer after the bonding process of FIG. 10.

In a preferred embodiment, as illustrated in FIG. 11e, an etching process is performed to shape the starting mass wafer 1120a into the top measurement mass half 410. The etching process may include any number of conventional commercially available processes suitable for etching. In a preferred embodiment, the etching process begins by removing the etch-masking layer 1150a from the starting mass wafer 1120 within the area of exposure 1160. The etch-masking layer 1150a may be removed using any suitable process for removing an etch-masking layer, such as, for example, plasma etching. In a preferred embodiment, the etch-masking layer 1150a is removed from the starting mass wafer 1120a within the area of exposure 1160 by using an etchant. In a preferred embodiment, removal of the etch-masking layer 1150a exposes the material from which the starting mass wafer 1120a is fabricated. In a preferred embodiment, the material from which the starting mass wafer 1120a is fabricated is silicon. In a preferred embodiment, the corner compensation structures X prevent the etchant from attacking and corroding convex corners within the area of exposure 1160. The corner structures Y preferably allow the grooves 940 to be simultaneously formed during the etching process used to define the measurement mass 906 and the housing 907. In a preferred embodiment, the corner compensation structures Y reduce etchant-induced corner erosion at an intersection between the grooves 940 and the area of exposure 1160.

In a preferred embodiment, a wet etching chemical is then applied to the exposed silicon on the starting mass wafer 1120a. The wet etching chemical may be any number of conventional commercially available wet etching chemicals suitable for etching silicon. In a preferred embodiment, the wet etching chemical is potassium hydroxide (KOH). The KOH preferably controllably etches through the silicon and terminates at the etch-stop layer 1140a of the starting mass wafer 1120a. In a preferred embodiment, as illustrated in FIG. 11f, the KOH etches the starting mass wafer 1120a into the shape of the top measurement mass 406, the housing 407, and the groove 940. In a preferred embodiment, the etch-stop layer 1140a remains on the backside surface of the springs 905 after the wet chemical etching process has been completed. In an alternative embodiment, the etch-stop layer 1140a is removed from the springs 905 during the wet chemical etching process.

Following the wet etching process, the remaining etch-masking layer 1150a on the starting mass wafer 1120a is removed from the starting mass wafer 1120a using a standard wet etchant.

An identical etching process is preferably used on the second starting mass wafer 1120b to shape the second starting mass wafer 1120b into the bottom measurement mass half 415.

Figure 11G:
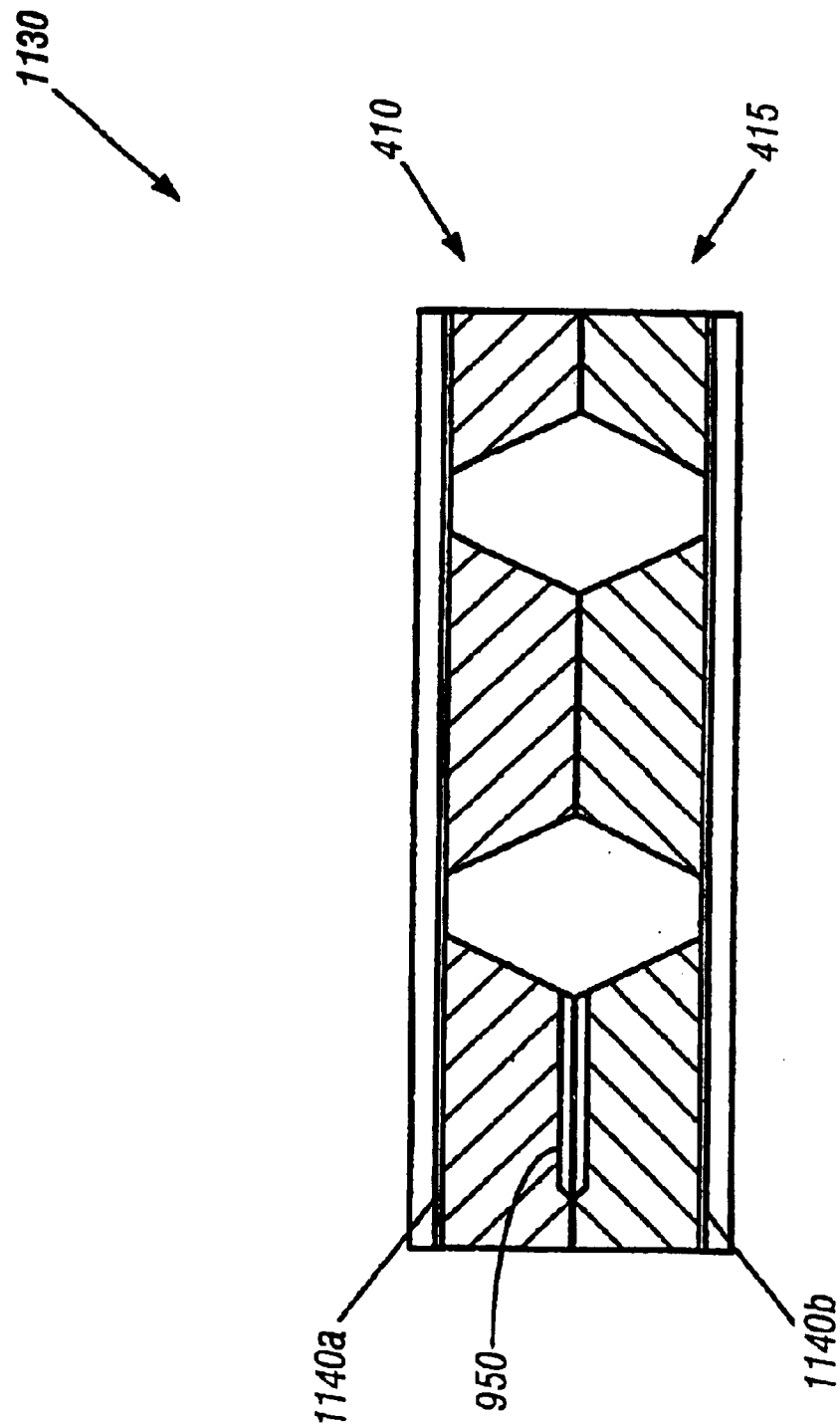

In a preferred embodiment, as illustrated in FIG. 11g, the top measurement mass half 410 and the bottom measurement mass half 415 are bonded together to form a mass wafer pair 1130. The wafer bonding process may be any number of bonding processes suitable for bonding the top measurement mass half 410 and the bottom measurement mass half 415. In a preferred embodiment, the wafer bonding process is a fusion bonding process. In a preferred embodiment, the groove 940 in the top measurement mass half 410 is aligned with the groove 945 in the bottom measurement mass half 415 during the wafer bonding process to form the passage 950.

In a preferred embodiment, a metal layer 1142 is deposited onto the upper surface of the mass wafer pair 1150, which corresponds to the upper surface 411 of the top measurement mass half 410. Additionally, a metal layer 1143 is deposited onto the lower surface of the mass wafer pair 1130, which corresponds to the lower surface 416 of the bottom measurement mass half 415. The metal layers 1142 and 1143 may include any number of conventional commercially available materials suitable for creating a metal layer such as, for example, aluminum, silver, or gold. In a preferred embodiment, the metal layers 1142 and 1143 are fabricated from a combination of gold and titanium. In a preferred embodiment, the combination of gold and titanium includes a layer of gold located on top of a layer of titanium. The layer of titanium preferably improves the adhesion of the gold to silicon and silicon dioxide. The metal layers 1142 and 1143 are preferably patterned using an etch-masking layer. The etch-masking layer may be any etch-masking layer suitable for patterning metal layers. In a preferred embodiment, the etch-masking layer is photoresist. The metal layers 1142 and 1143 may be shaped into any pattern suitable for use within the accelerometer 305. In a preferred embodiment, as illustrated in FIG. 1h, the metal layer 1142 on the upper surface of the mass wafer pair 1130 is shaped to form the metal electrode pattern 910, the bond ring 920, and the top mass contact pad 930. In a preferred embodiment, as illustrated in FIG. 11h, the metal layer 1143 on the lower surface of the mass wafer pair 1130 is shaped to form the metal electrode pattern 915, the bond ring 925, and the bottom mass contact pad 935.

Figure 11H:
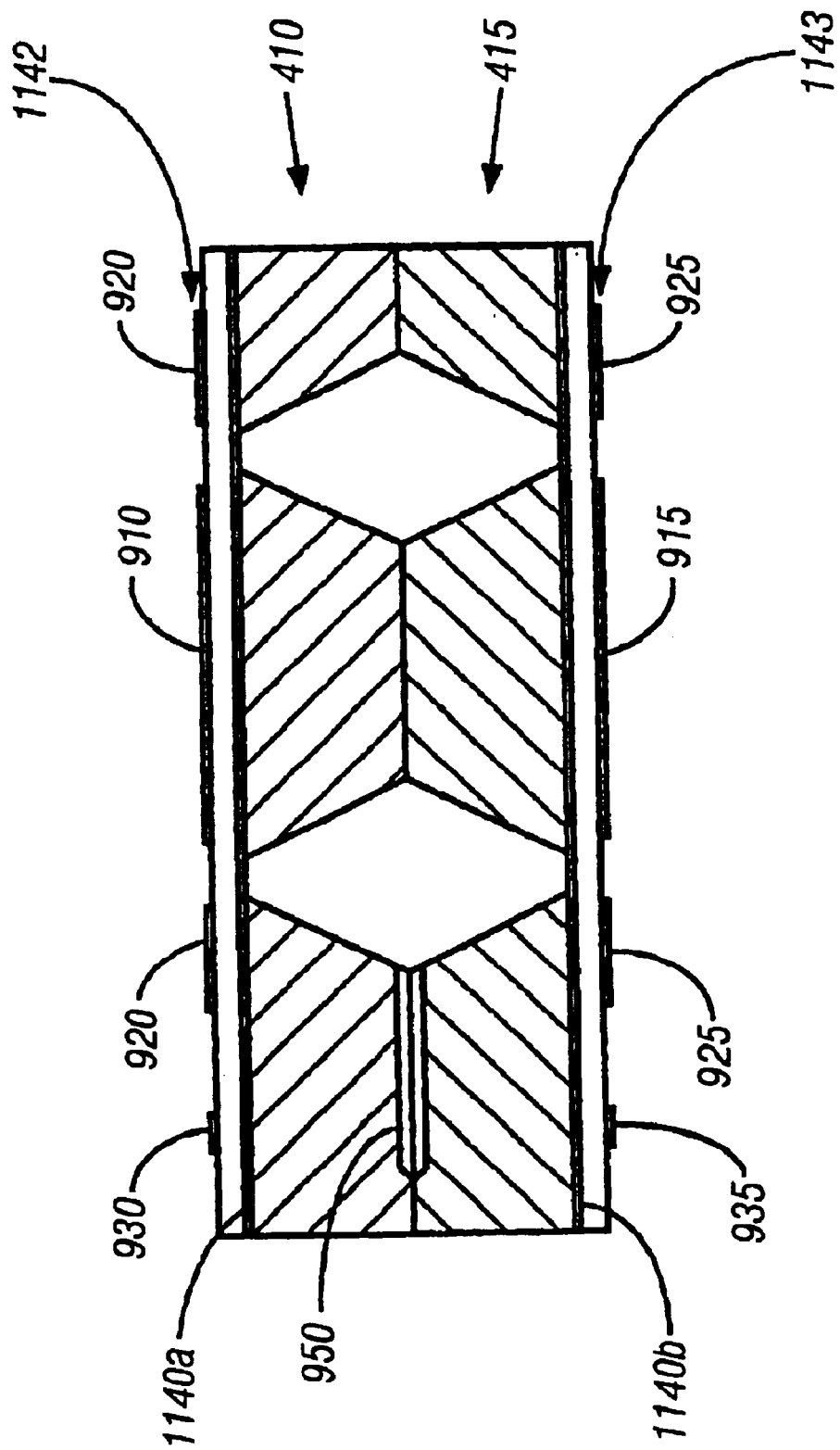
Figure 11H:
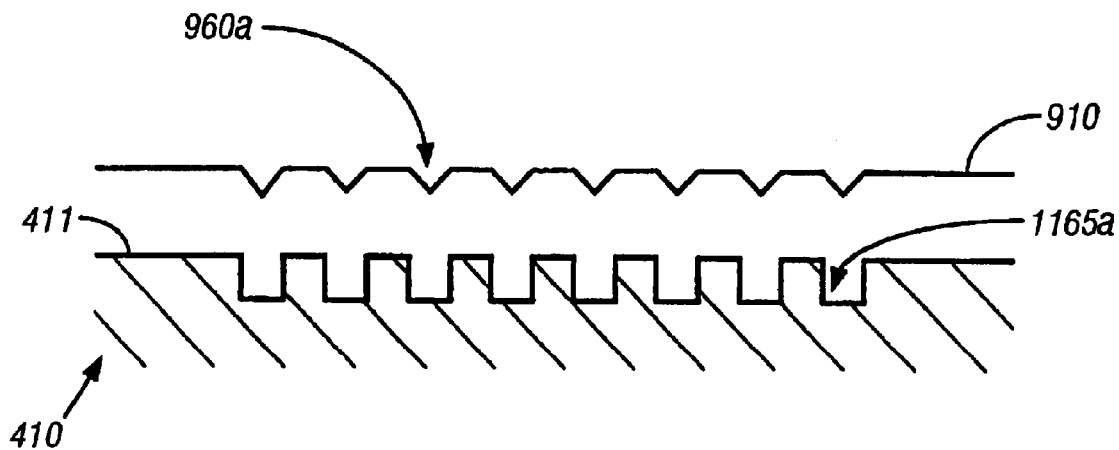
Figure 11H:
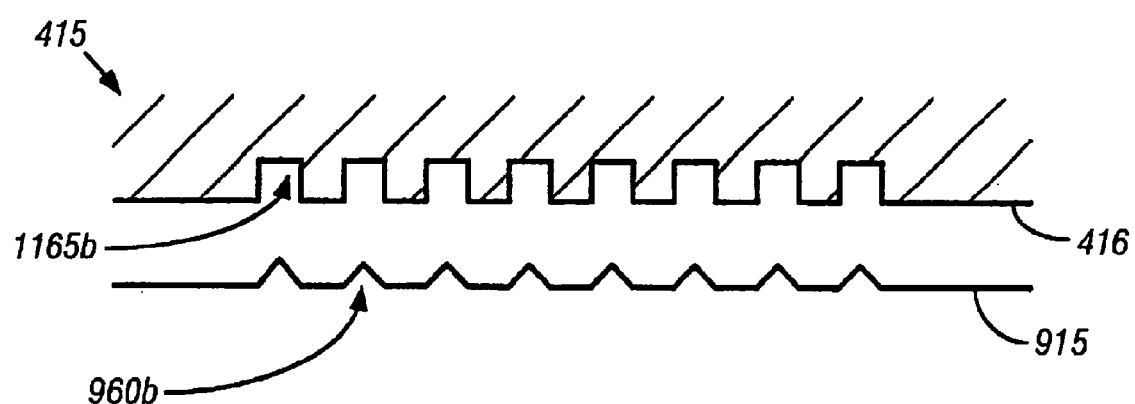
Figure 11H:
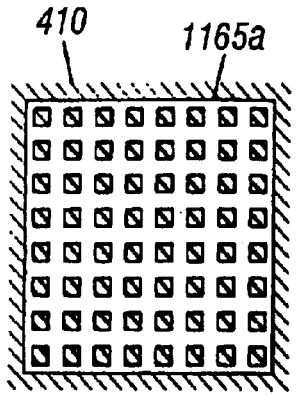
Figure 11H:
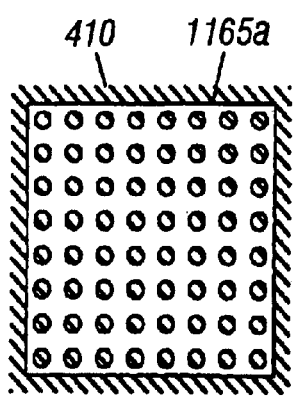
Figure 11H:
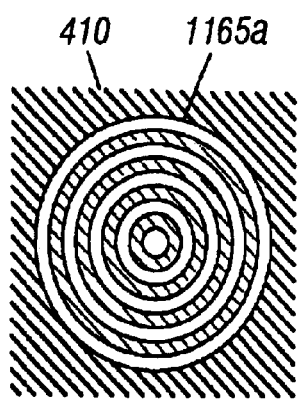
Figure 11H:
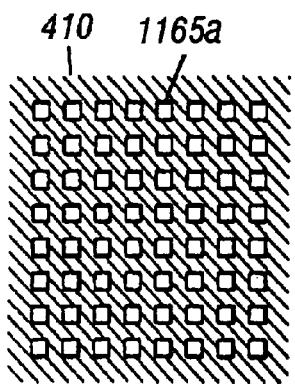
Figure 11H:
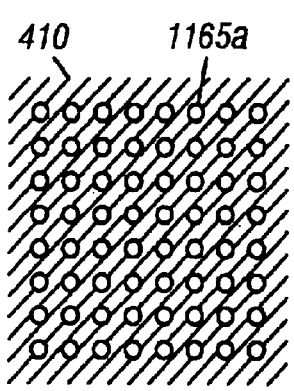
Figure 11H:
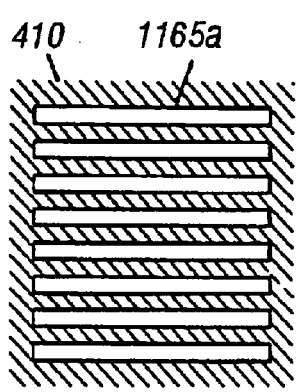
Figure 11H:
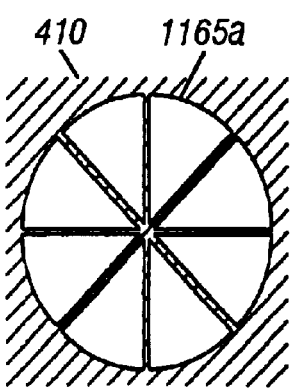
Figure 11H:
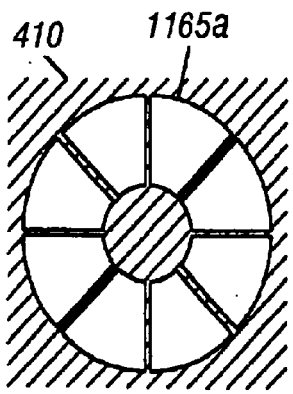

In a preferred embodiment, as illustrated in FIG. 11ha, the metal electrode pattern 910 includes a pattern 960a designed to reduce stiction between the metal electrode pattern 910 and the top cap overshock bumpers 720 during the operation of the accelerometer 305. In a preferred embodiment, as illustrated in FIG. 11hb, the metal electrode pattern 915 includes a pattern 960b designed to reduce stiction between the metal electrode pattern 915 and the bottom cap overshock bumpers 820 during the operation of the accelerometer 305. The patterns 960a and 960b may be created on the metal electrode patterns 910 and 915 using any number of methods suitable for creating patterns on the metal electrode patterns 910 and 915. In a preferred embodiment, as illustrated in FIG. 11ha, the pattern 960a is created by etching a pattern into the upper surface 411 of the top measurement mass half 410 to create a patterned surface 1165a, and depositing the metal layer 1142 onto the patterned surface 1165a. The metal layer 1142 preferably molds into the metal electrode 910 including the pattern 960a. In a preferred embodiment, as illustrated in FIG. 11hb, the pattern 960b is created by etching a pattern into the lower surface 416 of the bottom measurement mass half 415 to create a patterned surface 1165b, and depositing the metal layer 1143 onto the patterned surface 1165b. The metal layer 1143 preferably molds into the metal electrode 915 including the pattern 960b. The patterned surface 1165a etched into the upper surface 411 of the top measurement mass half 410 and the patterned surface 1165b etched into the lower surface 416 of the bottom measurement mass half 415 may include any number of patterns suitable for reducing the stiction between the metal electrode patterns 910 and 915 and the overshock protection bumpers 720 and 820, respectively. In a preferred embodiment, as illustrated in FIGS. 11hc and 11hf, the patterned surfaces 1165a and 1165b include a plurality of geometrically arranged squares. In another preferred embodiment, as illustrated in FIGS. 11hd and 11hg, the patterned surfaces 1165a and 1165b include a plurality of geometrically arranged circles. In another preferred embodiment, as illustrated in FIG. 11he, the patterned surfaces 1165a and 1165b include a series of concentric circles. In another preferred embodiment, as illustrated in FIG. 11hh, the patterned surfaces 1165a and 1165b include a series of geometrically arranged rectangles. In another preferred embodiment, as illustrated in FIGS. 11hi and 11hj, the patterned surfaces 1165a and 1165b include a series of geometrically arranged pie-shaped segments.

Figure 11I:
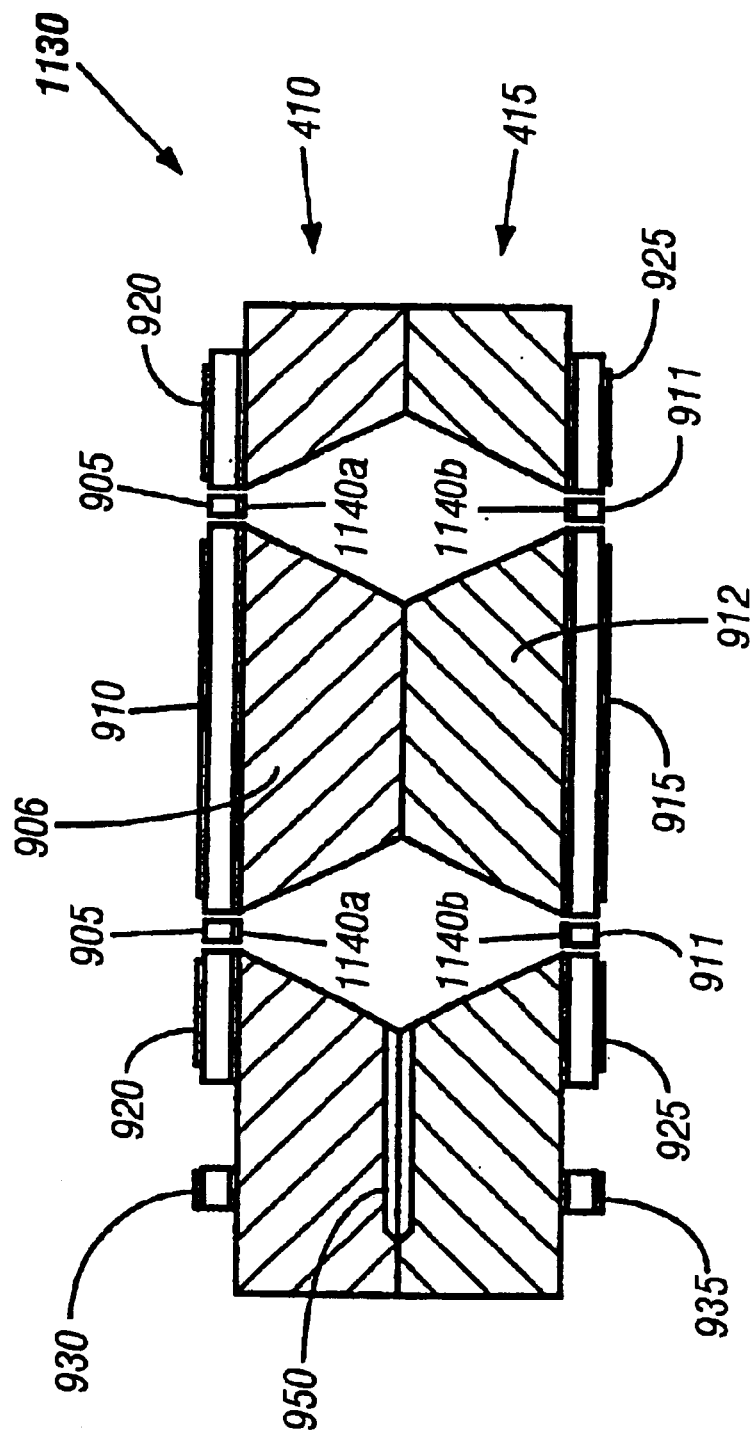

In a preferred embodiment, as illustrated in FIG. 11i, the springs 905 are formed to couple the top measurement mass 906 to the housing 907, and the springs 911 are formed to couple the bottom measurement mass 912 to the housing 913. The springs 905 and 911 may be formed using any number of conventional commercially available methods suitable for creating spring members in the mass wafer pair 1130. In a preferred embodiment, the springs 905 and 911 are formed using a DRIE plasma etching technique. In a preferred embodiment, the etching technique is substantially as that described in U.S. Pat. No. 5,484,073, the disclosure of which is incorporated herein by reference. The springs 905 and 911 are preferably linear L-shaped springs, the design of which is described in U.S. Pat. Nos. 5,652,384 and 5,777,226, the disclosures of which are incorporated herein by reference. The springs 905 and 911 are preferably designed to maintain cross-axis rejection while providing lateral shock protection for the top measurement mass 906 and the bottom measurement mass 911, respectively. In a preferred embodiment, the etch-stop layers 1140a and 1140b remain on backside surfaces of the springs 905 and 911, respectively, after the plasma etching process has been completed. The etch-stop layers 1140a and 1140b on the springs 905 and 911 preferably improve the uniformity of the thickness of the springs 905 and 911. In addition, the etch-stop layers 1140a and 1140b on the springs 905 and 911 preferably improve the dimensional control of the springs 905 during the operation of the accelerometer 305. In another preferred embodiment, the etch-stop layers 1140a and 1140b are removed from the springs 905 and 911, respectively, during the plasma etching process.

Figure 11J:
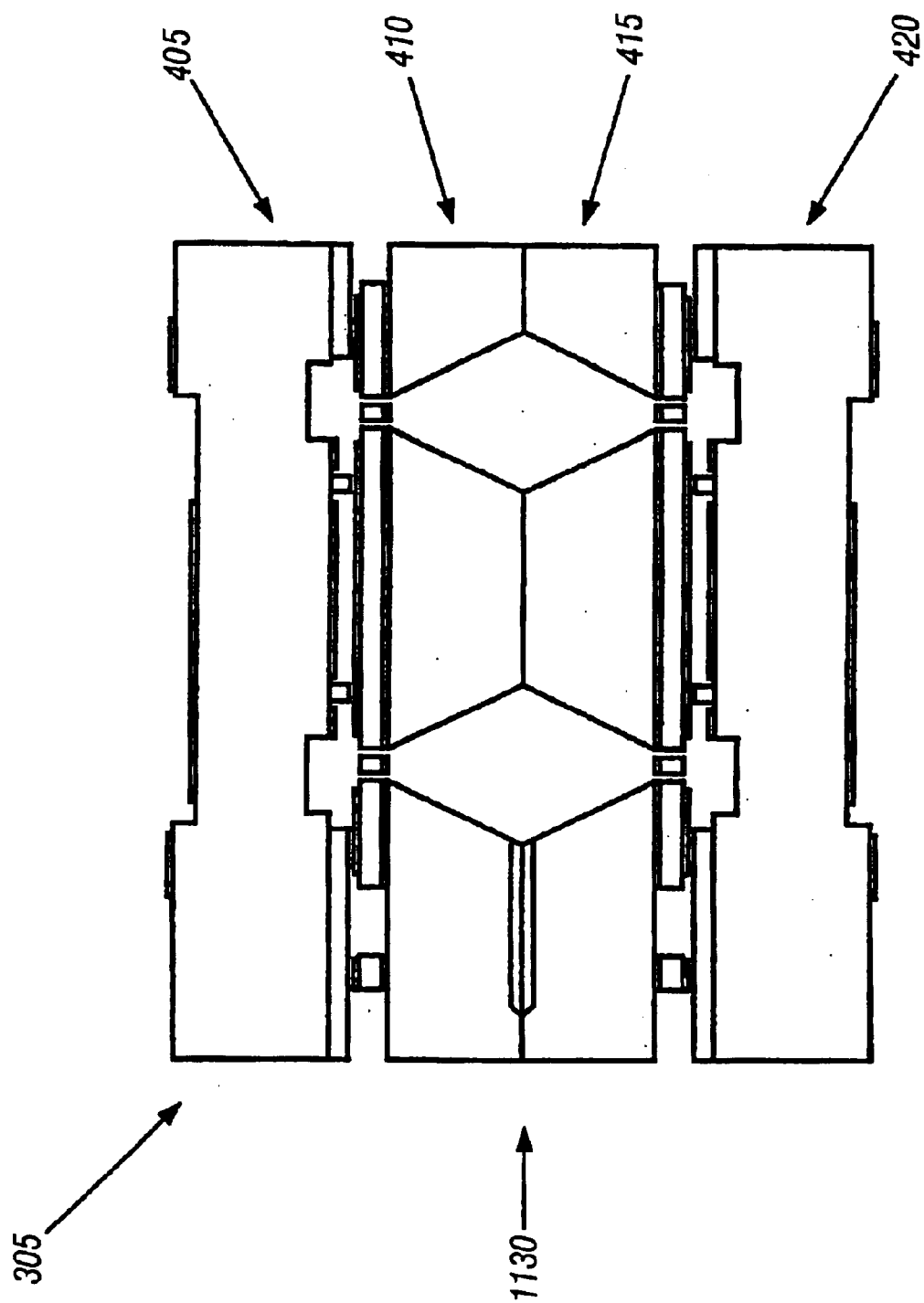

As illustrated in FIG. 11j, in step 1035 the top cap wafer 405, the bottom cap wafer 420, and the mass wafer pair 1130 preferably undergo a bonding process to form the accelerometer 305. The bonding process of step 1035 may be any number of bonding processes such as, for example, fusion bonding, thermocompression, eutectic bonding, anodic bonding, or glass frit bonding. In a preferred embodiment, the bonding process of step 1035 is a thermocompression bonding process.

During the bonding process of step 1035, the top cap wafer 405 is bonded to the upper surface of the mass wafer pair 1130, which corresponds to the upper surface 411 of the top measurement mass half 410. In a preferred embodiment, the top bond ring 707 bonds with the bond ring 920, coupling the top cap wafer 405 and the top measurement mass half 410. The top bond ring 707 and the bond ring 920 are preferably bonded using the thermocompression bonding process.

The top bond oxide ring 710 preferably extends below the bottom surface 408 of the top cap wafer body 406. As a result, the bonding process preferably creates a narrow capacitor electrode gap between the top capacitor electrode 705 and the metal electrode pattern 910. During the bonding process, bond forces are preferably applied to the upper surface 407 of the top cap wafer 405, away from the top cap press frame recess 725. In a preferred embodiment, the top cap press frame recess 725 is positioned on the upper surface 407 of the top cap wafer 405 in a location that ensures that bond forces applied during the bonding process are localized to the bond ring regions and away from the narrow capacitor electrode gap region.

Also during the bonding process of step 1035, the bottom cap wafer 420 is bonded to the lower surface of the mass wafer pair 1130, which corresponds to the lower surface 416 of the bottom measurement mass half 415. In a preferred embodiment, the bottom bond ring 807 bonds with the bond ring 925, coupling the bottom cap wafer 420 and the bottom measurement mass half 415. The bottom bond ring 807 and the bond ring 925 are preferably bonded using the thermocompression bonding process.

The bottom bond oxide ring 810 preferably extends above the upper surface 423 of the bottom cap wafer body 421. As a result, the bonding process preferably creates a narrow capacitor electrode gap between the bottom capacitor electrode 805 and the metal electrode pattern 915. During the bonding process, bond forces are preferably applied to the bottom surface 422 of the bottom cap wafer 420, away from bottom cap press frame recess 825. In a preferred embodiment, the bottom cap press frame recess 825 is positioned on the bottom surface 422 of the bottom cap wafer 420 in a location that ensures that bond forces applied during the bonding process are localized to the bond ring regions and away from the narrow capacitor electrode gap region.

Figure 12A:
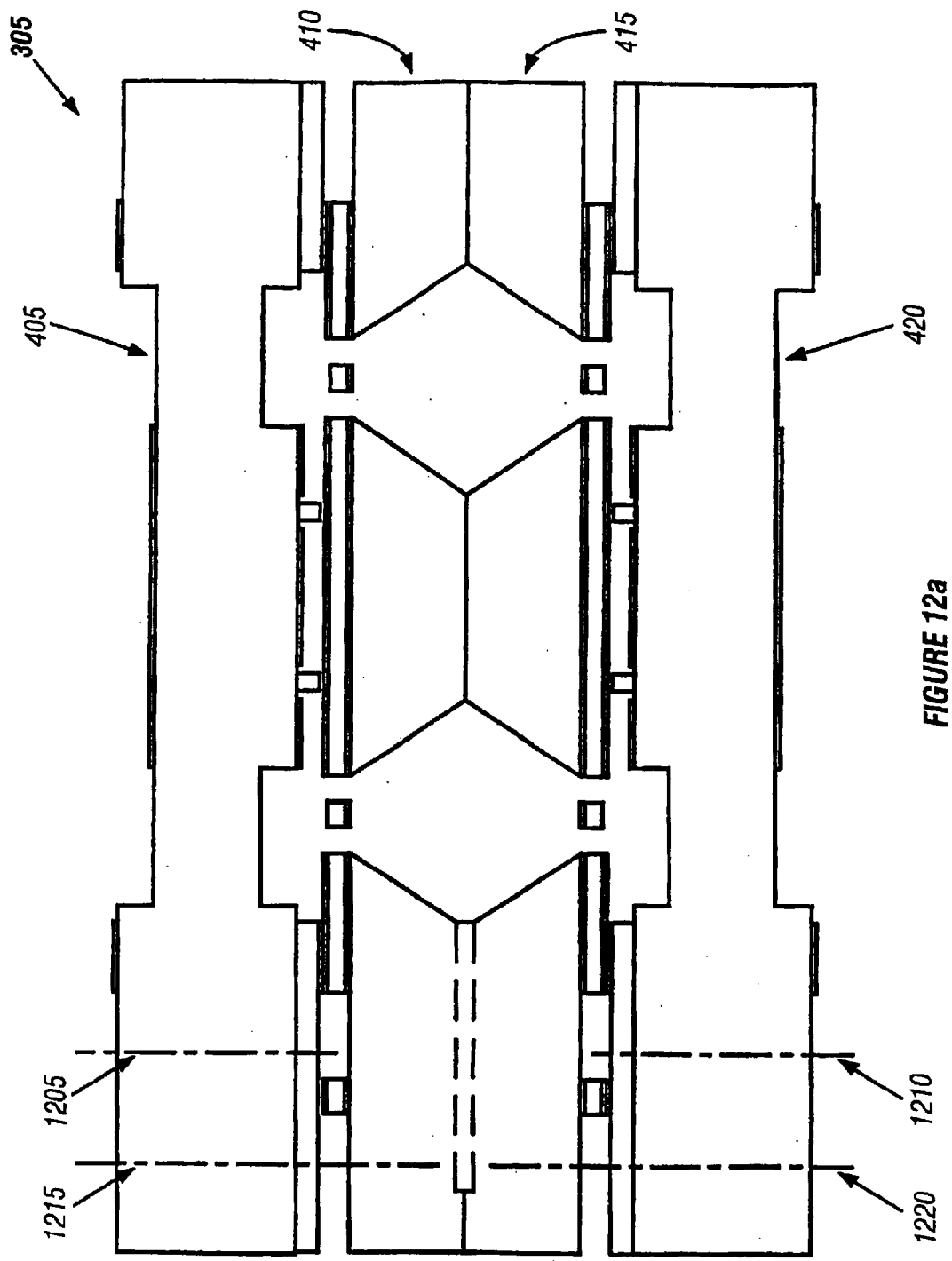
FIG. 12a is a side view illustrating the relative positioning of dicing cuts on the accelerometer die of FIG. 6.
Figure 12B:
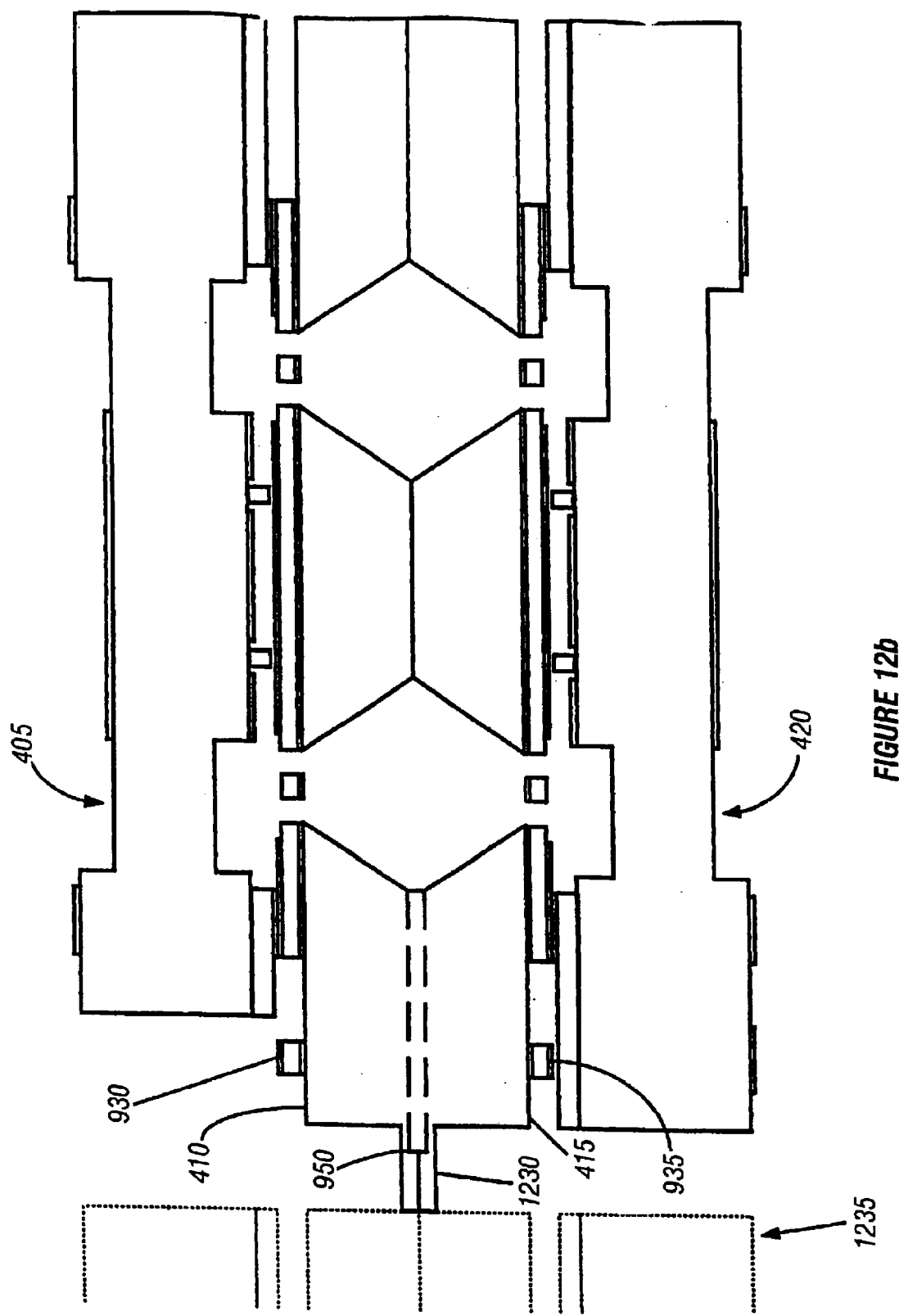
FIG. 12b is an illustration of the accelerometer die after the dicing cuts of FIG. 12a have been completed.
Figure 12C:
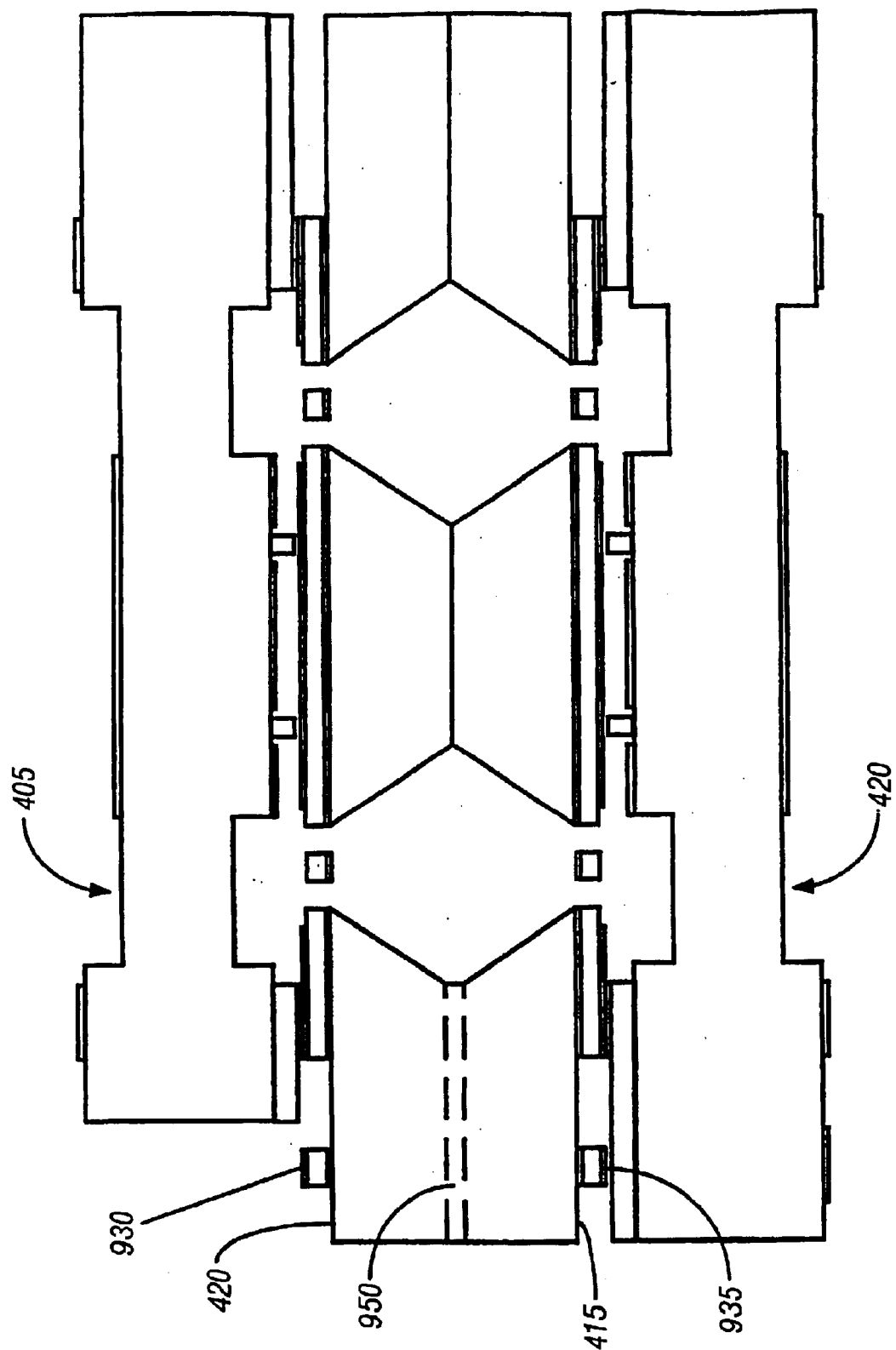
FIG. 12c is an illustration of an embodiment of the accelerometer of FIG. 12b after an integrated passage has been exposed.

As illustrated in FIGS. 12a, 12b, and 12c, in step 1040 the accelerometer 305 undergoes a dicing process. Dicing cuts 1205, 1210, 1215, 1220 are preferably made at predetermined locations on the accelerometer 305. The dicing cuts 1205, 1210, 1215, 1220 serve a variety of purposes. In a preferred embodiment, the dicing cuts 1205, 1215, 1220 are made to separate the accelerometer 305 die from a wafer 1235, expose electrical leads from the electrodes 910 and 915, separate the electrical leads, and expose the passage 950. In another preferred embodiment, the dicing cut 1210 is made in addition to the dicing cuts 1205, 1215, 1220 to separate the accelerometer 305 die from the wafer 1235, expose electrical leads from the electrodes 910 and 915, separate the electrical leads, and expose the passage 950.

In a preferred embodiment, a cut 1205 is made on the top cap wafer 405. The cut 1205 preferably extends vertically through the top cap wafer body 406, resulting in the removal of a section of the top cap wafer body 406. In a preferred embodiment, the cut 1205 exposes the top mass contact pad 930. The cut 1205 may be performed using any number of conventional commercially available methods of performing a dicing cut such as, for example, using a diamond blade wafer saw. In a preferred embodiment, the cut 1205 is made by using a diamond blade wafer saw.

In a preferred embodiment, a cut 1215 is made extending vertically through the top cap wafer body 406 and into the housing 907 of the top measurement mass half 410. The cut 1215 is preferably stopped within the housing 907 before the cut 1215 reaches the passage 950. The cut 1215 may be stopped any distance before reaching the passage 950. In a preferred embodiment, the cut 1215 is stopped more than about 2 mils from the passage 950. The cut 1215 may be performed using any number of conventional commercially available methods of performing a dicing cut such as, for example, using a diamond blade wafer saw. In a preferred embodiment, the cut 1215 is made by using a diamond blade wafer saw.

In a preferred embodiment, a cut 1220 is made extending vertically through the bottom cap wafer body 421 and into the housing 913 of the bottom measurement mass half 415. The cut 1220 is preferably stopped within the housing 913 before the cut 1220 reaches the passage 950. The cut 1220 may be stopped any distance before reaching the passage 950. In a preferred embodiment, the cut 1220 is stopped more than about 2 mils from the passage 950. The cut 1220 may be performed using any number of conventional commercially available methods of performing a dicing cut such as, for example, using a diamond blade wafer saw. In a preferred embodiment, the cut 1215 is made by using a diamond blade wafer saw.

In an alternative preferred embodiment, a cut 1210 is made on the bottom cap wafer body 421. The cut 1210 preferably extends vertically through the bottom cap wafer body 421, resulting in the removal of a section of the bottom cap wafer body 421. In a preferred embodiment, the cut 1210 exposes the bottom mass contact pad 935. The cut 1210 may be performed using any number of conventional commercially available methods of performing a dicing cut such as, for example, using a diamond blade wafer saw. In a preferred embodiment, the cut 1210 is made by using a diamond blade wafer saw.

The cuts 1205, 1210, 1215, 1220 may be performed individually, or the cuts 1205, 1210, 1215, 1220 may be made in any combination to achieve the accelerometer 305 shape most suitable for a particular application. In a preferred embodiment, as illustrated in FIG. 12b, cuts 1205, 1215, and 1220 are performed on the accelerometer 305. In an alternative embodiment, cut 1210 is performed on the accelerometer 305 in addition to the cuts 1205, 1215, and 1220. Cut 1205 preferably exposes the top mass contact pad 930. Cut 1210 preferably exposes the bottom mass contact pad 935. Cuts 1215, 1220 preferably create a scribe lane 1230 surrounding the passage 950. The scribe lane 1230 is preferably attached to another die 1235.

During the dicing process, the scribe lane 1230 may remain attached to the accelerometer 305 and die 1235 to keep the accelerometer 305 hermetically sealed, or the scribe lane 1230 may be snapped to expose the passage 950 and separate the accelerometer 305 from the die 1235. In a preferred embodiment, as illustrated in FIG. 12c, the scribe lane 1230 is removed to expose the passage 950 and separate the accelerometer 305 from the die 1235. The exposed passage 950 is preferably used as a channel for removing air from within the accelerometer 305 to create a vacuum within the accelerometer 305 during packaging.

Figure 13:
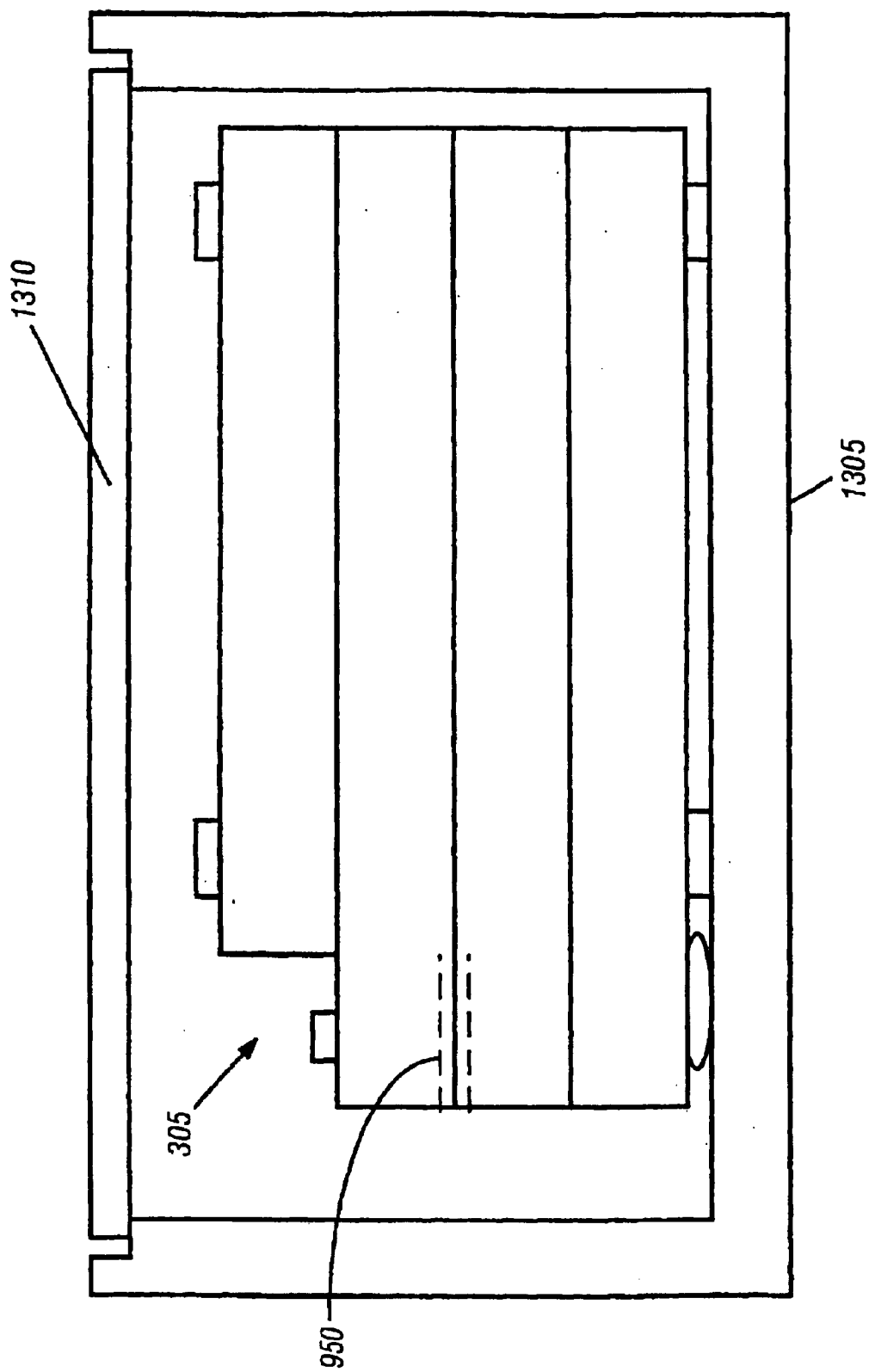
FIG. 13 is an illustration of an embodiment of the accelerometer of FIG. 12c packaged within a housing.

As illustrated in FIG. 13, in step 1045 the accelerometer 305 is packaged within a package 1305. The package 1305 may include any number of packages suitable for storing the accelerometer 305. In a preferred embodiment, the package 1305 is a housing. In another preferred embodiment, the package 1305 is a substrate.

The housing 1305 may be any number of housings suitable for storing the accelerometer 305. In a preferred embodiment, the housing 1305 includes a body 1310 and a lid 1315. The housing 1305 is preferably a conventional multi-layered ceramic package.

The accelerometer 305 is preferably placed within the body 1310 of the housing 1305. The accelerometer 305 may be placed within the housing 1305 using any number of methods suitable for securing the accelerometer 305 within the housing 1305. In a preferred embodiment, the accelerometer 305 is placed within the housing 1305 using a solder-die attachment process substantially as disclosed in PCT Patent Application Ser. No. PCT/US00/06832.

The lid 1315 is then preferably fastened to the body 1310 to seal the accelerometer 305 within the housing 1305. In a preferred embodiment, a vacuum process is used to remove air from the housing prior to fastening the lid 1315 to the body 1310, creating a vacuum or a low-pressure environment within the housing 1305. When the passage 950 is exposed, air is removed from within the accelerometer 305 during the vacuum process, creating a vacuum within the accelerometer 305 in the housing 1305.

In another preferred embodiment, the bonding process of step 1035 is performed in a vacuum environment, creating a vacuum within the cavity in the accelerometer 305 during the bonding process. In this embodiment, the passage 950 is preferably removed from the design of the accelerometer 305. The vacuum-sealed accelerometer 305 is then preferably placed in the housing 1305, and the housing is sealed by fastening the lid 1315 to the body 1310.

Figure 14:
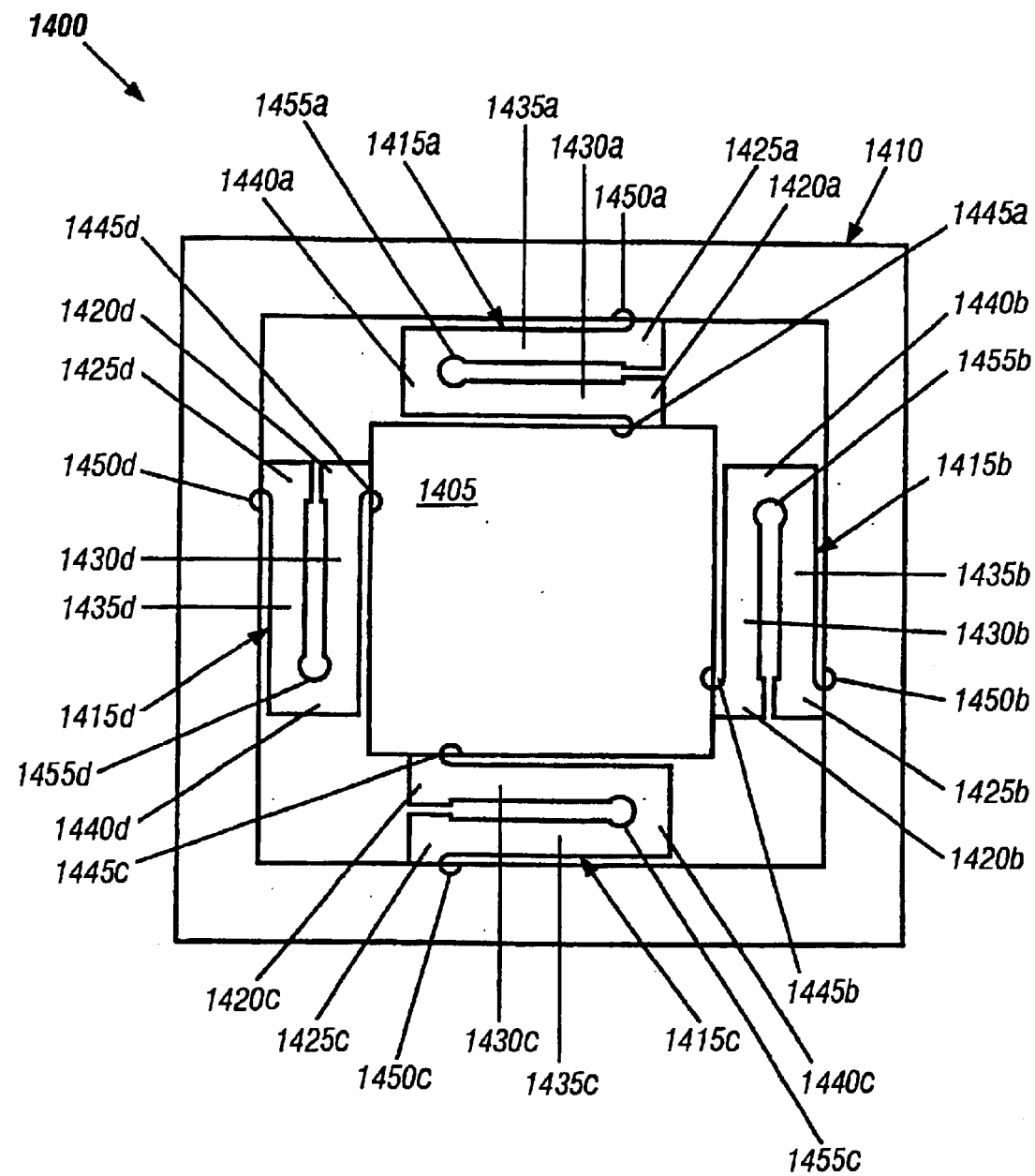
FIG. 14 is a top view of an embodiment of a mass coupled to a support structure by a number of folded beams.

Referring now to FIG. 14, an embodiment of an assembly 1400 for resiliently coupling a mass 1405 to a support 1410 using folded beams 1415a–1415d will now be described.

Each folded beam 1415 includes an inner foot 1420 coupled to the mass 1405 and an outer foot 1425 coupled to the support 1410. Extending from the feet 1420 and 1425 are corresponding inner and outer legs, 1430 and 1435, that are joined by a head 1440. The connection between the inner foot 1420 and the mass 1405 includes a circular cutout 1445, the connection between the outer foot 1425 and the support 1410 includes a circular cutout 1450, and the connection between the legs, 1430 and 1435, and the head 1440 includes a circular cutout 1455. The circular cutouts 1445, 1450, and 1455 provide stress relief.

improved cross axis sensitivity and lateral shock tolerance Sxz is provided. Finally, using thinner folded beams 1415 for a given spring constant K provides first and second natural frequency spring resonances that are spread further apart spatially in the frequency spectrum.

In several alternative embodiments of folded beam (FB) springs, the following operational characteristics were provided:

|  | SPRING THICKNESS RATIO | NORMALIZED SPRING MASS RATIO | NORMALIZED CROSS AXIS SENSITIVITY | SPRING MODE SEPARATION (kHz) | NORMALIZED INERTIAL ELEMENT/ SPRING COUPLING |
|---|---|---|---|---|---|
| FB spring 1 | 1.00 | 1.00 | 1.0 | 72.0 | 1.00 |
| FB spring 2 | 0.92 | 0.88 | 1.2 | 73.6 | — |
| FB spring 3 | 0.75 | 0.60 | 1.8 | 87.6 | — |
| FB spring 4 | 0.72 | 0.56 | 1.9 | 92.0 | 0.44 |
| FB spring 5 | 0.60 | 0.40 | 2.8 | 109.0 | 0.37 |

All values are normalized to FB spring 1.

In a preferred embodiment, the teachings of the assembly 1400 are incorporated into the top measurement mass half 410 and the bottom measurement mass half 415 of the accelerometer 305 in order to optimally support the top measurement mass 906 and the bottom measurement mass 912 during operation of the accelerometer 305. In a preferred embodiment, the first and second natural frequencies of the folded beams 1415a–1415d are separated by at least about 80 kHz in order to provide optimally stable closed-loop operation of the accelerometer 305.

Figure 14A:
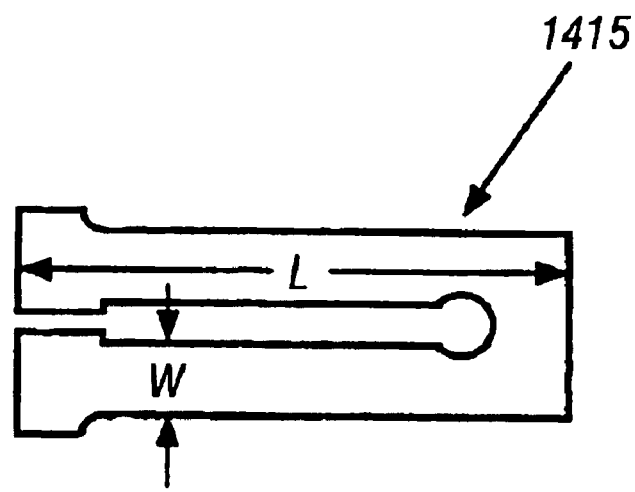
FIG. 14a is a top view of one of the folded beams of FIG. 14.
Figure 14B:
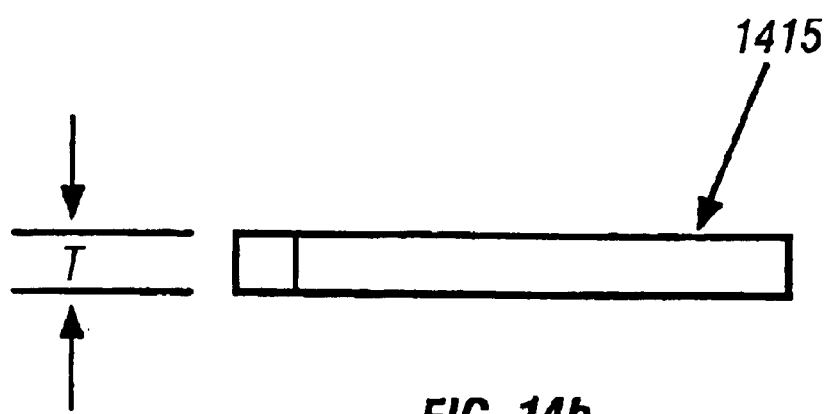
FIG. 14b is a side view of one of the folded beams of FIG. 14.

Referring now to FIGS. 14a and 14b, in several exemplary embodiments, the operational performance of the folded beam 1415 is given by the following expressions:

$$K \propto \left(\frac{T}{L}\right)^2 \equiv \left(\frac{2T}{2L}\right)^3 \quad (3)$$

$$Msp \propto WLT \quad (4)$$

$$Sxz \equiv \frac{Kx}{Kz} \propto \frac{W^2}{T^2} \quad (5)$$

where K is the spring constant;

T is the thickness;

L is the length;

W is the width;

Msp is the mass; and

Sxz is the cross axis sensitivity and lateral shock tolerance.

As demonstrated by equations (3), (4) and (5), the same spring constant K can be provided by using a given thickness T and length L or by using 2×T and 2×L. However, in the case of the double length L and double thickness T spring, the mass Msp is four times as large as the smaller version. Reducing the mass ratio between the folded beams 1415 and the mass 1405 reduces the spring resonant energy transfer from the folded beams 1415 to the mass 1405. Moreover, by using a reduced thickness T for a given width W, an All values are normalized to FB spring 1.

In an exemplary embodiment, the incorporation of the teachings of the assembly 1400 having folded beams 1415 into the accelerometer 305 provide an accelerometer having enhanced operational characteristics. In particular, optimally stable operation of the accelerometer 305 is provided by reducing the ratio of the mass of the spring element to the mass of the intertial element, as shown above. In this manner, the transfer of energy from the springs to the mass is minimized at the natural frequencies of the spring. In an exemplary embodiment, optimal closed-loop performance of the accelerometer 305 is provided when the first and second natural frequencies (or modes) of the springs are separated by at least about 80 kHz, as in the case of FB springs 3, 4, and 5, as shown above. In an exemplary embodiment, the separation of the first and second natural frequencies was increased by utilizing the folded beams 1415 versus a conventional L-shaped beam as demonstrated below.

|  | SPRING THICKNESS RATIO | NORMALIZED SPRING MASS RATIO | SPRING MODE SEPARATION (KhZ) |
|---|---|---|---|
| L-SHAPED SPRING | 1.00 | 2.22 | 55.2 |
| FOLDED BEAM SPRING 6 | 1.00 | 1.00 | 80.16 |

All values are normalized to FB spring 6.

All values are normalized to FB spring 6.

Figure 14C:
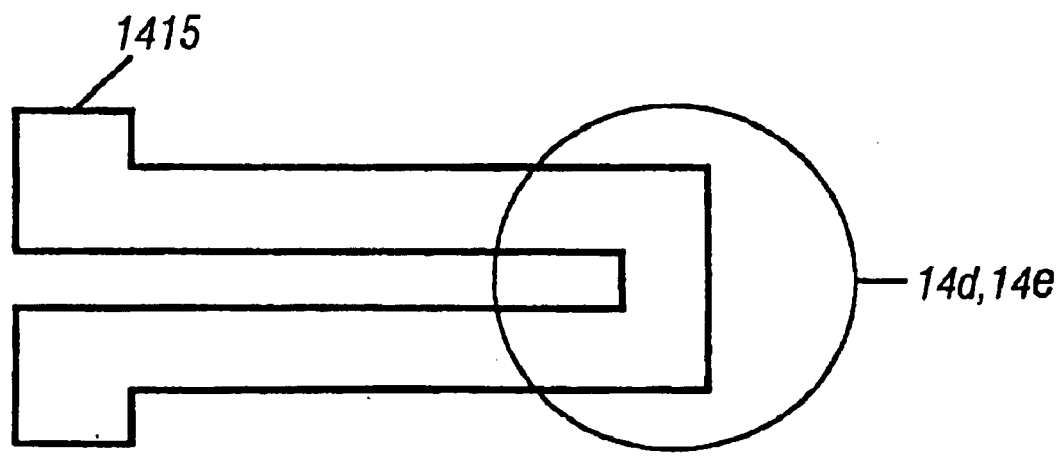
FIG. 14c is a top view of a folded beam without circular cutouts.
Figure 14D:
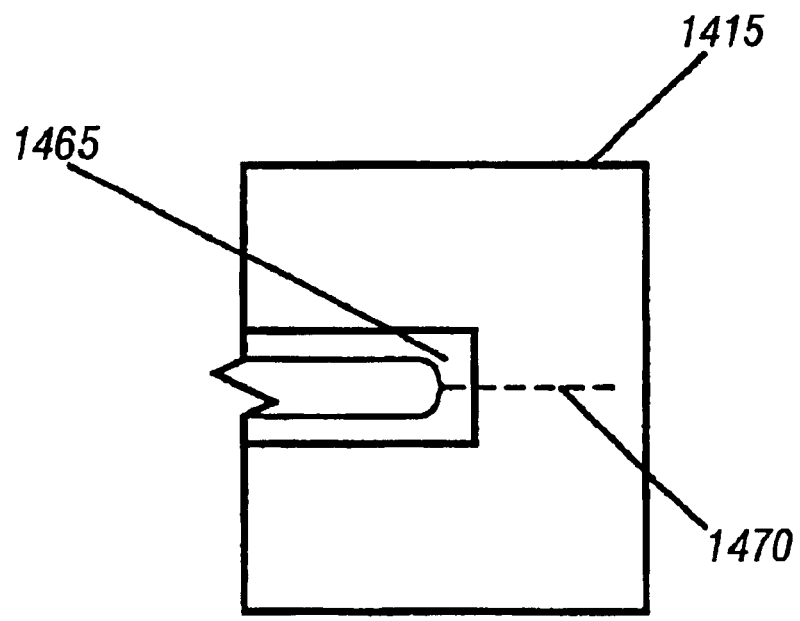
FIG. 14d is an exploded top view of a portion of the folded beam of FIG. 14c illustrating the web artifact and the crack propagations that can be caused by the web artifact.
Figure 14E:
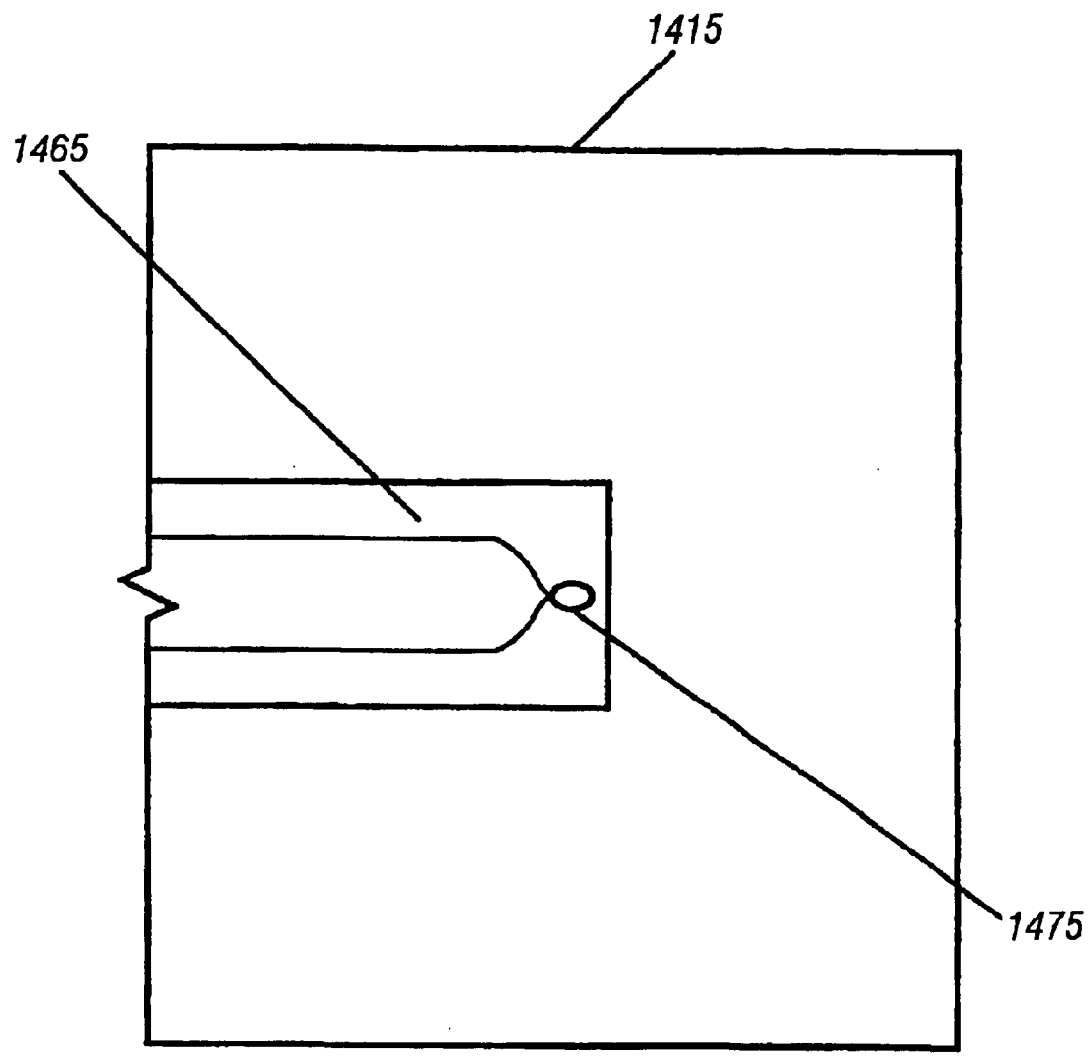
FIG. 14e is an exploded top view of a portion of the folded beam of FIG. 14c illustrating the use of a vent hole within the web artifact in order to prevent crack propagations that can otherwise be caused by the web artifact.

Referring to FIGS. 14, 14c, and 14d, the inclusion of the circular cutouts 1445, 1450, and 1455 in the folded beams 1415 further eliminate crack propagation that can be caused by typical manufacturing processes. In particular, during the manufacture of a folded beam 1415, the webbing artifact 1465 from a conventional plasma etching process can induce crack propagation along a direction 1470 into the folded beam 1415. The addition of circular cutouts to the folded beam 1415 minimizes webbing formation during the etching process. Referring to FIG. 14e, the inclusion of vent holes 1475 within the webbing artifact 1465 will also arrest the propagation of cracks along the direction 1470.

Figure 15:
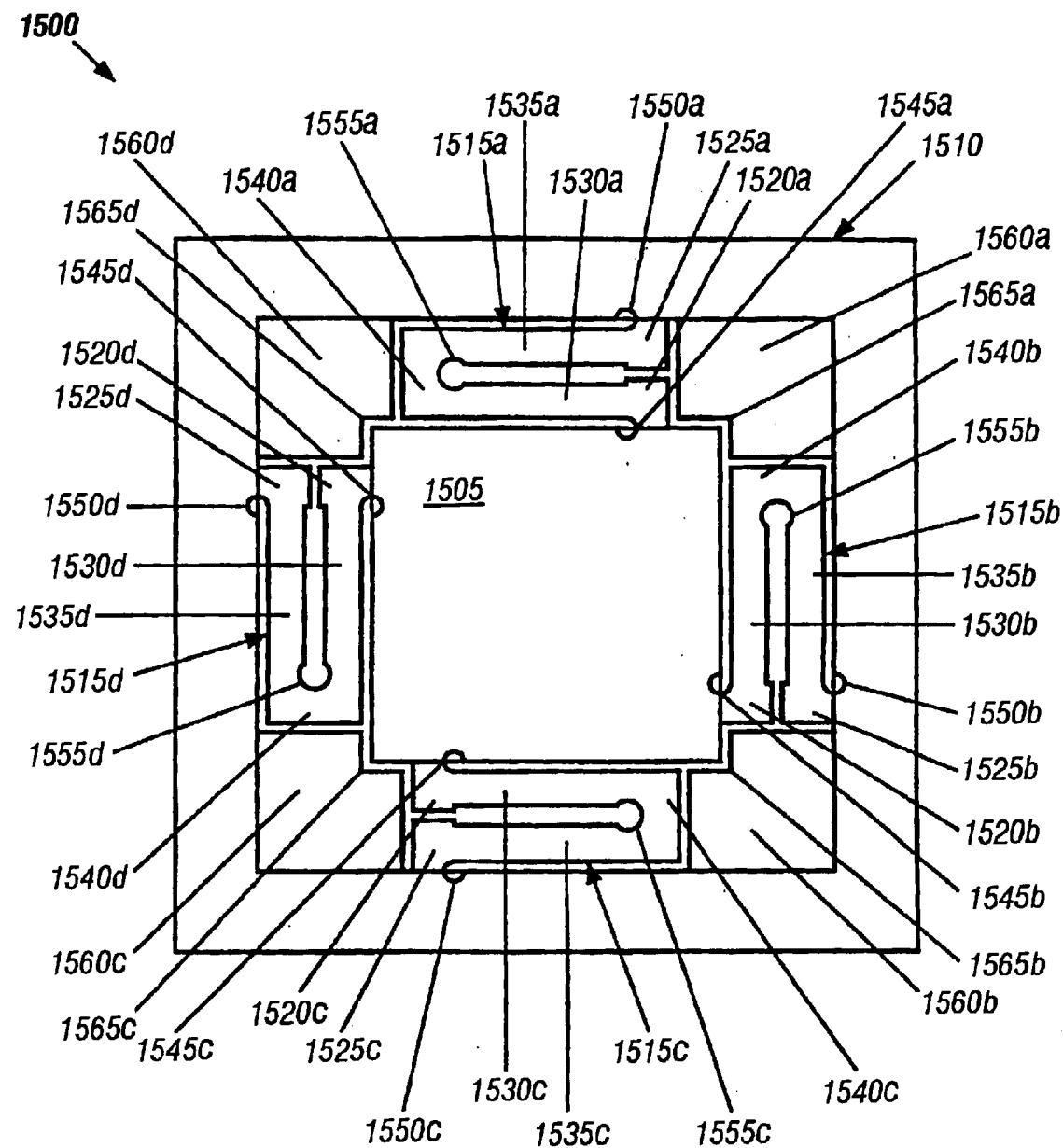
FIG. 15 is a top view of an embodiment of a mass coupled to a support structure by a number of folded beams and including a number of range-of-motion stops.

Referring now to FIG. 15, an embodiment of an assembly 1500 for resiliently coupling a mass 1505 to a support 1510 using folded beams 1515a–1515d will now be described.

Each folded beam 1515 includes an inner foot 1520 coupled to the mass 1505 and an outer foot 1525 coupled to the support 1510. Extending from the feet 1520 and 1525 are corresponding inner and outer legs, 1530 and 1535, that are joined by a head 1540. The connection between the inner foot 1520 and the mass 1505 includes a circular cutout 1545, the connection between the outer foot 1525 and the support 1510 includes a circular cutout 1550, and the connection between the legs, 1530 and 1535, and the head 1540 includes a circular cutout 1555. The circular cutouts 1545, 1550, and 1555 provide stress relief.

Range-of-movement stops 1560a–1560d extend from corresponding interior corners of the support 1510 for limiting the range-of-motion of the mass 1505. Each stop 1560 includes a motion capture portion 1565 positioned in opposing relation to a corresponding corner of the mass 1505 for limiting movement of the mass 1505 in the direction of the corresponding motion capture portion 1565.

In a preferred embodiment, the teachings of the assembly 1500 are incorporated into the top measurement mass half 410 and the bottom measurement mass half 415 of the accelerometer 305 in order to optimally support the top measurement mass 906 and the bottom measurement mass 912 during operation of the accelerometer 305. In a preferred embodiment, the first and second natural frequencies of the folded beams 1515a–1515d are separated by at least about 80 kHz in order to provide optimally stable operation of the accelerometer 305.

In an exemplary embodiment, the fabrication of the folded beams 1515 of the assembly 1500 are provided by utilizing a manufacturing process including a plasma etch process. A mask that includes the folded beams 1515 is patterned onto a silicon wafer and thereby serves to mask or expose the various regions of the silicon wafer in an etching process. The etching rate is typically not uniform throughout the silicon wafer and is dependent upon the size of the openings provided in the masking layer. However, uniformity and controllability of the process steps are desired during the manufacturing process. Thus, in order to equalize the etch rate and preserve uniformity across the silicon wafer, etch-buffers are included in the manufacturing process for the assembly 1500. The etch-buffers provide the following benefits: (1) the area per unit length of the open areas of the mask are substantially constant; and (2) the entry of etch-gasses and the etching action on the backside of the folded beams 1515 are minimized. In an exemplary embodiment, the backside etching of the folded beams 1515 is reduced by approximately 1–2 microns. In this manner, variations in the thicknesses of the beams 1515 are minimized from die to die and wafer to wafer. In a preferred embodiment, the stops 1560 also act as etch buffers during the manufacturing of the assembly 1500.

Figure 15A:
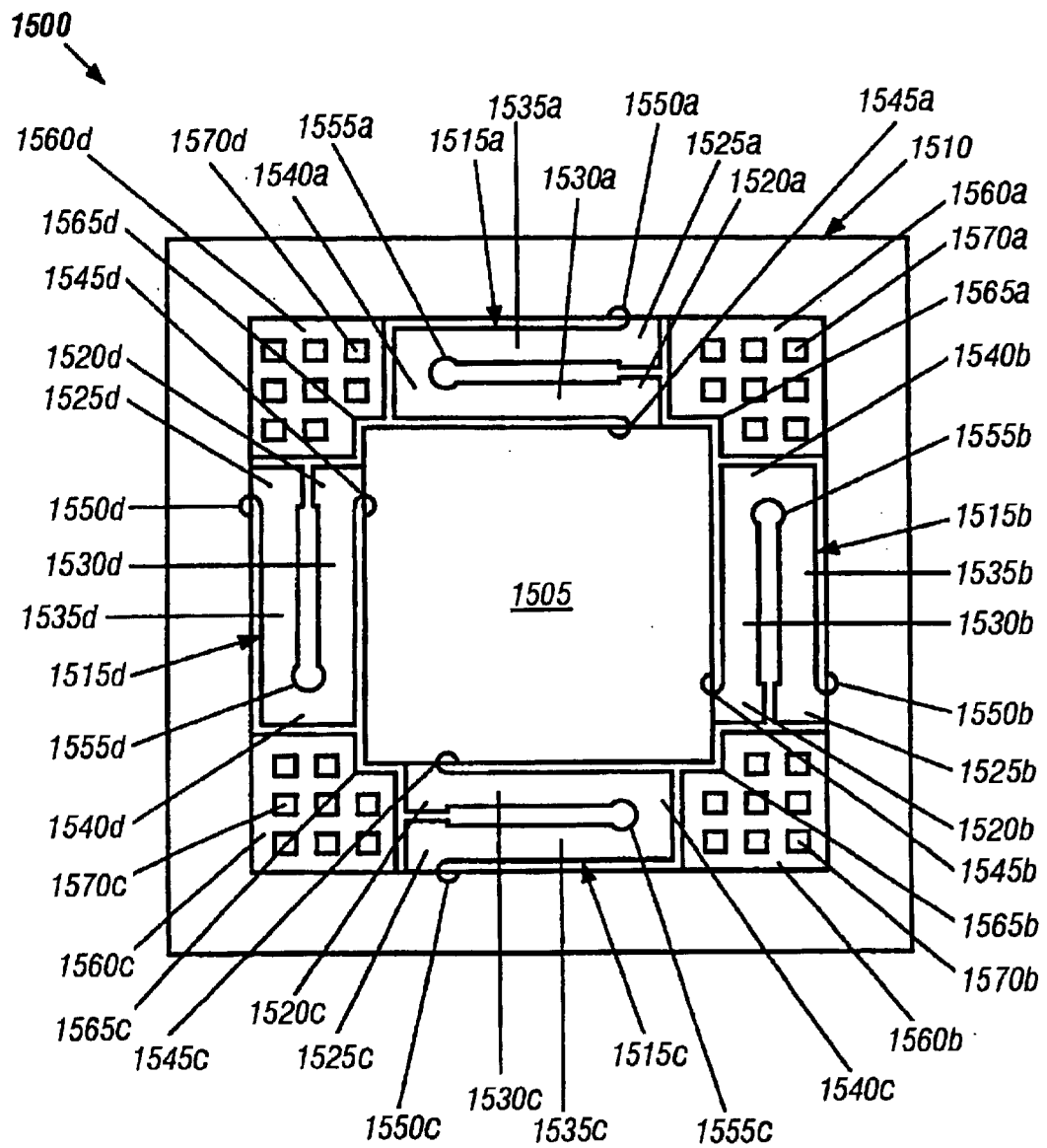
FIG. 15a is a top view of an alternate embodiment of the assembly of FIG. 15 including range-of-motion stops having one or more perforations for reducing fluid damping of the mass.

Referring to FIG. 15a, in an alternative embodiment, one or more of the stops 1560 include one or more perforations 1570 in order to minimize fluid damping of the mass 1505.

Figure 16:
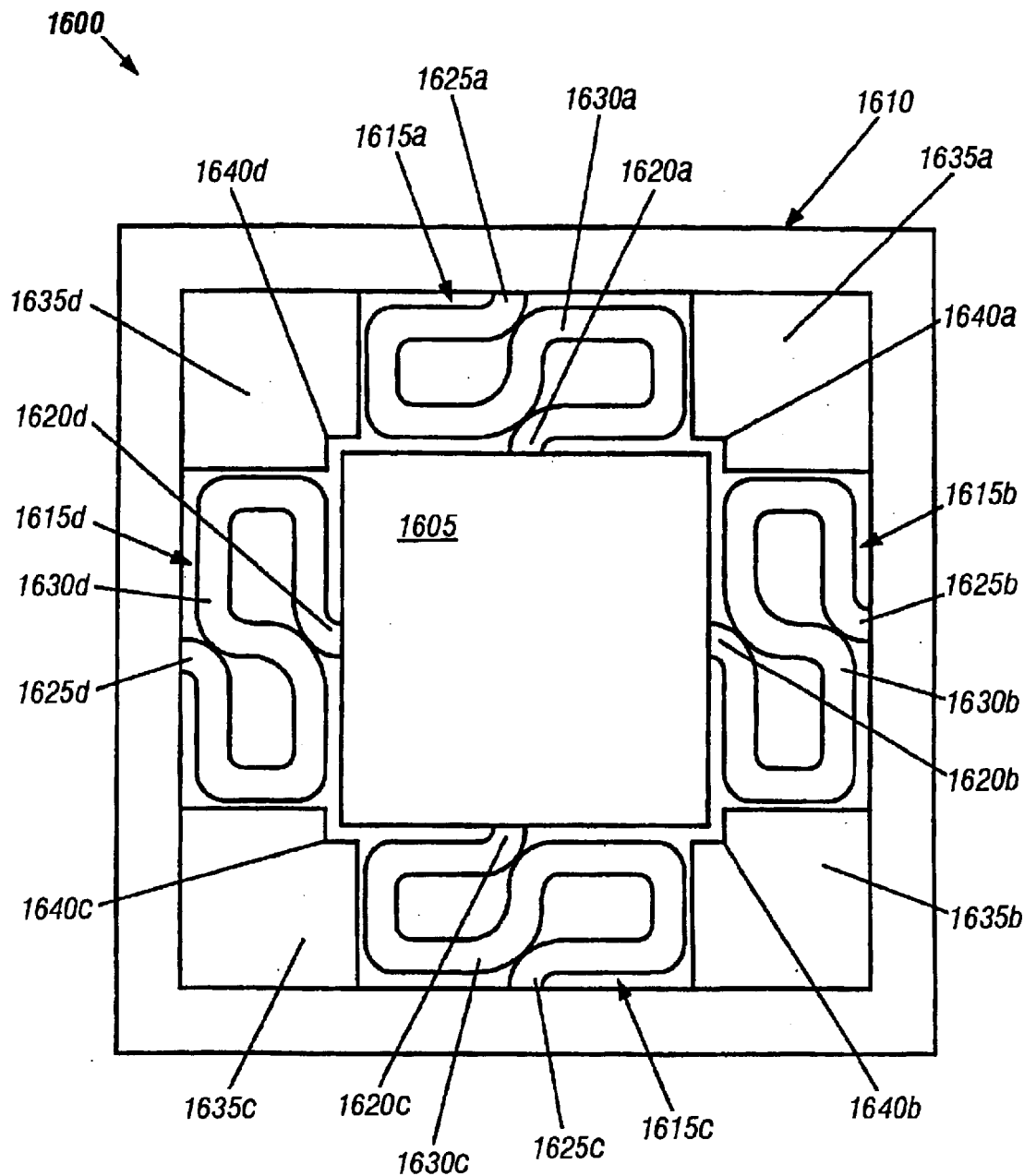
FIG. 16 is a top view of an embodiment of a mass coupled to a support structure by a number of S-shaped beams and including a number of range-of-motion stops.

Referring now to FIG. 16, an embodiment of an assembly 1600 for resiliently coupling a mass 1605 to a support 1610 using S-shaped beams 1615a–1615d will now be described.

Each S-shaped beam 1615 includes an inner foot 1620 coupled to the mass 1605 and an outer foot 1625 coupled to the support 1610. Extending between the feet is an S-shaped member 1630. In a preferred embodiment, the mass of the S-shaped member 1630 that overhangs on each side of the feet 1620 and 1625 is approximately equal in order to provide an optimally balanced suspended folded-beam structure having reduced tilt.

Range-of-movement stops 1635a–1635d extend from corresponding interior corners of the support 1610 for limiting the range-of-motion of the mass 1605. Each stop 1635 includes a motion capture portion 1640 positioned in opposing relation to a corresponding corner of the mass 1605 for limiting movement of the mass 1605 in the direction of the corresponding motion capture portion 1640.

In an alternate embodiment, the teachings of the assembly 1600 are incorporated into the top measurement mass half 410 and the bottom measurement mass half 415 of the accelerometer 305 in order to optimally support the top measurement mass 906 and the bottom measurement mass 912 during operation of the accelerometer 305. In an alternate embodiment, the first, second and third natural frequencies of the S-shaped beams 1615a–1615d are separated by less than about 2 to 36 kHz in order to provide optimally stable operation of the accelerometer 305.

Figure 17:
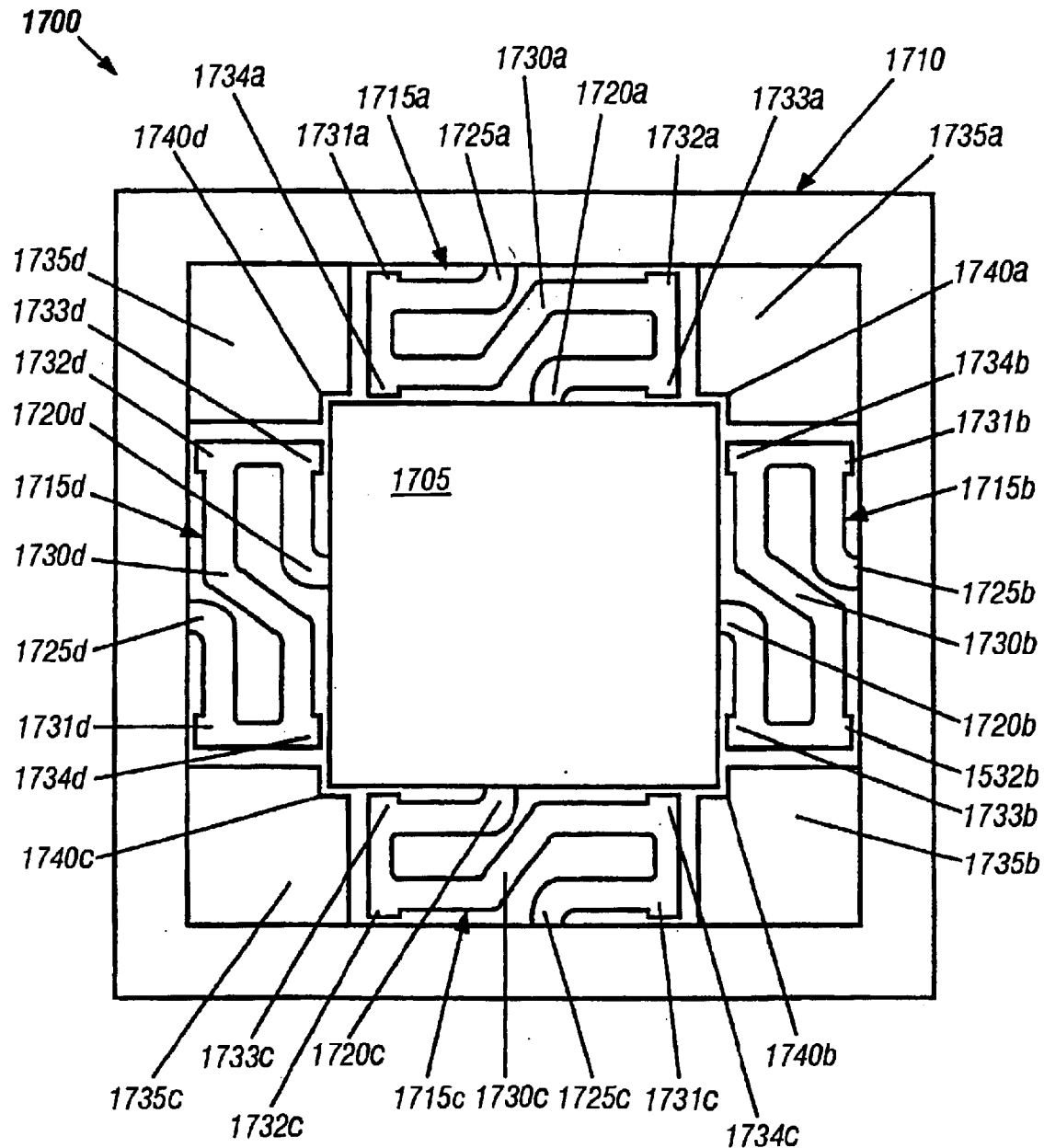
FIG. 17 is a top view of an embodiment of a mass coupled to a support structure by a number of S-shaped beams and including a number of range-of-motion stops.

Referring now to FIG. 17, an embodiment of an assembly 1700 for resiliently coupling a mass 1705 to a support 1710 using S-shaped beams 1715a–1715d will now be described.

Each S-shaped beam 1715 includes an inner foot 1720 coupled to the mass 1705 and an outer foot 1725 coupled to the support 1710. Extending between the feet is an S-shaped member 1730. In a preferred embodiment, the mass of the S-shaped member 1730 that overhangs on each side of the feet 1720 and 1725 is approximately equal. Range-of-movement stops 1731, 1732, 1733 and 1734 extend from the opposite ends of the S-shaped member 1730 in order to limit the range-of-motion of the mass 1705.

Range-of-movement stops 1735a–1735d extend from corresponding interior corners of the support 1710 for limiting the range-of-motion of the mass 1705. Each stop 1735 includes a motion capture portion 1740 positioned in opposing relation to a corresponding corner of the mass 1705 for limiting movement of the mass 1705 in the direction of the corresponding motion capture portion 1740.

In an alternate embodiment, the teachings of the assembly 1700 are incorporated into the top measurement mass half 410 and the bottom measurement mass half 415 of the accelerometer 305 in order to optimally support the top measurement mass 906 and the bottom measurement mass 912 during operation of the accelerometer 305. In an alternate embodiment, the first, second and third natural frequencies of the S-shaped beams 1715a–1715d are separated by less than about 2 to 36 kHz in order to provide optimally stable operation of the accelerometer 305.

Figure 18:
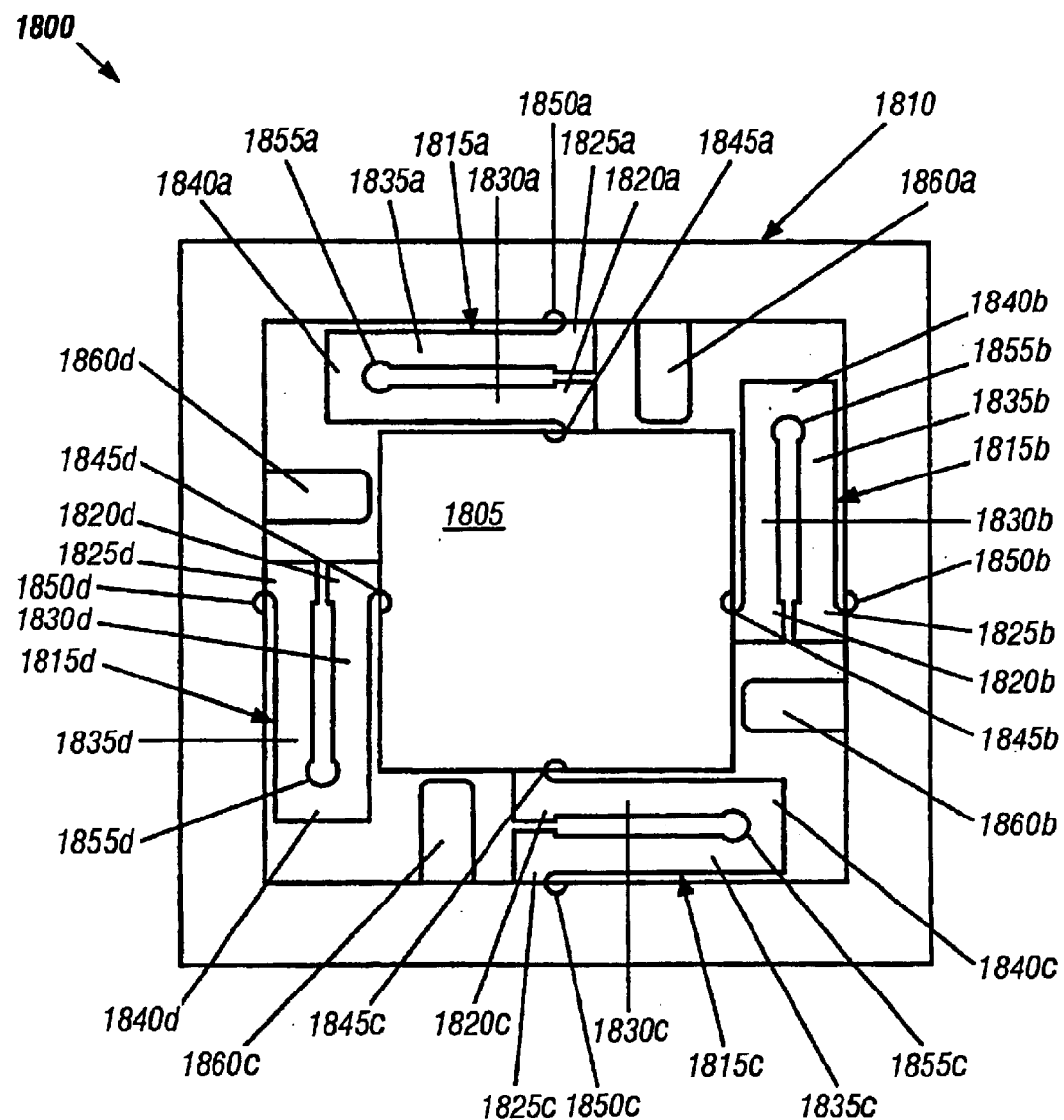
FIG. 18 is a top view of an embodiment of a mass coupled to a support structure by a number of folded beams and including a number of range-of-motion stops.

Referring now to FIG. 18, an embodiment of an assembly 1800 for resiliently coupling a mass 1805 to a support 1810 using folded beams 1815a–1815d will now be described.

Each folded beam 1815 includes an inner foot 1820 coupled to the mass 1805 and an outer foot 1825 coupled to the support 1810. Extending from the feet 1820 and 1825 are corresponding inner and outer legs, 1830 and 1835, that are joined by a head 1840. The connection between the inner foot 1820 and the mass 1805 includes a circular cutout 1845, the connection between the outer foot 1825 and the support 1810 includes a circular cutout 1850, and the connection between the legs, 1830 and 1835, and the head 1840 includes a circular cutout 1855. The circular cutouts 1845, 1850, and 1855 provide stress relief.

Range-of-movement stops 1860a–1860d extend from corresponding sides of the support 1810 for limiting the range-of-motion of the mass 1805 in the direction of the corresponding stop 1860.

In a preferred embodiment, the teachings of the assembly 1800 are incorporated into the top measurement mass half 410 and the bottom measurement mass half 415 of the accelerometer 305 in order to optimally support the top measurement mass 906 and the bottom measurement mass 912 during operation of the accelerometer 305. In a preferred embodiment, the first and second natural frequencies of the folded beams 1815a–1815d are separated by at least about 80 kHz in order to provide optimally stable operation of the accelerometer 305.

Figure 19:
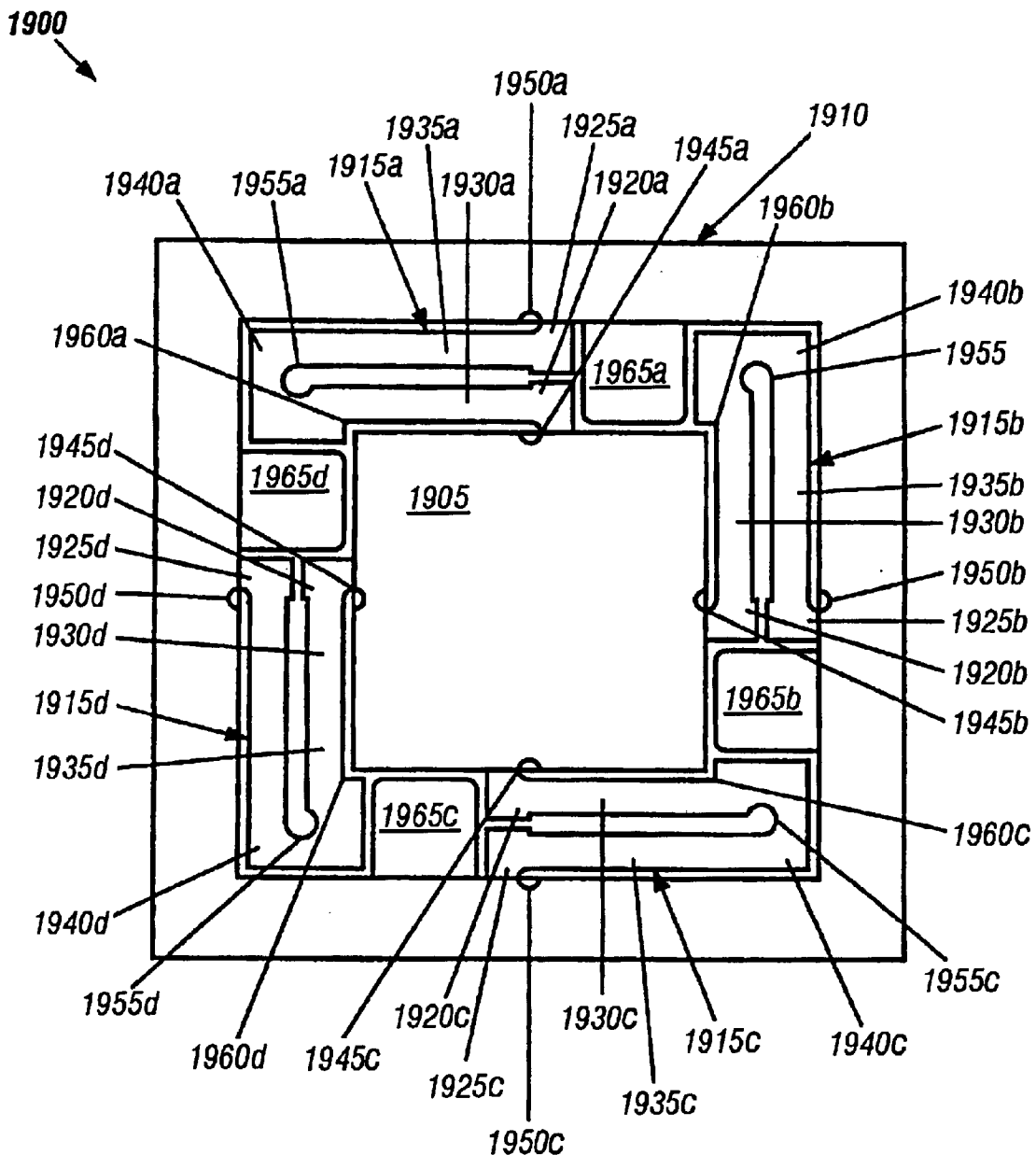
FIG. 19 is a top view of an embodiment of a mass coupled to a support structure by a number of folded beams and including a number of range-of-motion stops.

Referring now to FIG. 19, an embodiment of an assembly 1900 for resiliently coupling a mass 1905 to a support 1910 using folded beams 1915a–1915d will now be described.

Each folded beam 1915 includes an inner foot 1920 coupled to the mass 1905 and an outer foot 1925 coupled to the support 1910. Extending from the feet 1920 and 1925 are corresponding inner and outer legs, 1930 and 1935, that are joined by a head 1940. The connection between the inner foot 1920 and the mass 1905 includes a circular cutout 1945, the connection between the outer foot 1925 and the support 1910 includes a circular cutout 1950, and the connection between the legs, 1930 and 1935, and the head 1940 includes a circular cutout 1955. The circular cutouts 1945, 1950, and 1955 provide stress relief. The head 1940 further includes an etch buffer 1960.

Range-of-movement stops 1965a–1965d extend from corresponding sides of the support 1910 for limiting the range-of-motion of the mass 1905 in the direction of the corresponding stop 1965.

In a preferred embodiment, the teachings of the assembly 1900 are incorporated into the top measurement mass half 410 and the bottom measurement mass half 415 of the accelerometer 305 in order to optimally support the top measurement mass 906 and the bottom measurement mass 912 during operation of the accelerometer 305. In a preferred embodiment, the first and second natural frequencies of the folded beams 1915a–1915d are separated by at least about 80 kHz in order to provide optimally stable operation of the accelerometer 305.

In several alternative embodiments, the folded beams 1415, 1515, 1815 and 1915 include one or more integral range-of-motion stops for limiting the range-of-movement of the corresponding mass. In this manner, a compact resilient structure is provided that includes a built-in range-of-motion stop.

Figure 20:
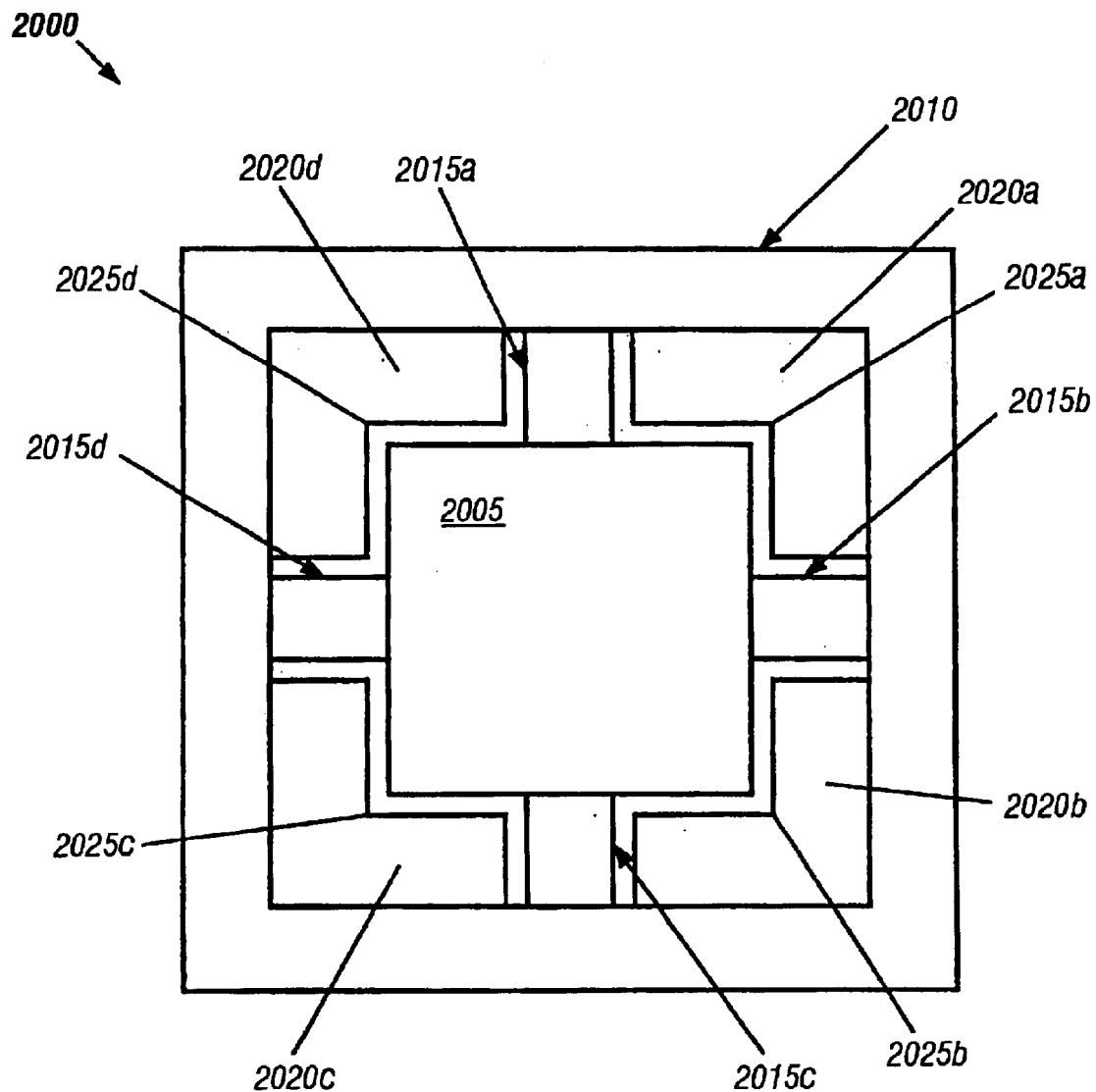
FIG. 20 is a top view of an embodiment of a mass coupled to a support structure by a number of straight beams and including a number of range-of-motion stops.

Referring now to FIG. 20, an embodiment of an assembly 2000 for resiliently coupling a mass 2005 to a support 2010 using straight beams 2015a–2015d will now be described.

Each straight beam 2015 is coupled to a corresponding side of the mass 2005 and a corresponding side of the support 2010.

Range-of-movement stops 2020a–2020d extend from corresponding corners of the support 2010 for limiting the range-of-motion of the mass 2005 in the direction of the corresponding stop 2020.

The straight beams 2015 provide enhanced lateral shock tolerance, vertical compliancy, and high lateral stiffness.

In a preferred embodiment, the teachings of the assembly 2000 are incorporated into the top measurement mass half 410 and the bottom measurement mass half 415 of the accelerometer 305 in order to optimally support the top measurement mass 906 and the bottom measurement mass 912 during operation of the accelerometer 305. In a preferred embodiment, the first and second natural frequencies of the straight beams 2015a–2015d are separated by at least about 80 kHz in order to provide optimally stable operation of the accelerometer 305.

Figure 21:
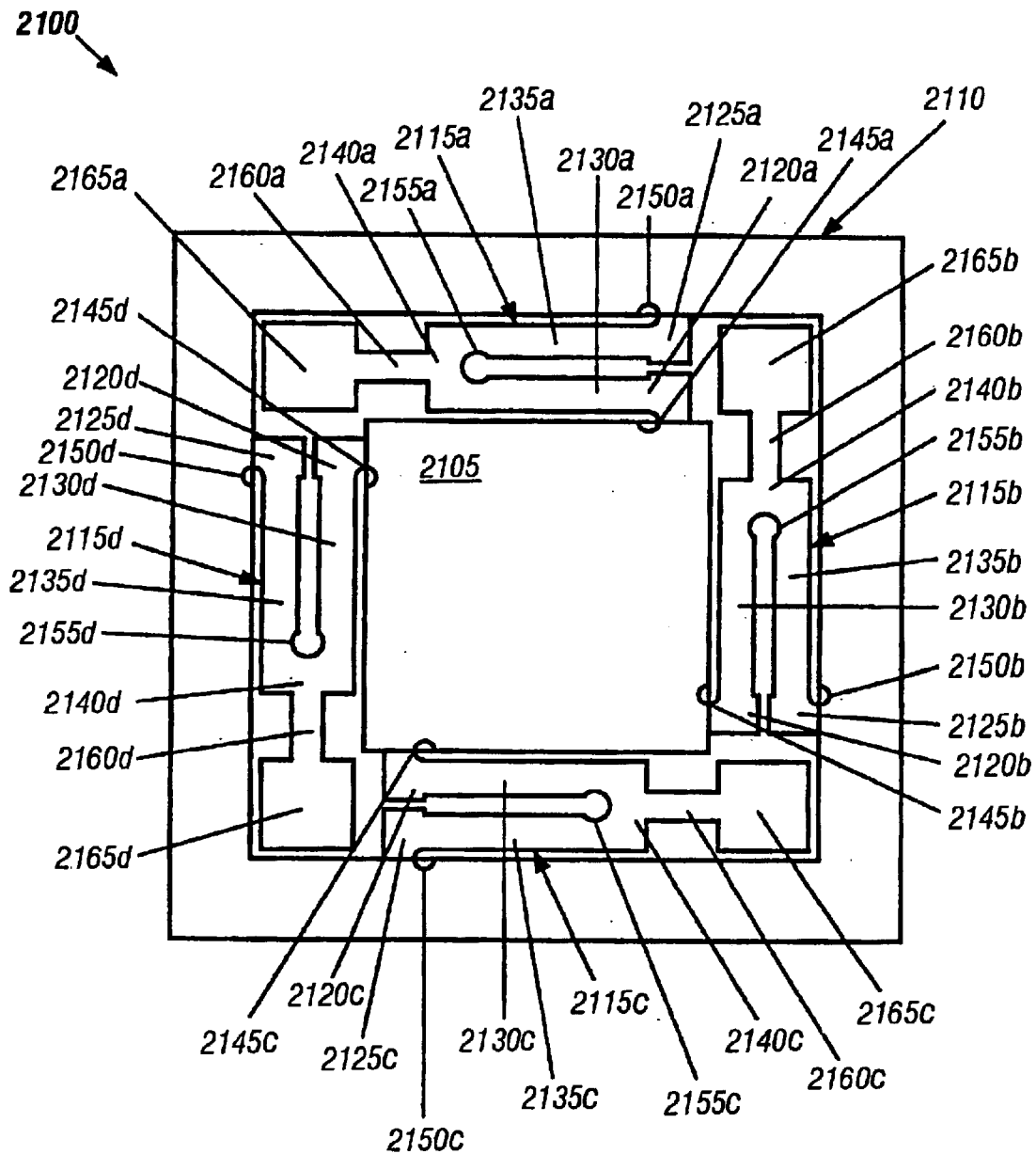
FIG. 21 is a top view of an embodiment of a mass coupled to a support structure by a number of folded beams including integral masses and including a number of range-of-motion stops.

Referring now to FIG. 21, an embodiment of an assembly 2100 for resiliently coupling a mass 2105 to a support 2110 using folded beams 2115a–2115d will now be described.

Each folded beam 2115 includes an inner foot 2120 coupled to the mass 2105 and an outer foot 2125 coupled to the support 2110. Extending from the feet 2120 and 2125 are corresponding inner and outer legs, 2130 and 2135, that are joined by a head 2140. The connection between the inner foot 2120 and the mass 2105 includes a circular cutout 2145, the connection between the outer foot 2125 and the support 2110 includes a circular cutout 2150, and the connection between the legs, 2130 and 2135, and the head 2140 includes a circular cutout 2155. The circular cutouts 2145, 2150, and 2155 provide stress relief. A support arm 2160 extends from head 2140 that supports a mass 2165 for dampening out the resonance of the folded beam 2115.

In a preferred embodiment, the frequency response of a first portion of the folded beams 2115 including the feet, 2120 and 2125, the legs, 2130 and 2135, and the head 2140 is out of phase with the frequency response of a second portion of the folded beams 2115 including the support arm 2160 and the mass 2165. In this manner, the resonances of the first and second portions of the folded beams 2115 destructively interfere with one another thereby reducing the overall resonance of the folded beams 2115. In this manner, the transmission of resonant energy from the folded beams 2115 to the mass 2105 is reduced.

In a preferred embodiment, the teachings of the assembly 2100 are incorporated into the top measurement mass half 410 and the bottom measurement mass half 415 of the accelerometer 305 in order to optimally support the top measurement mass 906 and the bottom measurement mass 912 during operation of the accelerometer 305. In a preferred embodiment, the first and second natural frequencies of the folded beams 2115a–2115d are separated by at least about 80 kHz in order to provide optimally stable operation of the accelerometer 305.

Figure 22:
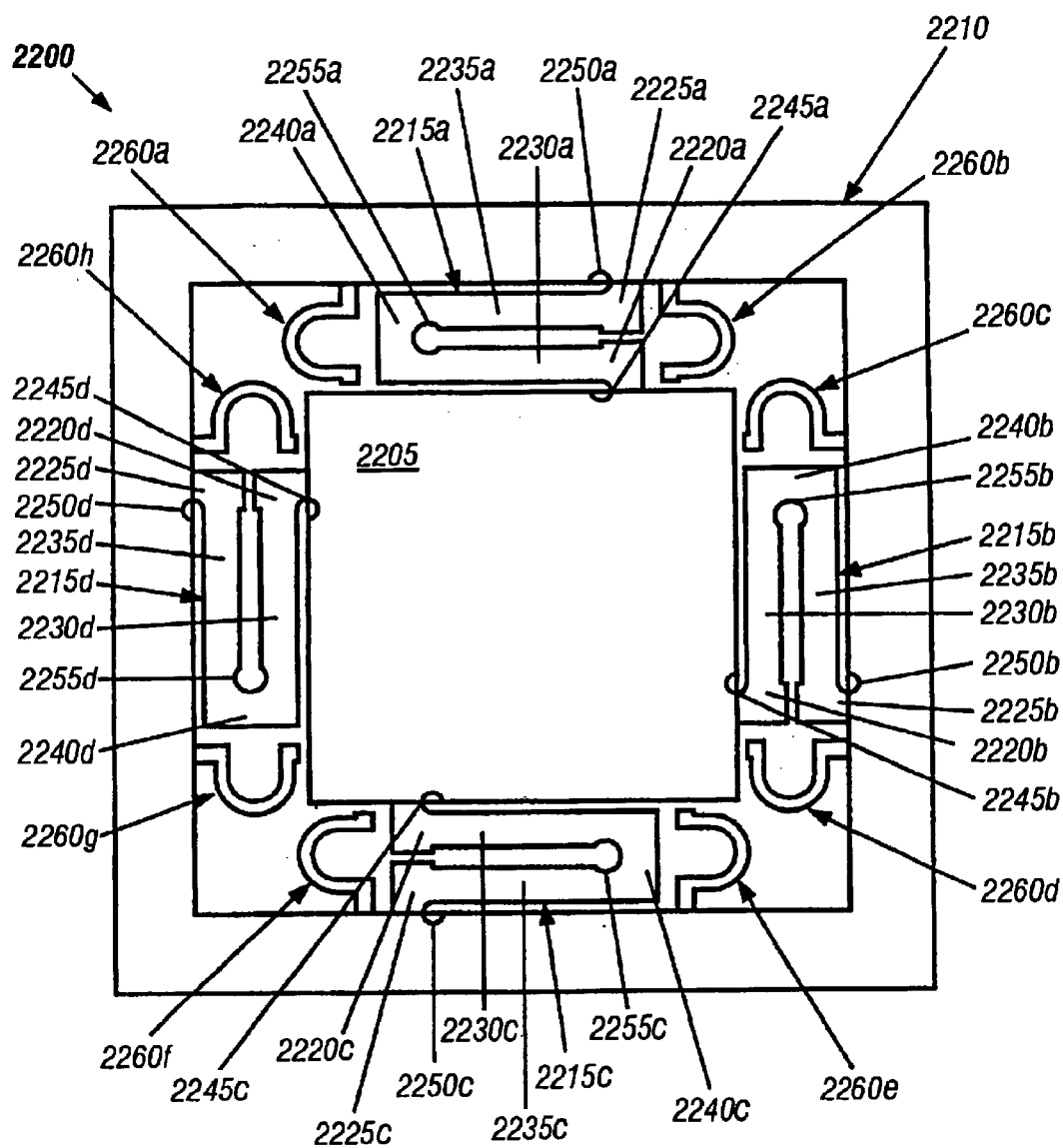
FIG. 22 is a top view of an embodiment of a mass coupled to a support structure by a number of folded beams and including a number of soft-contact range of motion stops.

Referring now to FIG. 22, an embodiment of an assembly 2200 for resiliently coupling a mass 2205 to a support 2210 using folded beams 2215a–2215d will now be described.

Each folded beam 2215 includes an inner foot 2220 coupled to the mass 2205 and an outer foot 2225 coupled to the support 2210. Extending from the feet 2220 and 2225 are corresponding inner and outer legs, 2230 and 2235, that are joined by a head 2240. The connection between the inner foot 2220 and the mass 2205 includes a circular cutout 2245, the connection between the outer foot 2225 and the support 2210 includes a circular cutout 2250, and the connection between the legs, 2230 and 2235, and the head 2240 includes a circular cutout 2255. The circular cutouts 2245, 2250, and 2255 provide stress relief.

Soft stop members 2260a–2260h extend from the interior walls of the support 2210 for compliantly limiting movement of the mass 2205 in the direction of the soft stop members 2260a–2260h.

The soft stop members 2260 of the assembly 2200 provide optimal lateral shock tolerance. In this manner, shock loading of the mass 2205 due to excessive displacement is prevented. During operation of the assembly 2200, when a high shock impulse is applied to the mass 2205, the mass 2205 accelerates and contacts one or more of the soft stop members 2260. Any subsequent motion of the mass 2205 is retarded by the stiffness factor of the folded beams 2215. Furthermore, the soft-contact members 2260 also minimize chipping of material from the mass 2205 and/or range-of-motion stops during high G shock levels.

In a preferred embodiment, the teachings of the assembly 2200 are incorporated into the top measurement mass half 410 and the bottom measurement mass half 415 of the accelerometer 305 in order to optimally support the top measurement mass 906 and the bottom measurement mass 912 during operation of the accelerometer 305. In a preferred embodiment, the first and second natural frequencies of the folded beams 2215a–2215d are separated by at least about 80 kHz in order to provide optimally stable operation of the accelerometer 305.

Figure 23:
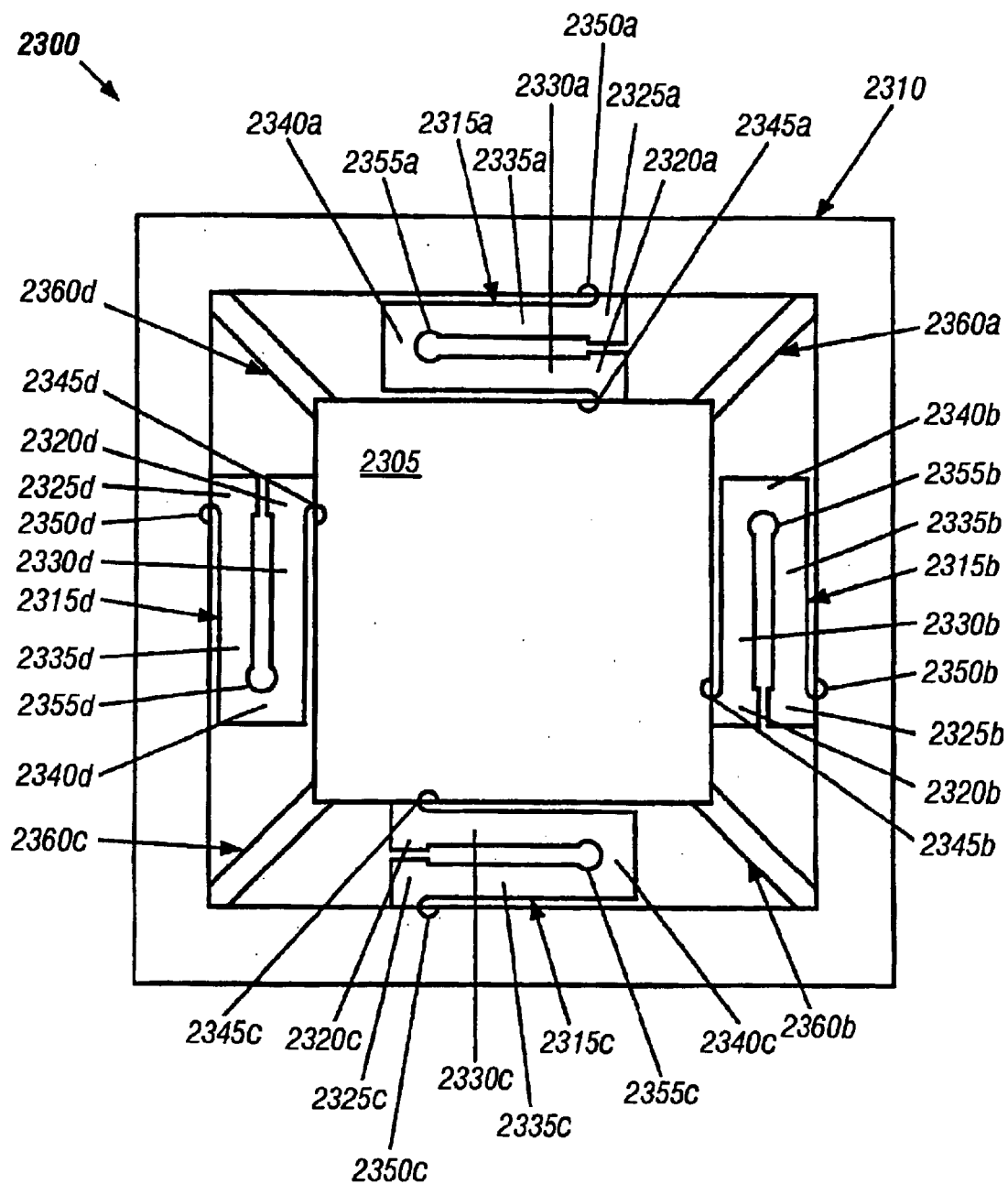
FIG. 23 is a top view of an embodiment of a mass coupled to a support structure by a number of folded beams and including a number of corner tethers.

Referring now to FIG. 23, an embodiment of an assembly 2300 for resiliently coupling a mass 2305 to a support 2310 using folded beams 2315a–2315d will now be described.

Each folded beam 2315 includes an inner foot 2320 coupled to the mass 2305 and an outer foot 2325 coupled to the support 2310. Extending from the feet 2320 and 2325 are corresponding inner and outer legs, 2330 and 2335, that are joined by a head 2340. The connection between the inner foot 2320 and the mass 2305 includes a circular cutout 2345, the connection between the outer foot 2325 and the support 2310 includes a circular cutout 2350, and the connection between the legs, 2330 and 2335, and the head 2340 includes a circular cutout 2355. The circular cutouts 2345, 2350, and 2355 provide stress relief.

Tethers 2360a–2360d extend between the corners of the mass 2305 and opposing interior corners of the support 2310 for limiting movement of the mass 2305.

The folded beams 2315 and tethers 2360 of the assembly 2300 provide optimal lateral shock tolerance, vertical compliancy, and high lateral stiffness.

In a preferred embodiment, the teachings of the assembly 2300 are incorporated into the top measurement mass half 410 and the bottom measurement mass half 415 of the accelerometer 305 in order to optimally support the top measurement mass 906 and the bottom measurement mass 912 during operation of the accelerometer 305. In a preferred embodiment, the first and second natural frequencies of the folded beams 2315a–2315d are separated by at least about 80 kHz in order to provide optimally stable operation of the accelerometer 305.

In a preferred embodiment, the folded beams 1415, 1515, 1815, 1915, 2115, 2215, and 2315, the S-shaped beams 1615, and 1715, and the straight beams 2015 of the assemblies 1400, 1500, 1600, 1700, 1800, 1900, 2000, 2100, 2200, and 2300 are formed by a plasma etch process. In particular, a mask that includes the folded beam, the S-shaped beam, or the straight beam shape is patterned on a silicon wafer in order to mask or expose the various regions on the wafer to an etchant. In several alternative embodiments, the assemblies 1400, 1500, 1600, 1700, 1800, 1900, 2000, 2100, 2200, and 2300 are formed using a merged mask micro-machining process substantially as disclosed in one or more of the following: U.S. patent application Ser. No. 09/352,835, filed on Jul. 13, 1999, and U.S. patent application Ser. No. 09/352,025, filed on Jul. 13, 1999, the disclosures of which are incorporated herein by reference.

It is understood that variations may be made in the foregoing without departing from the scope of the invention. For example, one or more of the stops 1560, 1635, 1735, 1860, 1965, 2020, may include one or more perforations for minimizing fluid damping. Furthermore, the stops 1560, 1635, 1735, 1860, 1965, and 2020 may also be used to provide etch-buffers to minimize etch variation and backside etching during the manufacture of the assemblies 1500, 1600, 1700, 1800, 1900, and 2000. In addition, the teachings of the assemblies 1500, 1600, 1700, 1800, 1900, 2000, 2100, 2200, and 2300 may be incorporated into any of the other assemblies, in whole, or in part.

The present embodiments of the invention provide an accelerometer for providing reliable data measurements. The accelerometer includes a measurement mass that is resiliently coupled to a housing by using a folded beam, an S-shaped beam or a straight beam. In this manner, the accelerometer provides a low noise floor as well as optimal operational stability over a wide range of temperatures. The accelerometer further includes range-of-motion limit stops for limiting motion of the measurement mass in the lateral direction thereby enhancing the cross-axis sensitivity and lateral shock tolerance of the accelerometer.

Figure 24:
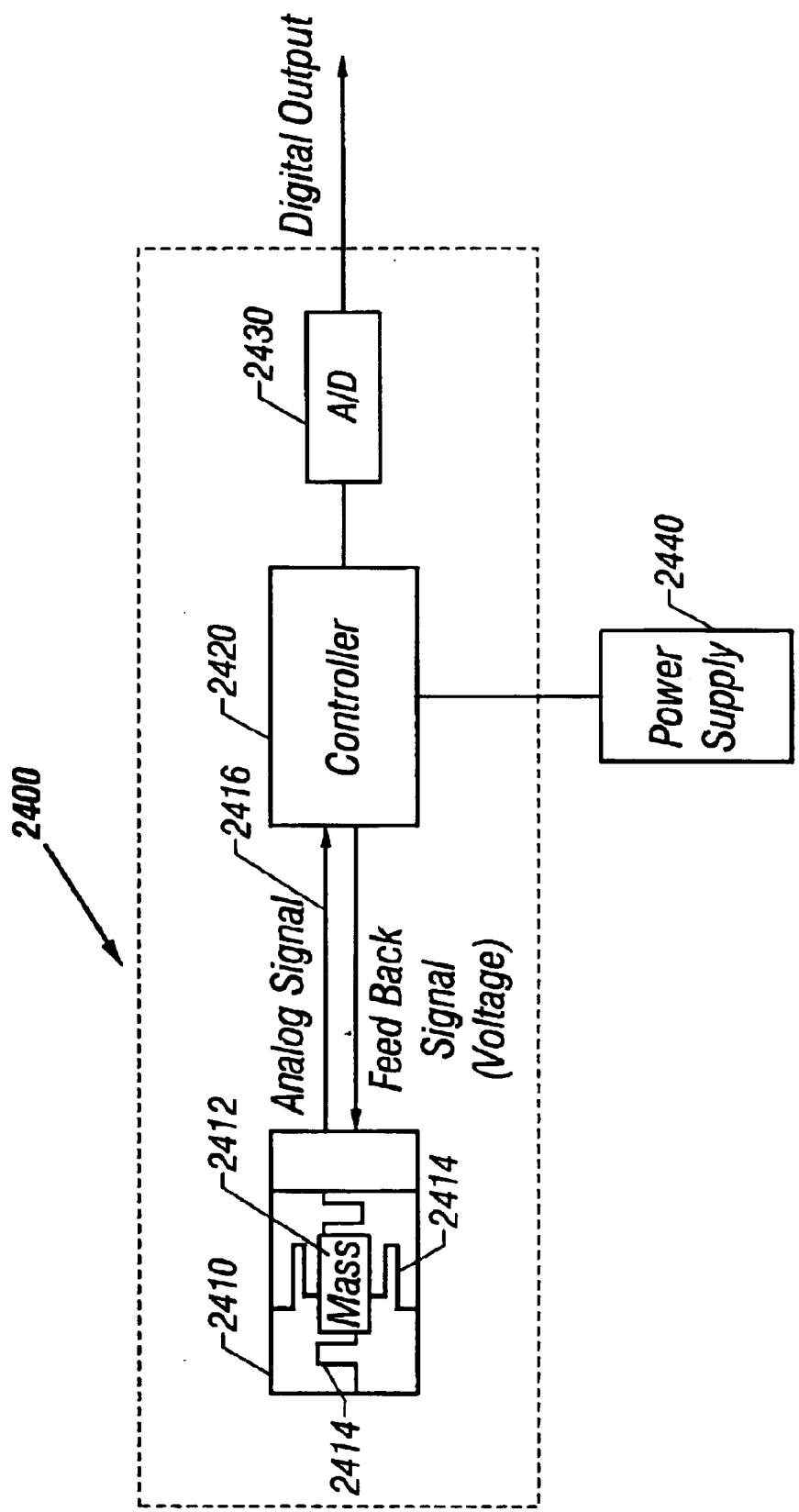
FIG. 24 shows a functional block diagram of an exemplary closed-loop system configuration using an accelerometer according to the present invention.

In a preferred embodiment the accelerometer of the present invention is tuned to operate with a controller in a closed-loop configuration. FIG. 24 shows a functional block diagram of an exemplary closed-loop configuration operation 2400. A sensor 2410 made according to the present invention (as described above in reference to FIGS. 1–23) is electrically coupled to a controller 2420 which preferably is a sigma-delta controller. The operation of such controllers are known in the art and is thus not described in detail here. The operation of the controller may be found in U.S. Pat. No. 6,023,960 to Atorame et al., U.S. Pat. No. 5,852,242 to Develok et al., and U.S. Pat. No. 4,922,756 to Henrion, each assigned to the assignee of this application and incorporated herein by reference. In operation, the movement of the mass 2412 from its normal or neutral position that occurs due to acceleration of the mass generates an analog signal 2416 which represents change in capacitance, which signal is received by the controller 2420. The controller 2420 applies a voltage sufficient to move the mass 2412 back to its neutral position. The applied voltage thus is proportional to the acceleration detected by the sensor 2410. The applied voltage signal is digitized by an analog-to-digital (A/D) converter 2430 to provide a digital signal proportional to the acceleration detected by the sensor 2410. A power supply 2440 provides the required electrical energy to the controller and the A/D converter. In a preferred embodiment, the A/D converter is an integral part of the controller 2420. The controller 2420 and the accelerometer 2410 are preferably packaged as a unit.

The inventors of the present invention have found that the controllers in general and sigma-delta controllers in particular designed to use with the accelerometer of the present invention provide stable operation within certain predetermined frequency bands, sometimes referred to as the "sweet spots." The mass 2412 and/or the springs 2414 can have several mechanical vibrational modes and each such mode can occur at a different frequency. Therefore, in order to optimally utilize the accelerometer 2410 with the controller 2420, it is necessary to tune the frequencies of these mechanical vibrational modes in the Z-axis (FIG. 6) so that these frequencies lie within one or more of the stable frequency bands of the controller 2420, i.e., in one or more of the sweet spots.

The inventors of the present invention have also found that the shape of the springs 2414 is a dominant factor to tune the mechanical vibrational frequencies of the mass 2412. The size (dimension) and mass of the springs also affect the frequencies. The inventors of the present invention have found that folded springs or s-shaped springs (as described above) are preferred. In one embodiment, the shape, size and/or mass of these springs are selected so that the induced mechanical vibration frequencies in the mass 2410 by such springs lie within one or more of the sweet spots of the chosen controller. The size, shape and mass are further selected so that the springs are resilient and robust, i.e. they are able to withstand high shock values.

The inventors of the present invention have further found that the mass of the springs 2414 is a significant contributor to the amplitude of the induced mechanical vibrational modes of the mass 2412. It is also known that a controller, such as the controller 2420, usually is unaffected by induced mechanical vibrational modes of the sensor below a certain level (threshold or limit). Laboratory tests have shown that the mass of the springs 2414 is a significant contributor to the amplitude of the mechanical vibration. Thus, in a preferred embodiment of the present invention, the mass of the springs 2414 is chosen so that the amplitude of the mechanical vibration of the sensor approaches or remains below the threshold level of the controller.

In a preferred embodiment, folded beam-type or s-shaped springs are used to support the mass 2412. The shape, size (dimension) and the mass of such springs are selected so that the mechanical vibration frequencies of the sensor lies within one or more of the frequency bands (sweet spots) of the mating controller and the amplitude of the mechanical vibration remains below the threshold level of the controller 2420. In this manner, the present invention provides a sensor package 2400 whose entire output substantially corresponds to the acceleration of mass 2412 and that it operates reliably over wide ranges of temperature.

Although illustrative embodiments of the invention have been shown and described, a wide range of modification, changes and substitution is contemplated in the foregoing disclosure. In some instances, some features of the present invention may be employed without a corresponding use of the other features. Accordingly, it is appropriate that the appended claims be construed broadly and in a manner consistent with the scope of the invention.

What is claimed is:

1. An accelerometer, comprising:
   a measurement mass for detecting acceleration, including:
      a housing having a cavity;
         one or more spring mass assemblies positioned within the cavity, each spring mass assembly including:
            a support structure;
            one or more resilient folded beams coupled to the support structure; and
            a mass coupled to the resilient folded beams; and
         one or more electrode patterns coupled to the spring mass assembly;
      a top cap wafer coupled to the measurement mass, including a top capacitor electrode; and
      a bottom cap wafer coupled to the measurement mass, including a bottom capacitor electrode.

2. The accelerometer of claim 1, wherein one or more of the spring mass assemblies further include:
   one or more range-of-motion stops coupled to the support structure for limiting the movement of the mass in the direction of the stops.

3. The accelerometer of claim 2, wherein one or more of the range-of-motion stops include one or more perforations for minimizing fluid damping.

4. The accelerometer of claim 2, wherein one or more of the range-of-motion stops are coupled to the side walls of the support structure.

5. The accelerometer of claim 2, wherein one or more of the range-of-motion stops are coupled to the interior corners of the support structure.

6. The accelerometer of claim 1, wherein one or more of the resilient folded beams include:
   one or more range-of-motion limit stops for limiting movement of the mass in the direction of the stops.

7. The accelerometer of claim 1, wherein one or more of the folded beams further include:
   a mass for dampening out resonances of the resilient folded beam.

8. The accelerometer of claim 1, wherein one or more of the spring mass assemblies further include:
   one or more soft range-of-motion limit stops for compliantly limiting movement of the mass in the direction of the stops.

9. The accelerometer of claim 1, wherein one or more of the spring assemblies further include:
   corner tethers for coupling the corners of the mass to the opposing interior corners of the support structure.

10. The accelerometer of claim 1, wherein one or more of the resilient folded beams further include one or more cutouts for minimizing stress concentrations.

11. The accelerometer of claim 1, wherein one or more of the resilient folded beams further include one or more cutouts for minimizing webbing formation during the manufacture of the folded beams.

12. The accelerometer of claim 1, wherein one or more of the resilient folded beams further include a webbing artifact having a hole for preventing the propagation of cracks into the resilient folded beams.

13. An accelerometer, comprising:
   a measurement mass for detecting acceleration, including:
      a housing having a cavity;
         one or more spring mass assemblies positioned within the cavity,
      each spring mass assembly including:
         a support structure;
            one or more resilient S-shaped beams coupled to the support structure; and
            a mass coupled to the resilient S-shaped beams; and
            one or more electrode patterns coupled to the spring mass assembly;
      a top cap wafer coupled to the measurement mass, including a top capacitor electrode; and
      a bottom cap wafer coupled to the measurement mass, including a bottom capacitor electrode.

14. The accelerometer of claim 13, wherein one or more of the spring mass assemblies further include:
   one or more range-of-motion stops coupled to the support structure for limiting the movement of the mass in the direction of the stops.

15. The accelerometer of claim 14, wherein one or more of the range-of-motion stops include one or more perforations for minimizing fluid damping.

16. The accelerometer of claim 14, wherein one or more of the range-of-motion stops are coupled to the side walls of the support structure.

17. The accelerometer of claim 14, wherein one or more of the range-of-motion stops are coupled to the interior corners of the support structure.

18. The accelerometer of claim 13, wherein one or more of the S-shaped beams include:
   one or more range-of-motion limit stops for limiting movement of the mass in the direction of the stops.

19. The accelerometer of claim 13, wherein one or more of the S-shaped beams further include:
   a mass for dampening out resonances of the resilient folded beam.

20. The accelerometer of claim 13, wherein one or more of the spring mass assemblies further include:
   one or more soft range-of-motion limit stops for compliantly limiting movement of the mass in the direction of the stops.

21. The accelerometer of claim 13, wherein one or more of the spring assemblies further include:
corner tethers for coupling the corners of the mass to the opposing interior corners of the support structure.

22. The accelerometer of claim 13, wherein one or more of the S-shaped beams further include one or more cutouts for minimizing stress concentrations.

23. The accelerometer of claim 13, wherein one or more of the S-shaped beams further include one or more cutouts for minimizing webbing formation during the manufacture of the S-shaped beams.

24. The accelerometer of claim 13, wherein one or more of the S-shaped beams further include a webbing artifact having a hole for preventing the propagation of cracks into the S-shaped beams.

25. An accelerometer, comprising:
a measurement mass for detecting acceleration, including:
a housing having a cavity;
one or more spring mass assemblies positioned within the cavity,
each spring mass assembly including:
a support structure;
one or more resilient straight beams coupled to the support structure; and
a mass coupled to the resilient straight beams; and
one or more electrode patterns coupled to the spring mass assembly;
a top cap wafer coupled to the measurement mass, including a top capacitor electrode; and
a bottom cap wafer coupled to the measurement mass, including a bottom capacitor electrode.

26. The accelerometer of claim 25, wherein one or more of the spring mass assemblies further include:
one or more range-of-motion stops coupled to the support structure for limiting the movement of the mass in the direction of the stops.

27. The accelerometer of claim 26, wherein one or more of the range-of-motion stops include one or more perforations for minimizing fluid damping.

28. The accelerometer of claim 26, wherein one or more of the range-of-motion stops are coupled to the side walls of the support structure.

29. The accelerometer of claim 26, wherein one or more of the range-of-motion stops are coupled to the interior corners of the support structure.

30. The accelerometer of claim 25, wherein one or more of the straight beams include:
a range-of-motion limit stop for limiting movement of the mass in the direction of the stop.

31. The accelerometer of claim 25, wherein one or more of the straight beams further include:
a mass for dampening out resonances of the straight beam.

32. The accelerometer of claim 25, wherein one or more of the spring mass assemblies further include:
one or more soft range-of-motion limit stops for compliantly limiting movement of the mass in the direction of the stops.

33. The accelerometer of claim 25, wherein one or more of the spring assemblies further include:
corner tethers for coupling the corners of the mass to the opposing interior corners of the support structure.

34. The accelerometer of claim 25, wherein one or more of the resilient straight beams further include one or more cutouts for minimizing stress concentrations.

35. The accelerometer of claim 25, wherein one or more of the resilient straight beams further include one or more cutouts for minimizing webbing formation during the manufacture of the resilient folded beams.

36. The accelerometer of claim 25, wherein one or more of the straight beams further include a webbing artifact having a hole for preventing the propagation of cracks.

37. An accelerometer, comprising:
a measurement mass for detecting acceleration, including:
a housing having a cavity;
one or more spring mass assemblies positioned within the cavity,
each spring mass assembly including:
a support structure;
one or more resilient beams coupled to the support structure; and
a mass coupled to the resilient beams; and
one or more electrode patterns coupled to the spring mass assembly;
a top cap wafer coupled to the measurement mass, including a top capacitor electrode; and
a bottom cap wafer coupled to the measurement mass, including a bottom capacitor electrode;
wherein the resilient beams are selected from the group consisting of folded resilient beams, S-shaped beams, and straight beams.

38. A sensor package, comprising:
(a) a sensor having a mass suspended by a plurality of springs which induce mechanical vibrational modes in the sensor, the sensor providing an output signal indicative of acceleration detected by the mass;
(b) a controller coupled to the sensor in a closed-loop configuration, the controller in response to the output signal of the sensor providing a digital output proportional to the acceleration detected by the sensor, the controller in the closed-loop operation having at least one predefined frequency band for stable operation relative to the frequency of mechanical vibrational modes induced in sensor; and wherein the plurality of springs are tuned so that the frequency of the induced mechanical vibrational modes remains substantially within at least one predetermined frequency band.

39. The sensor package of claim 38, wherein the sensor is tuned by selecting one of (i) shape of the springs, (ii) mass of the springs, (iii) size (dimensions) of the springs; and (iv) a combination of at least two of the shape, size and mass of the springs.

40. The sensor package of claim 38, wherein the springs are selected from a group consisting of (i) folded beam springs; and (ii) s-shaped springs.

41. The sensor package of claim 38, wherein the springs are further selected to maintain a spring constant within a predetermined range.

42. The sensor package of claim 41 wherein the spring constant is selected as a function of at least one of (i) sensitivity and frequency response of the sensor; (ii) dynamics range of the sensor output; and (iii) desired shock tolerance of the sensor.

43. A sensor package, comprising:
(a) a sensor having a mass suspended from a structure by a plurality of springs which induce mechanical vibrational modes in at least one direction of movement of the mass, the amplitude of the induced mechanical vibrational modes being a function of the mass of the springs;

(b) a controller coupled to the sensor in a closed loop operation for providing a digital output proportional to the acceleration detected by the sensor, the controller having a predetermined amplitude threshold level for detecting any mechanical vibrational modes of the sensor; and wherein the mass of the springs is selected so that the amplitude of the mechanical vibrational modes induced in the sensor remains below the predetermined amplitude threshold level of the controller.

44. The sensor package of claim 43, wherein the springs are selected from a group consisting of (i) folded beam springs; and (ii) s-shaped springs.

45. The sensor package of claim 43, wherein the controller further includes at least one predefined frequency band for stable operation relative to frequency of a mechanical vibrational mode induced by said springs and wherein said springs are tuned so that the frequency of the induced mechanical vibrational mode remains within the at least one predefined frequency band.

46. The sensor package of claim 45 wherein the springs are further selected to provide a stable operation of the sensor over a selected temperature range.

* * * * *